(12) United States Patent
Harada et al.

(10) Patent No.: US 11,099,814 B2
(45) Date of Patent: Aug. 24, 2021

(54) NEURAL NETWORK SEMICONDUCTOR DEVICE AND SYSTEM USING THE SAME

(71) Applicant: Semiconductor Energy Laboratory Co., Ltd., Atsugi (JP)

(72) Inventors: Shintaro Harada, Kanagawa (JP); Yoshiyuki Kurokawa, Kanagawa (JP); Takeshi Aoki, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 968 days.

(21) Appl. No.: 15/729,150

(22) Filed: Oct. 10, 2017

(65) Prior Publication Data

US 2018/0101359 A1    Apr. 12, 2018

(30) Foreign Application Priority Data

Oct. 12, 2016  (JP) .............................. JP2016-200757
Oct. 12, 2016  (JP) .............................. JP2016-200760
Feb. 2, 2017   (JP) .............................. JP2017-017446

(51) Int. Cl.
*G06F 7/544* (2006.01)
*G06N 3/063* (2006.01)
(Continued)

(52) U.S. Cl.
CPC ............. *G06F 7/5443* (2013.01); *G06N 3/04* (2013.01); *G06N 3/0635* (2013.01); *H01L 29/7869* (2013.01)

(58) Field of Classification Search
CPC .... H01L 29/7869; G06N 3/04; G06N 3/0635; G06F 7/5443; G06F 2207/4814
See application file for complete search history.

(56) References Cited

U.S. PATENT DOCUMENTS 5,047,655 A    9/1991   Chambost et al.
5,071,171 A    12/1991  Perratone
(Continued)

FOREIGN PATENT DOCUMENTS

CN    001541364 A    10/2004
CN    100465875 C    3/2009
(Continued)

OTHER PUBLICATIONS

Arima.Y et al., "A Self-Learning Neural Network Chip with 125 Neurons and 10K Self-Organization Synapses", IEEE Journal of Solid-State Circuits, Apr. 1, 1991, vol. 26, No. 4, pp. 607-611.
(Continued)

*Primary Examiner* — Nelson Garces
(74) *Attorney, Agent, or Firm* — Fish & Richardson P.C.

(57) ABSTRACT

A semiconductor device capable of performing product-sum operation is provided. The semiconductor device includes a first memory cell, a second memory cell, and an offset circuit. The semiconductor device retains first analog data and reference analog data in the first memory cell and the second memory cell, respectively. A potential corresponding to second analog data is applied to each of them as a selection signal, whereby current depending on the sum of products of the first analog data and the second analog data is obtained. The offset circuit includes a constant current circuit comprising a transistor and a capacitor. A first terminal of the transistor is electrically connected to a first gate of the transistor and a first terminal of the capacitor. A second gate of the transistor is electrically connected to a second terminal of the capacitor. A voltage between the first terminal and the second gate of the transistor is held in the capacitor, whereby a change in source-drain current of the transistor can be suppressed.

10 Claims, 46 Drawing Sheets

(51) Int. Cl.
*H01L 29/786* (2006.01)
*G06N 3/04* (2006.01)

(56) References Cited

U.S. PATENT DOCUMENTS

| | | | |
|---|---|---|---|
| 5,093,803 A | 3/1992 | Howard et al. | |
| 5,148,514 A | 9/1992 | Arima et al. | |
| 5,155,802 A | 10/1992 | Mueller et al. | |
| 5,268,320 A | 12/1993 | Holler et al. | |
| 5,293,457 A | 3/1994 | Arima et al. | |
| 5,930,523 A | 7/1999 | Kawasaki et al. | |
| 6,212,620 B1 | 4/2001 | Kawasaki et al. | |
| 6,223,265 B1 | 4/2001 | Kawasaki et al. | |
| 6,279,063 B1 | 8/2001 | Kawasaki et al. | |
| 6,385,635 B1 | 5/2002 | Ishii | |
| 6,591,294 B2 | 7/2003 | Kawasaki et al. | |
| 6,735,683 B2 | 5/2004 | Kawasaki et al. | |
| 6,748,507 B2 | 6/2004 | Kawasaki et al. | |
| 6,779,156 B2 | 8/2004 | Whitaker et al. | |
| 6,779,158 B2 | 8/2004 | Whitaker et al. | |
| 6,792,589 B2 | 9/2004 | Whitaker et al. | |
| 6,829,750 B2 | 12/2004 | Maki et al. | |
| 6,892,373 B2 | 5/2005 | Whitaker et al. | |
| 6,912,557 B1 | 6/2005 | North et al. | |
| 6,993,731 B2 | 1/2006 | Whitaker et al. | |
| 7,120,617 B2 | 10/2006 | Nomura et al. | |
| 7,272,585 B2 | 9/2007 | Nomura et al. | |
| 7,464,131 B2 | 12/2008 | Kameyama et al. | |
| 7,624,368 B2 | 11/2009 | Whitaker et al. | |
| 7,800,673 B2 | 9/2010 | Sugawa et al. | |
| 7,974,996 B1 | 7/2011 | North et al. | |
| 8,785,996 B2 | 7/2014 | Colli et al. | |
| 9,489,988 B2 | 11/2016 | Yamazaki et al. | |
| 2002/0030205 A1* | 3/2002 | Varshavsky | G06N 3/063 257/208 |
| 2004/0199716 A1 | 10/2004 | Kawasaki et al. | |
| 2008/0263228 A1 | 10/2008 | Kawasaki et al. | |
| 2012/0023281 A1 | 1/2012 | Kawasaki et al. | |
| 2012/0038409 A1 | 2/2012 | Colli et al. | |
| 2012/0297221 A1 | 11/2012 | Ohnuki | |
| 2015/0023114 A1* | 1/2015 | Kurokawa | G11C 11/405 365/189.011 |
| 2015/0207509 A1* | 7/2015 | Kurokawa | H03K 19/1735 326/16 |
| 2016/0225808 A1* | 8/2016 | Kurokawa | H01L 27/14616 |
| 2016/0343452 A1 | 11/2016 | Ikeda et al. | |
| 2017/0063351 A1 | 3/2017 | Kurokawa | |
| 2017/0083469 A1 | 3/2017 | Catthoor et al. | |
| 2017/0116512 A1 | 4/2017 | Kurokawa | |

FOREIGN PATENT DOCUMENTS

| | | |
|---|---|---|
| CN | 100525401 C | 8/2009 |
| CN | 100578440 C | 1/2010 |
| EP | 0466331 A | 1/1992 |
| EP | 0646873 A | 4/1995 |
| EP | 0718768 A | 6/1996 |
| EP | 0718779 A | 6/1996 |
| EP | 1591885 A | 11/2005 |
| EP | 1746820 A | 1/2007 |
| JP | 03-080379 A | 4/1991 |
| JP | 04-067259 A | 3/1992 |
| JP | 04-216160 A | 8/1992 |
| JP | 05-012466 A | 1/1993 |
| JP | 06-187472 A | 7/1994 |
| JP | 2000-057244 A | 2/2000 |
| JP | 2007-066258 A | 3/2007 |
| JP | 3904244 | 4/2007 |
| JP | 2009-296353 A | 12/2009 |
| JP | 2013-008352 A | 1/2013 |
| JP | 2016-157506 A | 9/2016 |
| TW | 561399 | 11/2003 |
| WO | WO-2001/097007 | 12/2001 |
| WO | WO-2002/103757 | 12/2002 |
| WO | WO-2002/103902 | 12/2002 |
| WO | WO-2005/038645 | 4/2005 |

OTHER PUBLICATIONS

Arima.Y et al., "A 336-Neuron, 28K-Synapse, Self-Learning Neural Network Chip with Branch-Neuron-Unit Architecture", IEEE Journal of Solid-State Circuits, Nov. 1, 1991, vol. 26, No. 11, pp. 1637-1644.

Arima.Y et al., "A Refreshable Analog VLSI Neural Network Chip with 400 Neurons and 40K Synapses", IEEE Journal of Solid-State Circuits, Dec. 1, 1992, vol. 27, No. 12, pp. 1854-1861.

Kawashima.S et al., "13.3-In. 8K×4K 664-ppi OLED Display Using CAAC-OS FETs", SID Digest '14 : SID International Symposium Digest of Technical Papers, Jun. 3, 2014, pp. 627-630.

Morie.T et al., "An All-Analog Expandable Neural Network LSI with On-Chip Backpropagation Learning", IEEE Journal of Solid-State Circuits, Sep. 1, 1994, vol. 29, No. 9, pp. 1086-1093.

International Search Report (Application No. PCT/IB2017/055942) dated Nov. 28, 2017.

Written Opinion (Application No. PCT/IB2017)055942) dated Nov. 28, 2017.

Taiwanese Office Action (Application No. 106133877) dated Jun. 2, 2021.

* cited by examiner

411

413

414

415 ated to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

NEURAL NETWORK SEMICONDUCTOR DEVICE AND SYSTEM USING THE SAME

TECHNICAL FIELD

One embodiment of the present invention relates to a semiconductor device and a system using the semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

BACKGROUND ART

An artificial neural network (hereinafter, referred to as a neural network) is an information processing system modeled on a biological neural network. A computer having a higher performance than a conventional Neumann computer is expected to be provided by utilizing the neural network, and in these years, a variety of researches on a neural network formed over an electronic circuit have been carried out.

In the neural network, units which resemble neurons are connected to each other through units which resemble synapses. By changing the connection strength, a variety of input patterns are learned, and pattern recognition, associative storage, or the like can be performed at high speed. Furthermore, Non-Patent Document 1 discloses a technique relating to a chip having a self-learning function with the neural network.

REFERENCE

[Non-Patent Document 1] Yutaka Arima et al., "A Self-Learning Neural Network Chip with 125 Neurons and 10K Self-Organization Synapses", *IEEE Journal of Solid-State Circuits*, Vol. 26, No. 4, April 1991, pp. 607-611

DISCLOSURE OF INVENTION

In order to form a neural network using a semiconductor device, a synapse circuit that stores a connection strength between a first neuron circuit and a second neuron circuit and performs a product-sum operation in which output of the first neuron circuit and the connection strength are multiplied and summed needs to be provided. In other words, a memory that holds a connection strength, a multiplier circuit and an adder circuit that perform a product-sum operation, and the like are necessarily mounted on the semiconductor device.

In the case where the memory, the multiplier circuit, the adder circuit, and the like are formed using digital circuits, the memory needs to be able to store multi-bit data and moreover, the multiplier circuit and the adder circuit need to be able to perform multi-bit arithmetic operation. In other words, a large-scale memory, a large-scale multiplier circuit, and a large-scale adder circuit are required to form a neural network using digital circuits; therefore, the chip area of the digital circuits is increased.

An object of one embodiment of the present invention is to provide a novel semiconductor device. Another object of one embodiment of the present invention is to provide a module including the novel semiconductor device. Another object of one embodiment of the present invention is to provide an electronic device using the module including the novel semiconductor device. Another object of one embodiment of the present invention is to provide a system with the module including the novel semiconductor device.

Another object of one embodiment of the present invention is to provide a semiconductor device with a small circuit area. Another object of one embodiment of the present invention is to provide a semiconductor device with low power consumption. Another object of one embodiment of the present invention is to provide a novel semiconductor device having an authentication function. Another object of one embodiment of the present invention is to provide a novel semiconductor device which compresses image data.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1) One embodiment of the present invention is a semiconductor device including an offset circuit, a first memory cell, and a second memory cell. The offset circuit includes a first constant current circuit, a second constant current circuit, first to third transistors, a first capacitor, a first wiring, a second wiring, a first output terminal, a second output terminal, and a current mirror circuit. The first constant current circuit includes a fourth transistor, a fifth transistor, and a second capacitor. The fourth transistor is a transistor including a first gate and a second gate. The second constant current circuit includes a sixth transistor, a seventh transistor, and a third capacitor. The sixth transistor is a transistor including a first gate and a second gate. A first terminal of the first transistor is electrically connected to a first terminal of the second transistor. A gate of the first transistor is electrically connected to a second terminal of the second transistor. The first terminal of the second transistor is electrically connected to the first wiring. A first terminal of the third transistor is electrically connected to the second terminal of the second transistor. A first terminal of the first capacitor is electrically connected to the gate of the first transistor. A first terminal of the fourth transistor is electrically connected to the first wiring. The first gate of the fourth transistor is electrically connected to a first terminal of the second capacitor. The second gate of the fourth transistor is electrically connected to the first terminal of the fourth transistor. A second terminal of the second capacitor is electrically connected to the first terminal of the fourth transistor. A first terminal of the fifth transistor is electrically connected to the first gate of the fourth transistor. A first terminal of the sixth transistor is electrically connected to the second wiring. The first gate of the sixth transistor is electrically connected to a first terminal of the third capacitor. The second gate of the sixth transistor is electrically connected to the first terminal of the sixth transistor. A second terminal of the third capacitor is electrically connected to the first terminal of the sixth transistor. A first terminal of the seventh transistor is electrically connected to the first gate of the sixth transistor. The first wiring is electrically connected to the first output terminal. The second wiring is electrically connected to the second output terminal. The current mirror circuit is configured to output a first current corresponding to a potential of the second wiring to each of the first wiring and the second wiring. The first memory cell is electrically connected to the first output terminal. The second memory cell is electrically connected to the second output terminal.

(2) Another embodiment of the present invention is a semiconductor device including an offset circuit, a first memory cell, and a second memory cell. The offset circuit includes a first constant current circuit, a second constant current circuit, first to third transistors, a first capacitor, a first wiring, a second wiring, a first output terminal, a second output terminal, and a current mirror circuit. The first constant current circuit includes a fourth transistor, a fifth transistor, and a second capacitor. The fourth transistor includes a first gate and a second gate. The second constant current circuit includes a sixth transistor, a seventh transistor, and a third capacitor. The sixth transistor includes a first gate and a second gate. A first terminal of the first transistor is electrically connected to a first terminal of the second transistor. A gate of the first transistor is electrically connected to a second terminal of the second transistor. The first terminal of the second transistor is electrically connected to the first wiring. A first terminal of the third transistor is electrically connected to the second terminal of the second transistor. A first terminal of the first capacitor is electrically connected to the gate of the first transistor. A first terminal of the fourth transistor is electrically connected to the first wiring. The first gate of the fourth transistor is electrically connected to the first terminal of the fourth transistor. The second gate of the fourth transistor is electrically connected to a first terminal of the second capacitor. A second terminal of the second capacitor is electrically connected to the first terminal of the fourth transistor. A first terminal of the fifth transistor is electrically connected to the second gate of the fourth transistor. A first terminal of the sixth transistor is electrically connected to the second wiring. The first gate of the sixth transistor is electrically connected to the first terminal of the sixth transistor. The second gate of the sixth transistor is electrically connected to a first terminal of the third capacitor. A second terminal of the third capacitor is electrically connected to the first terminal of the sixth transistor. A first terminal of the seventh transistor is electrically connected to the second gate of the sixth transistor. The first wiring is electrically connected to the first output terminal. The second wiring is electrically connected to the second output terminal. The current mirror circuit is configured to output a first current corresponding to a potential of the second wiring to each of the first wiring and the second wiring. The first memory cell is electrically connected to the first output terminal. The second memory cell is electrically connected to the second output terminal.

(3) Another embodiment of the present invention is the semiconductor device according to (1) or (2) in which the first to seventh transistors each include a metal oxide in a channel formation region.

(4) Another of embodiment of the present invention is a semiconductor device including an offset circuit, a first memory cell, and a second memory cell. The offset circuit includes a first constant current circuit, a second constant current circuit, first to third transistors, a first capacitor, a first wiring, a second wiring, a first output terminal, a second output terminal, and a current mirror circuit. The first constant current circuit includes fourth to sixth transistors, a second capacitor, and a third capacitor. The fourth transistor includes a first gate and a second gate. The second constant current circuit includes seventh to ninth transistors, a fourth capacitor, and a fifth capacitor. The seventh transistor includes a first gate and a second gate. A first terminal of the first transistor is electrically connected to a first terminal of the second transistor. A gate of the first transistor is electrically connected to a second terminal of the second transistor. The first terminal of the second transistor is electrically connected to the first wiring. A first terminal of the third transistor is electrically connected to the second terminal of the second transistor. A first terminal of the first capacitor is electrically connected to the gate of the first transistor. A first terminal of the fourth transistor is electrically connected to the first wiring. The first gate of the fourth transistor is electrically connected to a first terminal of the second capacitor. The second gate of the fourth transistor is electrically connected to a first terminal of the third capacitor. A first terminal of the fifth transistor is electrically connected to the first gate of the fourth transistor. A first terminal of the sixth transistor is electrically connected to the second gate of the fourth transistor. The second terminal of a second capacitor is electrically connected to the first terminal of the fourth transistor. A second terminal of the third capacitor is electrically connected to the first terminal of the fourth transistor. A first terminal of the seventh transistor is electrically connected to the second wiring. The first gate of the seventh transistor is electrically connected to a first terminal of the fourth capacitor. The second gate of the seventh transistor is electrically connected to a first terminal of the fifth capacitor. A first terminal of the eighth transistor is electrically connected to the first gate of the seventh transistor. A first terminal of the ninth transistor is electrically connected to the second gate of the seventh transistor. A second terminal of the fourth capacitor is electrically connected to the first terminal of the seventh transistor. A second terminal of the fifth capacitor is electrically connected to the first terminal of the seventh transistor. The first wiring is electrically connected to the first output terminal. The second wiring is electrically connected to the second output terminal. The current mirror circuit is configured to output a first current corresponding to a potential of the second wiring to each of the first wiring and the second wiring. The first memory cell is electrically connected to the first output terminal. The second memory cell is electrically connected to the second output terminal.

(5) Another embodiment of the present invention is the semiconductor device according to (4) in which the first to ninth transistors each include a metal oxide in a channel formation region.

(6) Another embodiment of the present invention is a semiconductor device including a memory cell array and an offset circuit. The memory cell array includes a first memory cell and a second memory cell. The offset circuit includes a first constant current circuit, a second constant current circuit, first to third transistors, a first capacitor, a first wiring, a second wiring, a first output terminal, a second output terminal, and a current mirror circuit. The first constant current circuit includes a fourth transistor, a first diode, and a second capacitor. The fourth transistor includes a first gate and a second gate. The second constant current circuit includes a fifth transistor, a second diode, and a third capacitor. The fifth transistor includes a first gate and a second gate. A first terminal of the first transistor is electrically connected to a first terminal of the second transistor. A gate of the first transistor is electrically connected to a second terminal of the second transistor. The first terminal of the second transistor is electrically connected to the first wiring. A first terminal of the third transistor is electrically connected to the second terminal of the second transistor. A first terminal of the first capacitor is electrically connected to the gate of the first transistor. A first terminal of the fourth transistor is electrically connected to the first wiring. The first gate of the fourth transistor is electrically connected to a first terminal of the second capacitor. The second gate of the fourth transistor is electrically connected to the first terminal of the fourth transistor. A second terminal of the second capacitor is electrically connected to the first terminal of the fourth transistor. An output terminal of the first diode is electrically connected to the first gate of the fourth transistor. A first terminal of the fifth transistor is electrically connected to the second wiring. The first gate of the fifth transistor is electrically connected to a first terminal of the third capacitor. The second gate of the fifth transistor is electrically connected to the first terminal of the fifth transistor. A second terminal of the third capacitor is electrically connected to the first terminal of the fifth transistor. An output terminal of the second diode is electrically connected to the first gate of the fifth transistor. The first wiring is electrically connected to the first output terminal. The second wiring is electrically connected to the second output terminal. The current mirror circuit is configured to output a first current corresponding to a potential of the second wiring to each of the first wiring and the second wiring. The first memory cell is electrically connected to the first output terminal. The second memory cell is electrically connected to the second output terminal.

(7) Another embodiment of the present invention is a semiconductor device including an offset circuit, a first memory cell, and a second memory cell. The offset circuit includes a first constant current circuit, a second constant current circuit, first to third transistors, a first capacitor, a first wiring, a second wiring, a first output terminal, a second output terminal, and a current mirror circuit. The first constant current circuit includes a fourth transistor, a first diode and a second capacitor. The fourth transistor includes a first gate and a second gate. The second constant current circuit includes a fifth transistor, a second diode, and a third capacitor. The fifth transistor includes a first gate and a second gate. A first terminal of the first transistor is electrically connected to a first terminal of the second transistor. A gate of the first transistor is electrically connected to a second terminal of the second transistor. The first terminal of the second transistor is electrically connected to the first wiring. A first terminal of the third transistor is electrically connected to the second terminal of the second transistor. A first terminal of the first capacitor is electrically connected to the gate of the first transistor. A first terminal of the fourth transistor is electrically connected to the first wiring. The first gate of the fourth transistor is electrically connected to the first terminal of the fourth transistor. The second gate of the fourth transistor is electrically connected to a first terminal of the second capacitor. A second terminal of the second capacitor is electrically connected to the first terminal of the fourth transistor. An output terminal of the first diode is electrically connected to the second gate of the fourth transistor. A first terminal of the fifth transistor is electrically connected to the second wiring. The first gate of the fifth transistor is electrically connected to the first terminal of the fifth transistor. The second gate of the fifth transistor is electrically connected to a first terminal of the third capacitor. A second terminal of the third capacitor is electrically connected to the first terminal of the fifth transistor. An output terminal of the second diode is electrically connected to the second gate of the fifth transistor. The first wiring is electrically connected to the first output terminal. The second wiring is electrically connected to the second output terminal. The current mirror circuit is configured to output a first current corresponding to a potential of the second wiring to each of the first wiring and the second wiring. The first memory cell is electrically connected to the first output terminal. The second memory cell is electrically connected to the second output terminal.

(8) Another embodiment of the present invention is a semiconductor device including an offset circuit, a first memory cell, and a second memory cell. The offset circuit includes a first constant current circuit, a second constant current circuit, first to third transistors, a first capacitor, a first wiring, a second wiring, a first output terminal, a second output terminal, and a current mirror circuit. The first constant current circuit includes a fourth transistor, a first diode, a second diode, a second capacitor, and a third capacitor. The fourth transistor includes a first gate and a second gate. The second constant current circuit includes a fifth transistor, a third diode, a fourth diode, a fourth capacitor, and a fifth capacitor. The fifth transistor includes a first gate and a second gate. A first terminal of the first transistor is electrically connected to a first terminal of the second transistor. A gate of the first transistor is electrically connected to a second terminal of the second transistor. The first terminal of the second transistor is electrically connected to the first wiring. A first terminal of the third transistor is electrically connected to the second terminal of the second transistor. A first terminal of the first capacitor is electrically connected to the gate of the first transistor. A first terminal of the fourth transistor is electrically connected to the first wiring. The first gate of the fourth transistor is electrically connected to a first terminal of the second capacitor. The second gate of the fourth transistor is electrically connected to a first terminal of the third capacitor. An output terminal of the first diode is electrically connected to the first gate of the fourth transistor. An output terminal of the second diode is electrically connected to the second gate of the fourth transistor. A second terminal of the second capacitor is electrically connected to the first terminal of the fourth transistor. A second terminal of the third capacitor is electrically connected to the first terminal of the fourth transistor. A first terminal of the fifth transistor is electrically connected to the second wiring. The first gate of the fifth transistor is electrically connected to a first terminal of the fourth capacitor. The second gate of the fifth transistor is electrically connected to a first terminal of the fifth capacitor. An output terminal of the third diode is electrically connected to the first gate of the fifth transistor. An output terminal of the fourth diode is electrically connected to the second gate of the fifth transistor. A second terminal of the fourth capacitor is electrically connected to the first terminal of the fifth transistor. A second terminal of the fifth capacitor is electrically connected to the first terminal of the fifth transistor. The first wiring is electrically connected to the first output terminal. The second wiring is electrically connected to the second output terminal. The current mirror circuit is configured to output a first current corresponding to a potential of the second wiring to each of the first wiring and the second wiring. The first memory cell is electrically connected to the first output terminal. The second memory cell is electrically connected to the second output terminal.

(9) Another embodiment of the present invention is the semiconductor device according to any one of (6) to (8), in which the first to fifth transistors each include a metal oxide in a channel formation region.

(10) Another embodiment of the present invention is the semiconductor device according to (1) or (9), in which the current mirror circuit includes a tenth transistor and an eleventh transistor, where a first terminal of the tenth transistor is electrically connected to the first wiring, where a gate of the tenth transistor is electrically connected to the second wiring, where a first terminal of the eleventh transistor is electrically connected to the second wiring, and where a gate of the eleventh transistor is electrically connected to the second wiring.

(11) Another embodiment of the present invention is the semiconductor device according to any one of (1) to (10), in which the first memory cell includes a twelfth transistor, a thirteenth transistor, and a sixth capacitor, where the second memory cell includes a fourteenth transistor, a fifteenth transistor, and a seventh capacitor, where a first terminal of the twelfth transistor is electrically connected to a gate of the thirteenth transistor, where a first terminal of the sixth capacitor is electrically connected to the first terminal of the twelfth transistor, where a first terminal of the thirteenth transistor is electrically connected to the first output terminal, where a first terminal of the fourteenth transistor is electrically connected to a gate of the fifteenth transistor, where a first terminal of the seventh capacitor is electrically connected to the first terminal of the fourteenth transistor, and where a first terminal of the fifteenth transistor is electrically connected to the second output terminal.

(12) Another embodiment of the present invention is a semiconductor wafer including a region for dicing and a plurality of semiconductor devices. Each of the plurality of semiconductor devices is the semiconductor device according to any one of (1) to (11).

(13) Another embodiment of the present invention is an electronic device including the semiconductor device according to any one of (1) to (11) and a housing.

(14) Another embodiment of the present invention is the electronic device according to (13), including the semiconductor device according to any one of (1) to (11) and being configured to perform processing such as pattern recognition and associative storage.

(15) Another embodiment of the present invention is the electronic device according to (13) or (14) further including a display device. The display device includes a reflective element and either one of a light-emitting element and a transmissive element.

(16) Another embodiment of the present invention is a biometric authentication system including the electronic device according to (14) and a device configured to obtain biological information.

(17) Another embodiment of the present invention is a video distribution system using the electronic device according to (14) and being configured to encode video data and to send an encoded video data.

According to one embodiment of the present invention, a novel semiconductor device can be provided. According to another embodiment of the present invention, a module including the novel semiconductor device can be provided. According to another embodiment of the present invention, an electronic device using the module including the novel semiconductor device can be provided. According to one embodiment of the present invention, a system with the memory device including the novel semiconductor device can be provided.

Another embodiment of the present invention can provide a semiconductor device with a small circuit area. Another embodiment of the present invention can provide a semiconductor device with lower power consumption. Another embodiment of the present invention can provide a novel semiconductor device having an authentication function. Another embodiment of the present invention can provide a novel semiconductor device that encodes image data.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BEST MODE FOR CARRYING OUT THE INVENTION

Figure 1:
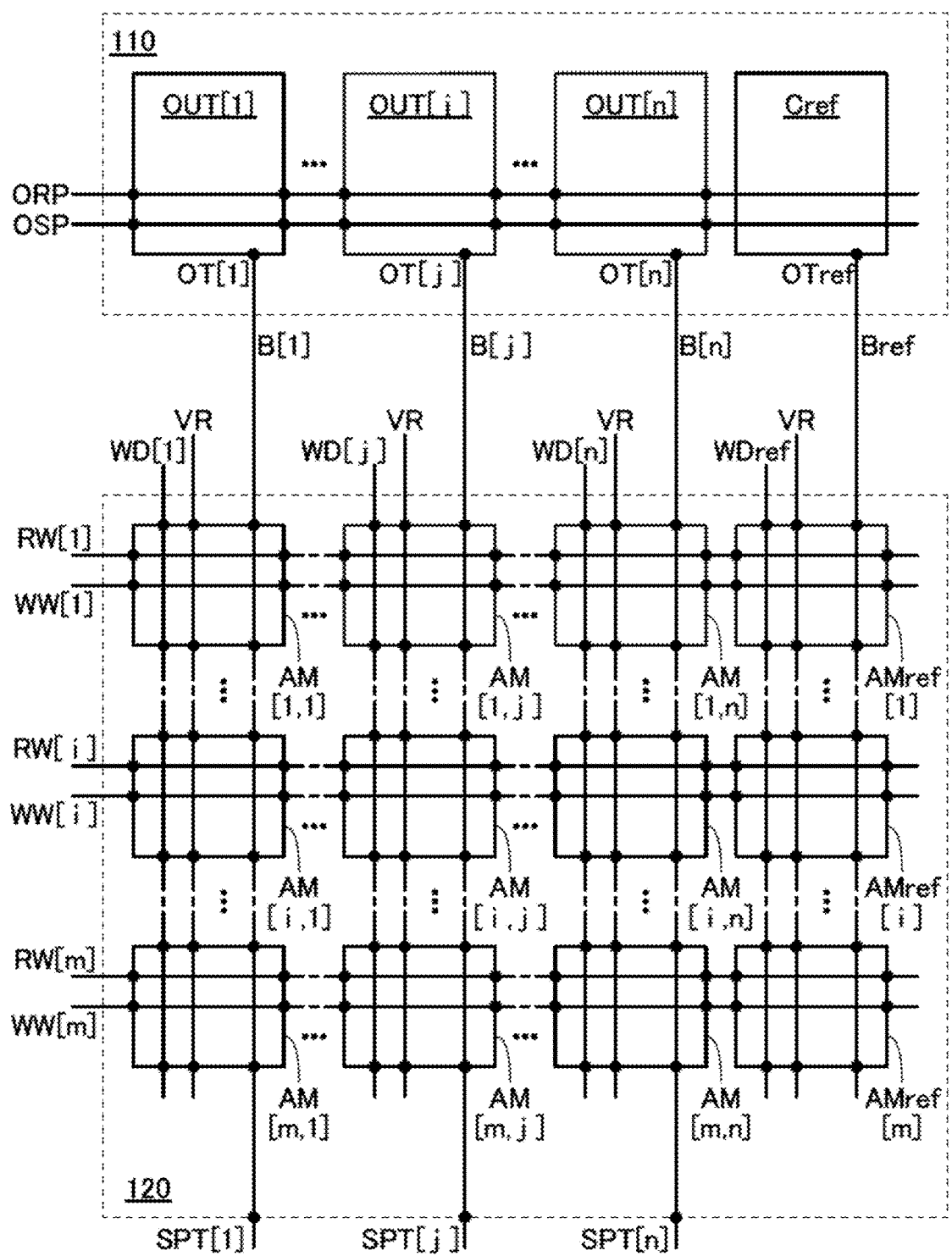
FIG. 1 is a block diagram illustrating an example of a semiconductor device.

One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, ordinal numbers such as "first", "second", and "third" are used in order to avoid confusion among components. Thus, the terms do not limit the number or order of components. In the present specification and the like, a "first" component in one embodiment can be referred to as a "second" component in other embodiments or claims. Furthermore, in the present specification and the like, a "first" component in one embodiment can be omitted in other embodiments or claims, for example.

Embodiments are described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the description of the embodiments. Note that in the structures of the embodiments, the same portions or portions having similar functions are denoted by the same reference numerals in different drawings, and the description of such portions is not repeated.

In this specification and the like, the terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed directly over or directly under and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, blocks in a block diagram do not necessarily show components described in the specification, which can be explained with another term as appropriate depending on the situation.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as perspective views, some of components might not be illustrated for clarity of the drawings.

In the drawings, the same components, components having similar functions, components formed of the same material, or components formed at the same time are denoted by the same reference numerals in some cases, and the description thereof is not repeated in some cases.

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation. In this specification and the like, two terminals except a gate are sometimes referred to as a first terminal and a second terminal or as a third terminal and a fourth terminal.

In this specification and the like, a transistor is an element having three terminals: a gate, a source, and a drain unless otherwise specified. A gate is a terminal which functions as a control terminal for controlling the conduction state of a transistor. Functions of input/output terminals of the transistor depend on the type and the levels of potentials applied to the terminals, and one of the two terminals serves as a source and the other serves as a drain. Therefore, the terms "source" and "drain" can be switched in this specification and the like. In this specification and the like, two terminals except a gate are sometimes referred to as a first terminal and a second terminal or as a third terminal and a fourth terminal.

In addition, in this specification and the like, the term such as an "electrode" or a "wiring" does not limit a function of the component. For example, an "electrode" is used as part of a "wiring" in some cases, and vice versa. Furthermore, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Moreover, the term "insulating film" can be changed into the term "insulating layer" in some cases, or can be replaced with a word not including the term "film" or "layer" depending on the case or circumstances. For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring", "signal line", "power supply line", and the like can be interchanged with each other depending on circumstances or conditions. For example, the term "wiring" can be changed into the term "signal line" in some cases. For example, the term "wiring" can be changed into the term such as "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases. The term "potential" that is applied to a wiring can be changed into the term "signal" or the like depending on circumstances or conditions. Inversely, the term "signal" or the like can be changed into the term "potential" in some cases.

In this specification, an "electronic device" may refer to as a personal computer, a mobile phone, a tablet terminal, an e-book reader, a wearable terminal, an audiovisual (AV) device, an electronic appliance, a household appliance, an industrial appliance, a digital signage, a car, or an electric appliance including a system, for example. An "electronic component" or a "module" may refer to a processor, a memory device, a sensor, a battery, a display device, a light-emitting device, an interface device, a radio frequency (RF) tag, a receiver, or a transmitter included in an electronic device. A "semiconductor device" may refer to a device including a semiconductor element or a driver circuit, a control circuit, a logic circuit, a signal generation circuit, a signal conversion circuit, a potential level converter circuit, a voltage source, a current source, a switching circuit, an amplifier circuit, a memory circuit, a memory cell, a display circuit, a display pixel, or the like which includes a semiconductor element and is included in an electronic component or a module.

In this specification and the like, a metal oxide means an oxide of metal in a broad sense. Metal oxides are classified into oxide insulators, oxide conductors (including transparent oxide conductors), oxide semiconductors (also simply referred to as OS), and the like. For example, a metal oxide used in an active layer of a transistor is called an oxide semiconductor in some cases. That is to say, when a metal oxide is included in a channel formation region of a transistor that has at least one of an amplifying function, a rectifying function, and a switching function, the metal oxide can be called a metal oxide semiconductor, or OS for short. An OS FET refers to a transistor including a metal oxide or an oxide semiconductor.

In this specification and the like, a metal oxide including nitrogen is also called a metal oxide in some cases. Moreover, a metal oxide including nitrogen may be called a metal oxynitride.

In this specification, a transistor is an element having at least three terminals of a gate, a drain, and a source. The transistor has a channel formation region between the drain (a drain terminal, a drain region, or a drain electrode) and the source (a source terminal, a source region, or a source electrode), and current can flow through the channel formation region between the source and the drain. Note that in this specification and the like, a channel formation region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

In this specification and the like, a switch is conducting (on state) or not conducting (off state) to determine whether current flows therethrough or not. Alternatively, a switch has a function of selecting and changing a current path.

Examples of a switch include an electrical switch and a mechanical switch. That is, any element can be used as a switch as long as it can control current, without limitation to a certain element.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically cut off. In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

In this specification and the like, when it is described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X, Y, and the like each denote an object (e.g., a device, an element, a circuit, a wiring, an electrode, a terminal, a conductive film, a layer, or the like).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, the explicit expression "X and Y are electrically connected" is the same as the explicit simple expression "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. In addition, the term "substantially perpendicular" indicates that the angle formed between two straight lines is greater than or equal to 60° and less than or equal to 120°.

Embodiment 1

In this embodiment, a product-sum operation circuit which is a semiconductor device of one embodiment of the present invention will be described. Note that in the product-sum operation circuit, the sum of products of first analog data and second analog data is conducted.

Configuration Example

FIG. 1 illustrates an example of a semiconductor device of one embodiment of the present invention. FIG. 1 is a block diagram of a product-sum operation circuit. A semiconductor device 100 includes an offset circuit 110 and a memory cell array 120.

The offset circuit 110 includes column output circuits OUT[1] to OUT[n] (n is an integer greater than or equal to 1) and a reference column output circuit $C_{ref}$.

In the memory cell array 120, m (m is an integer greater than or equal to 1) memory cells AM are arranged in the column direction and n memory cells AM are arranged in the row direction; that is, m×n memory cells AM are provided. In addition, m memory cells $AM_{ref}$ are arranged in the column direction. The total number of the memory cells AM and the memory cells $AM_{ref}$ provided in matrix in the memory cell array 120 is m×(n+1). In particular, in the memory cell array 120 in FIG. 1, the memory cell AM positioned in an i-th row and a j-th column is denoted by a memory cell AMP'" (i is an integer greater than or equal to 1 and less than or equal to m, and j is an integer greater than or equal to 1 and less than or equal to n), and the memory cell $AM_{ref}$ positioned in the i-th row is denoted by a memory cell $AM_{ref}[i]$.

The memory cell AM retains a potential corresponding to the first analog data, and the memory cell $AM_{ref}$ retains a predetermined potential. Note that the predetermined potential is a potential necessary for the product-sum operation, and in this specification, data corresponding to this predetermined potential is referred to as reference analog data in some cases.

The memory cell array 120 includes output terminals SPT[1] to SPT[n].

The column output circuit OUT[j] includes an output terminal OT[j], and the reference column output circuit $C_{ref}$ includes an output terminal $OT_{ref}$.

A wiring ORP is electrically connected to the column output circuits OUT[1] to OUT[n], and a wiring OSP is electrically connected to the column output circuits OUT[1] to OUT[n]. The wiring ORP and the wiring OSP are wirings for supplying a control signal to the offset circuit 110.

An output terminal SPT[j] of the memory cell array 120 is electrically connected to a wiring B[j].

The output terminal OT[j] of the column output circuit OUT[j] is electrically connected to the wiring B[j].

The output terminal $OT_{ref}$ of the reference column output circuit $C_{ref}$ is electrically connected to a wiring $B_{ref}$.

The memory cell AM[i,j] is electrically connected to a wiring RW[i], a wiring WW[i], a wiring WD[j], the wiring B[1], and a wiring VR.

The memory cell $AM_{ref}[i]$ is electrically connected to the wiring RW[i], the wiring WW[i], a wiring $WD_{ref}$, the wiring $B_{ref}$, and the wiring VR.

The wiring WW[i] functions as a wiring for supplying a selection signal to each of the memory cells AM[i,1] to AM[i,n] and the memory cell $AM_{ref}[i]$. The wiring RW[i] functions as a wiring for supplying either a reference potential or a potential corresponding to the second analog data to each of the memory cells AM[i,1] to AM[i,n] and the memory cell $AM_{ref}[i]$. The wiring WD[j] functions as a wiring for supplying writing data to each of the memory cells AM in the j-th column. The wiring VR functions as a wiring for supplying a predetermined potential to the memory cells AM or the memory cells $AM_{ref}$ when data are read from the memory cells AM or the memory cells $AM_{ref}$.

The wiring B[j] functions as a wiring for supplying a signal from the column output circuit OUT[j] to each of the memory cells AM in the j-th column in the memory cell array 120.

The wiring $B_{ref}$ functions as a wiring for supplying a signal from the reference column output circuit $C_{ref}$ to each of the memory cells $AM_{ref}[1]$ to $AM_{ref}[m]$.

In the semiconductor device 100 illustrated in FIG. 1, only the following components are illustrated: the offset circuit 110; the memory cell array 120; the column output circuit OUT[1]; the column output circuit OUT[j]; the column output circuit OUT[n]; the reference column output circuit $C_{ref}$; an output terminal OT[1]; the output terminal OT[j]; an output terminal OT[n]; the output terminal $OT_{ref}$; an output terminal SPT[1]; the output terminal SPT[j]; an output terminal SPT[n]; a memory cell AM[1,1]; the memory cell AM[i,1]; a memory cell AM[m,1]; a memory cell AM[1,j]; the memory cell AM[i,j]; a memory cell AM[m,j]; a memory cell AM[1,n]; the memory cell AM[i,n]; a memory cell AM[m,n]; a memory cell $AM_{ref}[1]$; the memory cell $AM_{ref}[j]$; a memory cell $AM_{ref}[m]$; the wiring OSP; the wiring ORP; a wiring B[1]; the wiring B[j]; a wiring B[n]; the wiring Bra; a wiring WD[1]; the wiring WD[j]; a wiring WD[n]; the wiring $WD_{ref}$; the wiring VR; a wiring RW[1]; the wiring RW[i]; a wiring RW[m]; a wiring WW[1]; the wiring WW[i]; and a wiring WW[m]. Other circuits, wirings, elements, and reference numerals thereof are not illustrated.

A structure of one embodiment of the present invention is not limited to the configuration of the semiconductor device 100 illustrated in FIG. 1. Depending on circumstances or conditions or as needed, the structure of the semiconductor device 100 can be changed. For example, depending on a circuit configuration of the semiconductor device 100, the wiring WD[j] and the wiring VR are not separately provided, and one wiring may be shared therebetween. Alternatively, depending on a circuit configuration of the semiconductor device 100, the wiring ORP and the wiring OSP are not separately provided, and one wiring may be shared therebetween.

<<Offset Circuit 110>>

Figure 2:
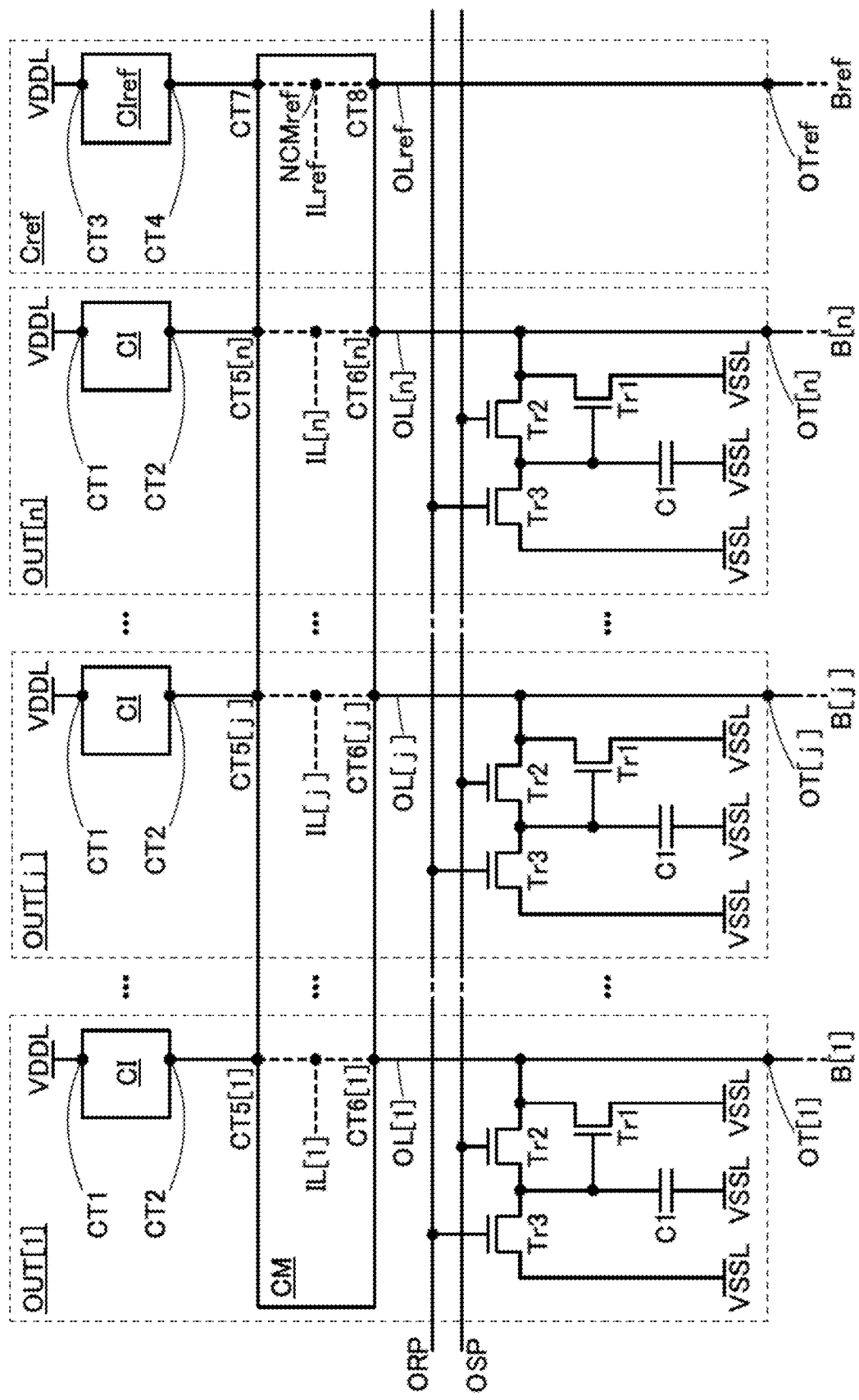
FIG. 2 is a circuit diagram illustrating an example of an offset circuit in the semiconductor device of FIG. 1.

Next, an example of a circuit configuration that can be applied for the offset circuit 110 will be described. FIG. 2 illustrates an offset circuit 111 as an example of the offset circuit 110.

The offset circuit 111 is electrically connected to a wiring VDDL and a wiring VS SL for supplying a power supply voltage. Specifically, each of the column output circuits OUT[1] to OUT[n] are electrically connected to the wiring VDDL and the wiring VSSL, and the reference column output circuit $C_{ref}$ is electrically connected to the wiring VDDL. Note that a current mirror circuit CM described later is electrically connected to the wiring VSSL in some cases.

The wiring VDDL supplies a high-level potential. The wiring VSSL supplies a low-level potential.

A circuit configuration of an inside of the column output circuit OUT[j] will be described below. The column output circuit OUT[j] includes a constant current circuit CI, transistors Tr1 to Tr3, a capacitor C1, and a wiring OL[j]. The current mirror circuit CM is shared between the column output circuits OUT[1] to OUT[n] and the reference column output circuit $C_{ref}$.

The constant current circuit CI includes a terminal CT1 and a terminal CT2. The terminal CT1 functions as an input terminal of the constant current circuit CI, and the terminal CT2 functions as an output terminal of the constant current circuit CI. The current mirror circuit CM shared between the column output circuits OUT[1] to OUT[n] and the reference column output circuit $C_{ref}$ includes terminals CT5[1] to CT5[n], terminals CT6[1] to CT6[n], a terminal CT7, and a terminal CT8.

The constant current circuit CI has a function of keeping the amount of current flowing from the terminal CT1 to the terminal CT2 constant.

In the column output circuit OUT[j], a first terminal of the transistor Tr1 is electrically connected to the wiring OL[j], a second terminal of the transistor Tr1 is electrically connected to the wiring VSSL, and a gate of the transistor Tr1 is electrically connected to a first terminal of the capacitor C1. A first terminal of the transistor Tr2 is electrically connected to the wiring OL[j], a second terminal of the transistor Tr2 is electrically connected to the first terminal of the capacitor C1, and a gate of the transistor Tr2 is electrically connected to the wiring OSP. A first terminal of the transistor Tr3 is electrically connected to the first terminal of the capacitor C1, a second terminal of the transistor Tr3 is electrically connected to the wiring VSSL, and a gate of the transistor Tr3 is electrically connected to the wiring ORP. A second terminal of the capacitor C1 is electrically connected to the wiring VSSL.

In the column output circuit OUT[j], the terminal CT1 of the constant current circuit CI is electrically connected to the wiring VDDL, and the terminal CT2 of the constant current circuit CI is electrically connected to the terminal CT5[j] of the current mirror circuit CM. The terminal CT6[j] of the current mirror circuit CM is electrically connected to the output terminal OT[j].

Note that the wiring OL[j] is a wiring for making the terminal CT2 of the constant current circuit CI being electrically connected to the output terminal OT[j] through the terminal CT5[j] and the terminal CT6[j] of the current mirror circuit CM.

Next, the reference column output circuit $C_{ref}$ will be described. The reference column output circuit $C_{ref}$ includes the constant current circuit $CI_{ref}$ and a wiring $OL_{ref}$. As described above, the reference column output circuit $C_{ref}$ includes the current mirror circuit CM that is shared with the column output circuits OUT[1] to OUT[n].

The constant current circuit $CI_{ref}$ includes a terminal CT3 and a terminal CT4. The terminal CT3 functions as an input terminal of the constant current circuit $CI_{ref}$, and the terminal CT4 functions as an output terminal of the constant current circuit $CI_{ref}$.

The constant current circuit $CI_{ref}$ has a function of keeping the amount of current flowing from the terminal CT3 to the terminal CT4 constant.

In the reference column output circuit $C_{ref}$, the terminal CT3 of the constant current circuit $CI_{ref}$ is electrically connected to the wiring VDDL, and the terminal CT4 of the constant current circuit $CI_{ref}$ is electrically connected to the terminal CT7 of the current mirror circuit CM.

The terminal CT8 of the current mirror circuit CM is electrically connected to the output terminal $OT_{ref}$.

The wiring $OL_{ref}$ is a wiring for making the terminal CT4 of the constant current circuit $CI_{ref}$ being electrically connected to the output terminal $OT_{ref}$ through the terminal CT7 and the terminal CT8 of the current mirror circuit CM.

In the current mirror circuit CM, the terminal CT5[j] is electrically connected to the terminal CT6[j], and the terminal CT7 is electrically connected to the terminal CT8. In addition, a wiring IL[j] is electrically connected between the terminal CT5[j] and the terminal CT6[j], and a wiring $IL_{ref}$ is electrically connected between the terminal CT7 and the terminal CT8. Furthermore, a connection portion of the wiring $IL_{ref}$ between the terminal CT7 and the terminal CT8 is a node $NCM_{ref}$. The current mirror circuit CM has a function of equalizing the amount of current flowing in the wiring $IL_{ref}$ and the amount of current flowing in each of wirings IL[1] to IL[n] with reference to the potential of the node $NCM_{ref}$.

In the offset circuit 111 illustrated in FIG. 2, only the following components are illustrated: the column output circuit OUT[1]; the column output circuit OUT[j]; the column output circuit OUT[n]; the reference column output circuit $C_{ref}$; the constant current circuit CI; the constant current circuit $CI_{ref}$; the current mirror circuit CM; the output terminal OT[1]; the output terminal OT[j]; the output terminal OT[n]; the output terminal $OT_{ref}$; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the capacitor C1; a wiring OL[1]; the wiring OL[j]; a wiring OL[n]; the wiring $OL_{ref}$; the wiring ORP; the wiring OSP; the wiring B[1]; the wiring B[j]; the wiring B[n]; the wiring Bra; the wiring IL[1]; the wiring IL[j]; the wiring IL[n]; the wiring $IL_{ref}$; the node $NCM_{ref}$; the wiring VDDL; and the wiring VSSL. Other circuits, wirings, elements, and reference numerals thereof are not illustrated.

Note that a structure of one embodiment of the present invention is not limited to the configuration of the offset circuit 111 in FIG. 2. Depending on circumstances or conditions or as needed, the structure of the offset circuit 111 can be changed.

[Constant Current Circuits CI and $CI_{ref}$]

Next, an example of internal structures of the constant current circuit CI and the constant current circuit $CI_{ref}$ will be described.

Figure 3:
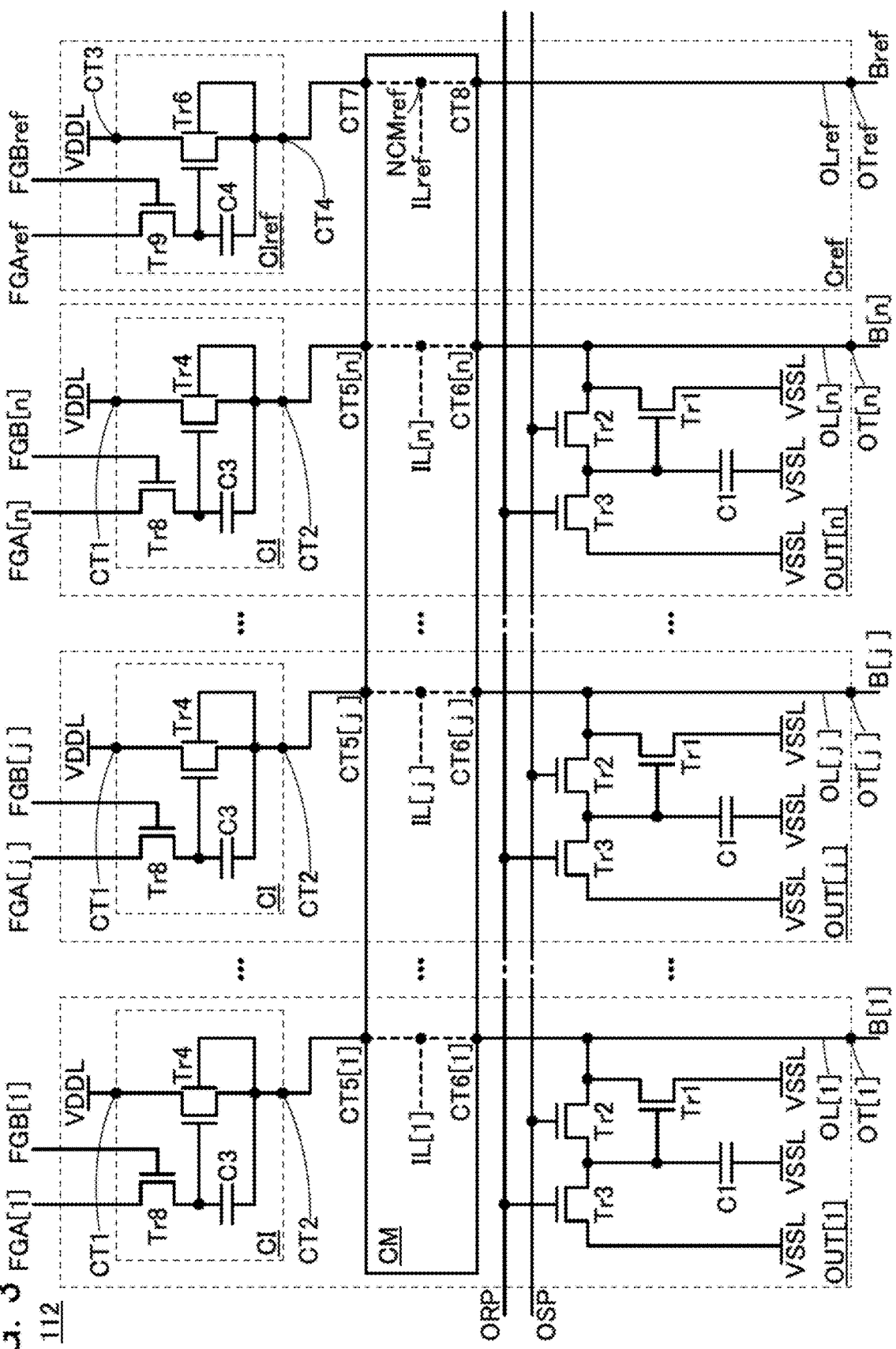
FIG. 3 is a circuit diagram illustrating an example of an offset circuit in the semiconductor device of FIG. 1.

An offset circuit 112 illustrated in FIG. 3 is a circuit diagram illustrating an example of internal structures of the constant current circuit CI and the constant current circuit $CI_{ref}$ included in the offset circuit 111 illustrated in FIG. 2.

In the column output circuit OUT[j], the constant current circuit CI includes a transistor Tr4, a transistor Tr8, and a capacitor C3. In particular, the transistor Tr4 includes a first gate and a second gate.

Note that in this specification, the first gate of the transistor indicates a front gate, and a term "first gate" can be replaced with a term "gate". Besides, the second gate in the transistor indicates a back gate, and a term "second gate" can be replaced with a term "back gate".

A first terminal of the transistor Tr4 is electrically connected to the terminal CT1 of the constant current circuit CI, a second terminal of the transistor Tr4 is electrically connected to the terminal CT2 of the constant current circuit CI, a gate of the transistor Tr4 is electrically connected to a first terminal of the capacitor C3, and a back gate of the transistor Tr4 is electrically connected to the terminal CT2 of the constant current circuit CI. A second terminal of the capacitor C3 is electrically connected to the second terminal of the transistor Tr4. A first terminal of the transistor Tr8 is electrically connected to a wiring FGA[j], a second terminal of the transistor Tr8 is electrically connected to the first terminal of the capacitor C3, and a gate of the transistor Tr8 is electrically connected to a wiring FGB[j].

Since the second terminal and the back gate of the transistor Tr4 are electrically connected to each other, the potential of the second terminal of the transistor Tr4 and the potential of the back gate of the transistor Tr4 are equal. Therefore, when the potential of the second terminal of the transistor Tr4 increases, the potential of the back gate of the transistor Tr4 also increases, whereby the transistor Tr4 becomes normally on. On the contrary, when the potential of the second terminal of the transistor Tr4 decreases, the potential of the back gate of the transistor Tr4 also decreases, whereby the transistor Tr4 becomes normally off. That is, even when the potential of the second terminal of the transistor Tr4 is changed, the change in the amount of current flowing from the first terminal to the second terminal of the transistor Tr4 owing to the change in the potential of the second terminal of the transistor Tr4 can be reduced because the potential of the back gate of the transistor Tr4 is also changed.

The wiring FGA[j] is a wiring for applying a potential to the gate of the transistor Tr4. The wiring FGB[j] is a wiring for switching the transistor Tr8.

When the constant current circuit CI has the above structure, the potential of the gate of the transistor Tr4 can be retained by the capacitor C3. Specifically, a high-level potential is applied to the wiring FGB[j] to turn on the transistor Tr8 and a potential is supplied from the wiring FGA[j] to the gate of the transistor Tr4. After that, a low-level potential is applied to the wiring FGB[j] to turn off the transistor Tr8, whereby the gate of the transistor Tr4 can be set in an electrically floating state.

When the transistor Tr8 is in an off state, the change in the potential of the second terminal of the transistor Tr4 leads to the change in the potential of the gate of the transistor Tr4 by capacitive coupling due to the capacitor C3. The amount of the change in the potential of the gate of the transistor Tr4 is determined by the capacitance value of the capacitor C3, the capacitive coupling coefficient determined by the gate capacitance of the transistor Tr4, parasitic capacitance, and the like, and the potential of the second terminal of the transistor Tr4.

By changing the potential of the gate of the transistor Tr4 in accordance with the potential of the second terminal of the transistor Tr4 as described above, the amount of the current flowing from the first terminal to the second terminal of the transistor Tr4 can be stable. In other words, the amount of current output from the terminal CT2 of the constant current circuit CI can be prevented from changing significantly before and after the change in the potential of the second terminal of the transistor Tr4.

In the reference column output circuit $C_{ref}$, the constant current circuit $CI_{ref}$ includes a transistor Tr6, a transistor Tr9, and a capacitor C4. In particular, the transistor Tr6 includes a first gate (referred to as a gate) and a second gate (referred to as a back gate).

A first terminal of the transistor Tr6 is electrically connected to the terminal CT3 of the constant current circuit $CI_{ref}$, a second terminal of the transistor Tr6 is electrically connected to the terminal CT4 of the constant current circuit $CI_{ref}$, a gate of the transistor Tr6 is electrically connected to a first terminal of the capacitor C4, and a back gate of the transistor Tr6 is electrically connected to the terminal CT4 of the constant current circuit $CI_{ref}$. A second terminal of the capacitor C4 is electrically connected to the second terminal of the transistor Tr6. A first terminal of the transistor Tr9 is electrically connected to a wiring $FGA_{ref}$, a second terminal of the transistor Tr9 is electrically connected to the first terminal of the capacitor C4, and a gate of the transistor Tr9 is electrically connected to a wiring $FGB_{ref}$.

The constant current circuit $CI_{ref}$ and the constant current circuit CI have the same circuit configuration. Therefore, as the constant current circuit CI, the amount of current output from the terminal CT4 of the constant current circuit $CI_{ref}$ can be prevented from changing significantly by the electrical connection between the second terminal and the back gate of the transistor Tr6 and capacitive coupling due to the capacitor C4 between the gate and the second terminal of the transistor Tr6.

The configuration of the constant current circuit CI of the offset circuit 112 is favorable when a back gate insulating film of the transistor Tr4 is thicker than a gate insulating film of the transistor Tr4 and parasitic capacitance on the back gate side is small. Similarly, the configuration of the constant current circuit $CI_{ref}$ of the offset circuit 112 is favorable when a back gate insulating film of the transistor Tr6 is thicker than a gate insulating film of the transistor Tr6 and parasitic capacitance on the back gate side is small.

In Example 1 described later, a current source circuit having substantially the same configuration as the constant current circuit CI and the constant current circuit $CI_{ref}$ is fabricated by using a circuit simulator and calculation results of an output current with respect to a potential input to the current source circuit are described.

In the offset circuit 112 illustrated in FIG. 3, only the following components are illustrated: the column output circuit OUT[1]; the column output circuit OUT[j]; the column output circuit OUT[n]; the reference column output circuit $C_{ref}$; the constant current circuit CI; the constant current circuit $CI_{ref}$; the current mirror circuit CM; the output terminal OT[1]; the output terminal OT[j]; the output terminal OT[n]; the output terminal $OT_{ref}$; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the transistor Tr4; the transistor Tr6; the transistor Tr8, the transistor Tr9, the capacitor C1; the capacitor C3, the capacitor C4, the wiring OL[1]; the wiring OL[j]; the wiring OL[n]; the wiring $OL_{ref}$; the wiring ORP; the wiring OSP; the wiring B[1]; the wiring B[j], the wiring B[n], the wiring $B_{ref}$, the wiring FGA[1]; the wiring FGA[j]; the wiring FGA[n]; the wiring $FGA_{ref}$; a wiring FGB[1]; the wiring FGB[j]; a wiring FGB[n]; the wiring $FGB_{ref}$; the wiring IL[1]; the wiring IL[j]; the wiring IL[n]; the wiring $IL_{ref}$; the node $NCM_{ref}$; the wiring VDDL; and the wiring VSSL. Other circuits, wirings, elements, and reference numerals thereof are not illustrated.

The configurations of the constant current circuit CI and the constant current circuit $CI_{ref}$ of one embodiment of the present invention are not limited to those of the constant current circuit CI and the constant current circuit CI$_{ref}$ of the offset circuit 112 illustrated in FIG. 3. For example, the configurations of the constant current circuit CI and the constant current circuit CI$_{ref}$ may be those of the constant current circuit CI and the constant current circuit CI$_{ref}$ of an offset circuit 115 illustrated in FIG. 4.

The constant current circuit CI and the constant current circuit CI$_{ref}$ of the offset circuit 115 are different from those of the offset circuit 112 in the connection structures of the transistor Tr4 and the transistor Tr6. Specifically, in the offset circuit 115, the back gate of the transistor Tr4 is electrically connected to the first terminal of the capacitor C3 and the gate of the transistor Tr4 is electrically connected to the second terminal of the transistor Tr4. Note that, as in the offset circuit 112, the first terminal of the transistor Tr4 is electrically connected to the terminal CT1 and the second terminal of the transistor Tr4 is electrically connected to the terminal CT2. In addition, in the offset circuit 115, the back gate of the transistor Tr6 is electrically connected to the first terminal of the capacitor C4 and the gate of the transistor Tr6 is electrically connected to the second terminal of the transistor Tr6. Note that, as in the offset circuit 112, the first terminal of the transistor Tr6 is electrically connected to the terminal CT3 and the second terminal of the transistor Tr6 is electrically connected to the terminal CT4.

Figure 4:
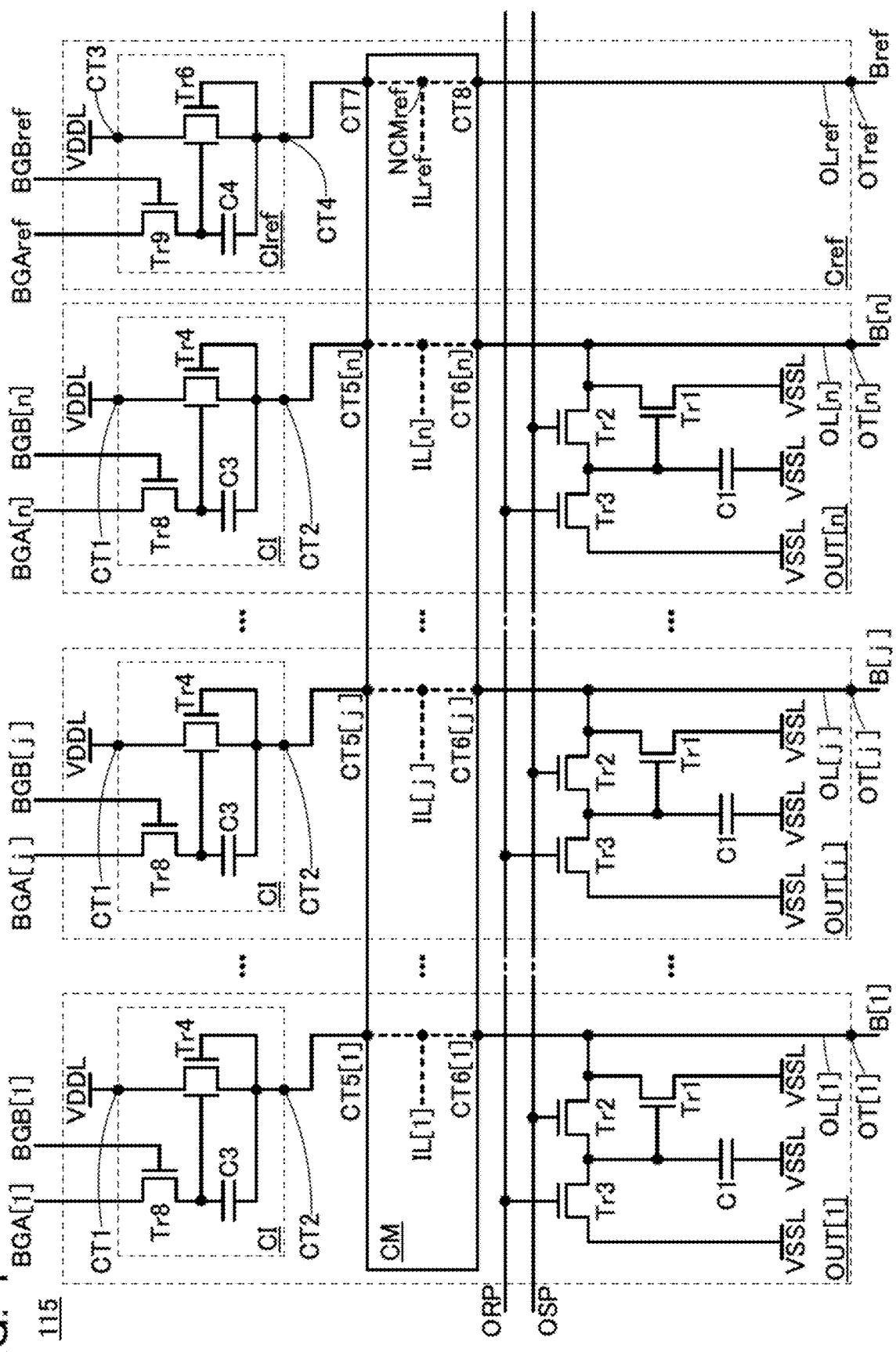
FIG. 4 is a circuit diagram illustrating an example of an offset circuit in the semiconductor device of FIG. 1.

In FIG. 4, the first terminal of the transistor Tr8 of the constant current circuit CI of the column output circuit OUT[1] is electrically connected to a wiring BGA[1] and the gate of the transistor Tr8 is electrically connected to a wiring BGB[1]. Similarly, the first terminal of the transistor Tr8 of the constant current circuit CI of the column output circuit OUT[j] is electrically connected to a wiring BGA[j] and the gate of the transistor Tr8 is electrically connected to a wiring BGB[j]. Furthermore, similarly, the first terminal of the transistor Tr8 of the constant current circuit CI of the column output circuit OUT[n] is electrically connected to a wiring BGA[n] and the gate of the transistor Tr8 is electrically connected to a wiring BGB[n]. The first terminal of the transistor Tr9 of the constant current circuit CI$_{ref}$ of the reference column output circuit C$_{ref}$ is electrically connected to a wiring BGA$_{ref}$ and the gate of the transistor Tr9 is electrically connected to a wiring BGB$_{ref}$.

The configuration of the constant current circuit CI of the offset circuit 115 is favorable when the gate insulating film of the transistor Tr4 is thicker than the back gate insulating film of the transistor Tr4 and parasitic capacitance on the gate side is small. Similarly, the configuration of the constant current circuit CI$_{ref}$ of the offset circuit 115 is favorable when the gate insulating film of the transistor Tr6 is thicker than the back gate insulating film of the transistor Tr6 and parasitic capacitance on the gate side is small.

Figure 5:
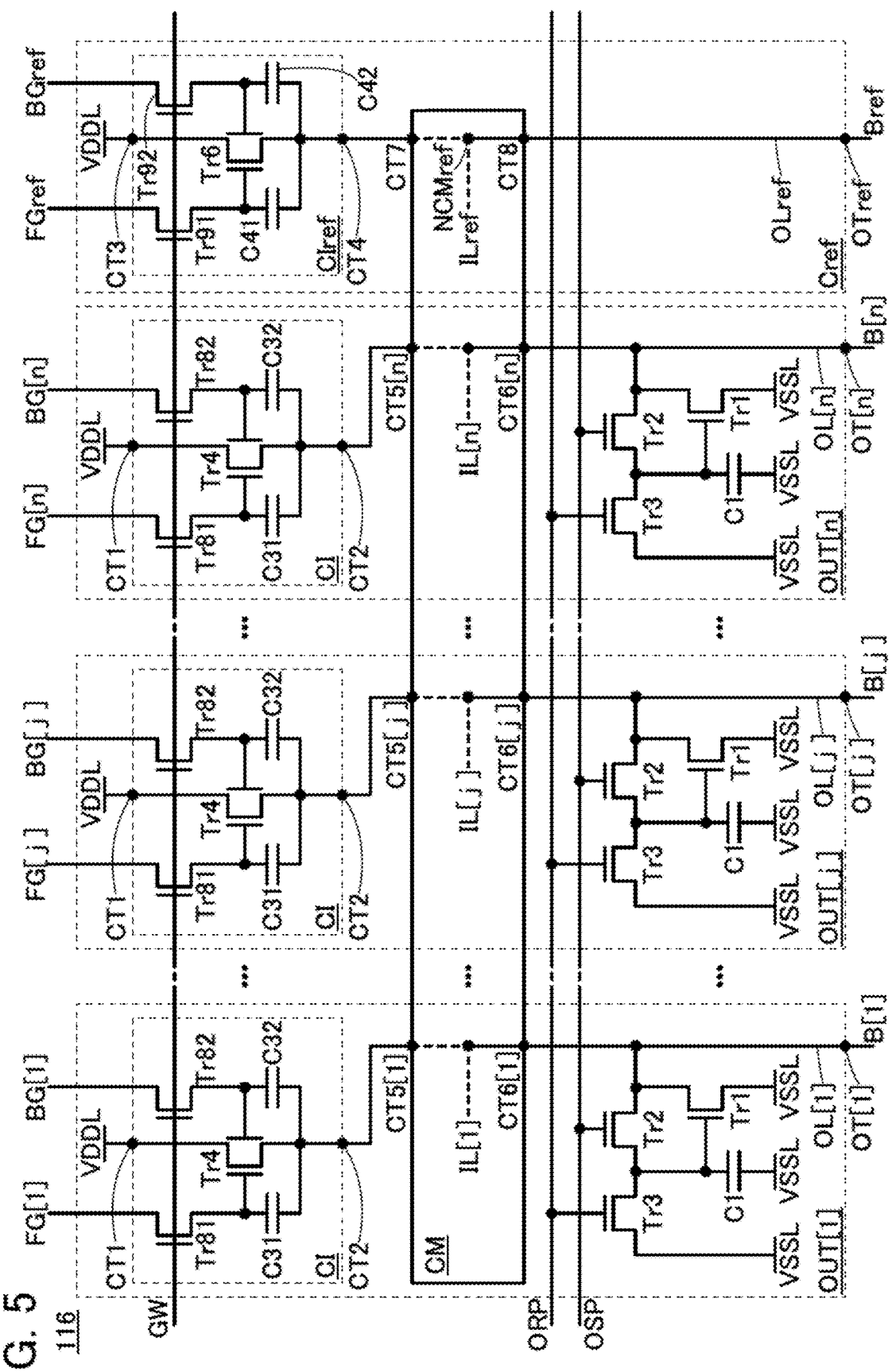
FIG. 5 is a circuit diagram illustrating an example of an offset circuit in the semiconductor device of FIG. 1.

Alternatively, for example, the configurations of the constant current circuit CI and the constant current circuit CI$_{ref}$ may be those of the constant current circuit CI and the constant current circuit CI$_{ref}$ of an offset circuit 116 illustrated in FIG. 5.

The circuit configurations of the constant current circuit CI and the constant current circuit CI$_{ref}$ of the offset circuit 116 will be described. The constant current circuit CI includes the transistor Tr4, a transistor Tr81, a transistor Tr82, a capacitor C31, and a capacitor C32. The constant current circuit CI$_{ref}$ includes the transistor Tr6, a transistor Tr91, a transistor Tr92, a capacitor C41, and a capacitor C42.

The constant current circuit CI of the column output circuit OUT[j] is focused on. The first terminal of the transistor Tr4 is electrically connected to the terminal CT1, the second terminal of the transistor Tr4 is electrically connected to the terminal CT2, the gate of the transistor Tr4 is electrically connected to a first terminal of the capacitor C31, and the back gate of the transistor Tr4 is electrically connected to a first terminal of the capacitor C32. A second terminal of the capacitor C31 is electrically connected to the second terminal of the transistor Tr4 and a second terminal of the capacitor C32 is electrically connected to the second terminal of the transistor Tr4. A first terminal of the transistor Tr81 is electrically connected to a wiring FG[j], a second terminal of the transistor Tr81 is electrically connected to the first terminal of the capacitor C31, and a gate of the transistor Tr81 is electrically connected to a wiring GW. A first terminal of the transistor Tr82 is electrically connected to a wiring BG[j], a second terminal of the transistor Tr82 is electrically connected to the first terminal of the capacitor C32, and a gate of the transistor Tr82 is electrically connected to the wiring GW.

The constant current circuit CI$_{ref}$ of the reference column output circuit C$_{ref}$ is focused on. The first terminal of the transistor Tr6 is electrically connected to the terminal CT3, the second terminal of the transistor Tr6 is electrically connected to the terminal CT4, the gate of the transistor Tr6 is electrically connected to a first terminal of the capacitor C41, and the back gate of the transistor Tr6 is electrically connected to a first terminal of the capacitor C42. A second terminal of the capacitor C41 is electrically connected to the second terminal of the transistor Tr6 and a second terminal of the capacitor C42 is electrically connected to the second terminal of the transistor Tr6. A first terminal of the transistor Tr91 is electrically connected to a wiring FG$_{ref}$, a second terminal of the transistor Tr91 is electrically connected to the first terminal of the capacitor C41, and a gate of the transistor Tr91 is electrically connected to the wiring GW. A first terminal of the transistor Tr92 is electrically connected to a wiring BG$_{ref}$, a second terminal of the transistor Tr92 is electrically connected to the first terminal of the capacitor C42, and a gate of the transistor Tr92 is electrically connected to the wiring GW.

The wiring FG[j] is a wiring for supplying a potential to the gate of the transistor Tr4 and the potential of the gate of the transistor Tr4 is retained by the capacitor C31. The wiring BG[j] is a wiring for supplying a potential to the back gate of the transistor Tr4 and the potential of the back gate of the transistor Tr4 is retained by the capacitor C32. The wiring FG$_{ref}$ is a wiring for supplying a potential to the gate of the transistor Tr6 and the potential of the gate of the transistor Tr6 is retained by the capacitor C41. The wiring BG$_{ref}$ is a wiring for supplying a potential to the back gate of the transistor Tr6 and the potential of the back gate of the transistor Tr6 is retained by the capacitor C42.

The wiring GW is a wiring for switching the transistors Tr81, Tr82, Tr91, and Tr92. The transistors Tr81, Tr82, Tr91, and Tr92 can be turned on by applying a high-level potential to the wiring GW. A potential can be supplied to each of the gate and back gate of the transistor Tr4 of each of the constant current circuits CI by applying a potential to each of wirings FG[1] to FG[n] and wirings BG[1] to BG[n]. Similarly, a potential can be supplied to each of the gate and back gate of the transistor Tr6 by applying a potential to each of the wiring FG$_{ref}$ and the wiring BG$_{ref}$. After a potential is supplied to each of the gates and back gates of the transistor Tr4 and the transistor Tr6 of each of the constant current circuits CI, a low-level potential is applied to the wiring GW to turn off the transistors Tr81, Tr82, Tr91, and Tr92.

Accordingly, the gates and back gates of the transistor Tr4 and the transistor Tr6 of each of the constant current circuits CI are set in an electrically floating state. Thus, the change in the potential of the second terminal of the transistor Tr4 leads to the change in the potential of each of the gate and back gate of the transistor Tr4 by capacitive coupling, and the change in the potential of the second terminal of the transistor Tr6 leads to the change in the potential of each of the gate and back gate of the transistor Tr6 by capacitive coupling. Therefore, the amount of the current output from the terminal CT2 of the constant current circuit CI can be prevented from changing significantly even when the potential of the second terminal of the transistor Tr4 changes. Similarly, the amount of current output from the terminal CT4 of the constant current circuit CI$_{ref}$ can be prevented from changing significantly even when the potential of the second terminal of the transistor Tr6 changes. The constant current circuit CI and the constant current circuit CI$_{ref}$ of the offset circuit 116 can independently supply a potential to each of the gates and back gates of all the transistors Tr4 and the transistors Tr6, so that the offset circuit 116 can set operating points of the constant current circuit CI and the constant current circuit CI$_{ref}$ more precisely than the offset circuit 112.

The circuit configurations of the constant current circuit CI and the constant current circuit CI$_{ref}$ of one embodiment of the present invention are not limited to those illustrated in FIG. 3 to FIG. 5. Depending on circumstances or conditions or as needed, the circuit configurations of the constant current circuit CI and the constant current circuit CI$_{ref}$ may be modified.

For example, circuit configurations different from those of the constant current circuit CI and the constant current circuit CI$_{ref}$ illustrated in FIG. 3 to FIG. 5 will be described with reference to FIG. 6 to FIG. 8.

Figure 6:
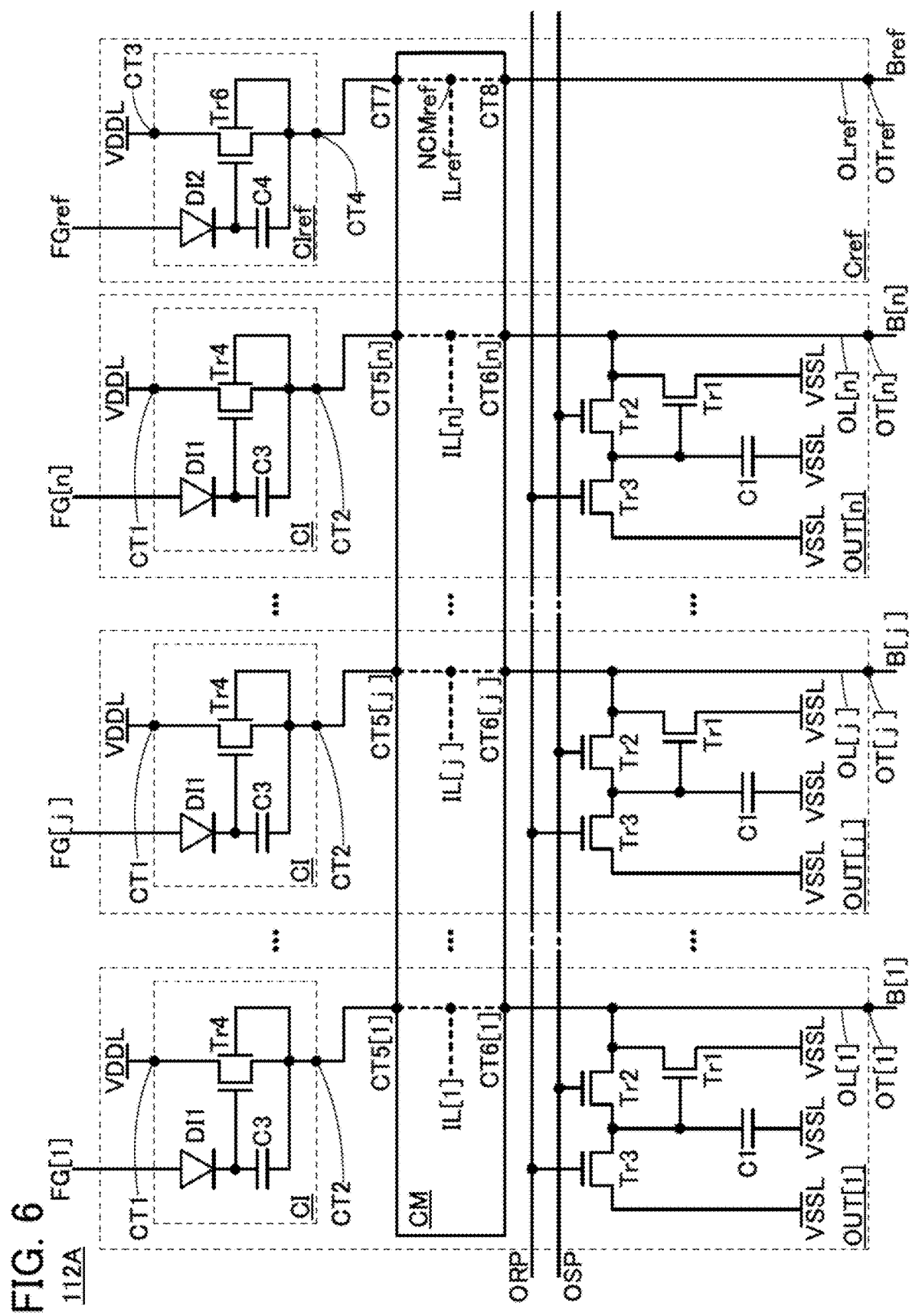
FIG. 6 is a circuit diagram illustrating an example of an offset circuit in the semiconductor device of FIG. 1.

An offset circuit 112A illustrated in FIG. 6 is a circuit diagram illustrating an example of internal structures of the constant current circuit CI and the constant current circuit CI$_{ref}$ included in the offset circuit 111 illustrated in FIG. 2 that are different from those in FIG. 3 to FIG. 5.

In the column output circuit OUT[j], the constant current circuit CI includes the transistor Tr4, a diode DI1, and the capacitor C3. In particular, the transistor Tr4 includes a first gate (referred to as a gate) and a second gate (referred to as a back gate).

The first terminal of the transistor Tr4 is electrically connected to the terminal CT1 of the constant current circuit CI, the second terminal of the transistor Tr4 is electrically connected to the terminal CT2 of the constant current circuit CI, the gate of the transistor Tr4 is electrically connected to the first terminal of the capacitor C3, and the back gate of the transistor Tr4 is electrically connected to the terminal CT2 of the constant current circuit CI. The second terminal of the capacitor C3 is electrically connected to the second terminal of the transistor Tr4. An input terminal of the diode DI1 is electrically connected to the wiring FG[j] and an output terminal of the diode DI1 is electrically connected to the first terminal of the capacitor C3.

The wiring FG[j] is a wiring for applying a potential to the gate of the transistor Tr4.

When the constant current circuit CI has the above structure, the potential of the gate of the transistor Tr4 can be retained by the capacitor C3. Specifically, a potential is supplied from the wiring FG[j] to the gate of the transistor Tr4 through the diode DI1, whereby the potential can be retained by the first terminal of the capacitor C3. Since the diode DI1 has a rectifying function, current does not flow from the first terminal of the capacitor C3 to the wiring FG[j] even after the potential of the wiring FG[j] is returned to the previous potential (a potential lower than the potential retained in the first terminal of the capacitor C3). That is, the gate of the transistor Tr4 can be set in an electrically floating state.

In the reference column output circuit C$_{ref}$, the constant current circuit CI$_{ref}$ includes the transistor Tr6, a diode DI2, and the capacitor C4. In particular, the transistor Tr6 includes a first gate (referred to as a gate) and a second gate (referred to as a back gate).

The first terminal of the transistor Tr6 is electrically connected to the terminal CT3 of the constant current circuit CI$_{ref}$, the second terminal of the transistor Tr6 is electrically connected to the terminal CT4 of the constant current circuit CI$_{ref}$, the gate of the transistor Tr6 is electrically connected to the first terminal of the capacitor C4, and the back gate of the transistor Tr6 is electrically connected to the terminal CT4 of the constant current circuit CI$_{ref}$. The second terminal of the capacitor C4 is electrically connected to the second terminal of the transistor Tr6. An input terminal of the diode DI2 is electrically connected to the wiring FG$_{ref}$ and an output terminal of the diode DI2 is electrically connected to the first terminal of the capacitor C4.

As described above, the constant current circuit CI illustrated in FIG. 6 has a configuration where the transistor Tr8 of the constant current circuit CI illustrated in FIG. 3 is replaced with the diode DI1 and the constant current circuit CI$_{ref}$ illustrated in FIG. 6 has a configuration where the transistor Tr9 of the constant current circuit CI$_{ref}$ illustrated in FIG. 3 is replaced with the diode DI2. Accordingly, the description of the constant current circuit CI in FIG. 3 can be referred to for the effect of the electrical connection between the second terminal and the back gate of the transistor Tr4 and the effect of the capacitive coupling due to the capacitor C3, and the description of the constant current circuit CI$_{ref}$ in FIG. 3 can be referred to for the effect of the electrical connection between the second terminal and the back gate of the transistor Tr6 and the effect of the capacitive coupling due to the capacitor C4.

In the offset circuit 112A illustrated in FIG. 6, only the following components are illustrated: the column output circuit OUT[1]; the column output circuit OUT[j]; the column output circuit OUT[n]; the reference column output circuit C$_{ref}$; the constant current circuit CI; the constant current circuit CI$_{ref}$; the current mirror circuit CM; the output terminal OT[1]; the output terminal OT[j]; the output terminal OT[n]; the output terminal OT$_{ref}$; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the transistor Tr6; the diode DI1; the diode DI2; the capacitor C1; the capacitor C3; the capacitor C4; the wiring OL[1]; the wiring OL[j]; the wiring OL[n]; the wiring ORP; the wiring OSP; the wiring B[1]; the wiring B[j]; the wiring B[n]; the wiring B$_{ref}$; the wiring FG[1]; the wiring FG[j]; the wiring FG[n]; the wiring FG$_{ref}$; the wiring IL[1]; the wiring IL[j]; the wiring IL[n]; the wiring IL$_{ref}$; the node NCM$_{ref}$; the wiring VDDL; and the wiring VSSL. Other circuits, wirings, elements, and reference numerals thereof are not illustrated.

Figure 7:
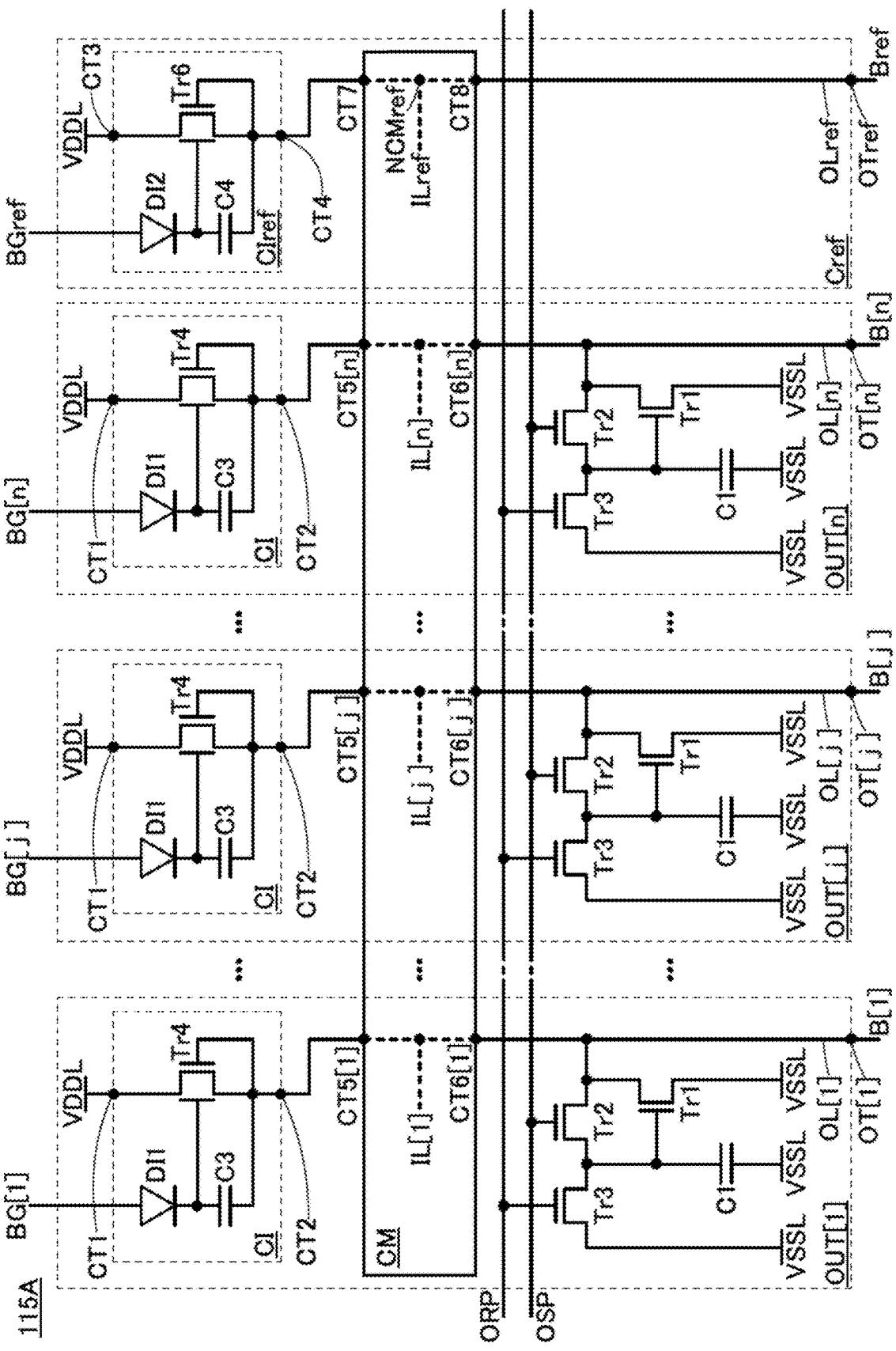
FIG. 7 is a circuit diagram illustrating an example of an offset circuit in the semiconductor device of FIG. 1.

An offset circuit 115A illustrated in FIG. 7 is a circuit diagram illustrating an example of internal structures of the constant current circuit CI and the constant current circuit CI$_{ref}$ included in the offset circuit 111 illustrated in FIG. 2 that are different from those in FIG. 3 to FIG. 6.

The constant current circuit CI and the constant current circuit CI$_{ref}$ of the offset circuit 115A are different from those of the offset circuit 112A in the connection structures of the transistor Tr4 and the transistor Tr6. Specifically, in the offset circuit 115A, the back gate of the transistor Tr4 is electrically connected to the first terminal of the capacitor C3 and the gate of the transistor Tr4 is electrically connected to the second terminal of the transistor Tr4. Note that, as in the offset circuit 112A, the first terminal of the transistor Tr4 is electrically connected to the terminal CT1 and the second terminal of the transistor Tr4 is electrically connected to the terminal CT2. In addition, the back gate of the transistor Tr6 is electrically connected to the first terminal of the capacitor C4 and the gate of the transistor Tr6 is electrically connected to the second terminal of the transistor Tr6 in the offset circuit 115A. Note that, as in the offset circuit 112A, the first terminal of the transistor Tr6 is electrically connected to the terminal CT3 and the second terminal of the transistor Tr6 is electrically connected to the terminal CT4.

In FIG. 7, the input terminal of the diode DI1 of the constant current circuit CI of the column output circuit OUT[1] is electrically connected to the wiring BG[1] and the output terminal of the diode DI1 is electrically connected to the back gate of the transistor Tr4 of the constant current circuit CI of the column output circuit OUT[1]. Similarly, the input terminal of the diode DI1 of the constant current circuit CI of the column output circuit OUT[j] is electrically connected to the wiring BG[j] and the output terminal of the diode DI1 is electrically connected to the back gate of the transistor Tr4 of the constant current circuit CI of the column output circuit OUT[j]. Furthermore, similarly, the input terminal of the diode DI1 of the constant current circuit CI of the column output circuit OUT[n] is electrically connected to the wiring BG[n] and the output terminal of the diode DI1 is electrically connected to the back gate of the transistor Tr4 of the constant current circuit CI of the column output circuit OUT[n]. An input terminal of the diode DI2 of the constant current circuit $CI_{ref}$ of the reference column output circuit $C_{ref}$ is electrically connected to the wiring $BG_{ref}$ and an output terminal of the diode DI2 is electrically connected to the back gate of the transistor Tr6 of the constant current circuit $CI_{ref}$ of the reference column output circuit $C_{ref}$.

As described above, the constant current circuit CI illustrated in FIG. 7 has a configuration where the transistor Tr8 of the constant current circuit CI illustrated in FIG. 4 is replaced with the diode DI1 and the constant current circuit $CI_{ref}$ illustrated in FIG. 7 has a configuration where the transistor Tr9 of the constant current circuit $CI_{ref}$ illustrated in FIG. 4 is replaced with the diode DI2. Accordingly, the description of the constant current circuit CI in FIG. 4 can be referred to for the effect of the electrical connection between the second terminal and the gate of the transistor Tr4 and the effect of the capacitive coupling due to the capacitor C3, and the description of the constant current circuit $CI_{ref}$ in FIG. 4 can be referred to for the effect of the electrical connection between the second terminal and the gate of the transistor Tr6 and the effect of the capacitive coupling due to the capacitor C4.

Figure 8:
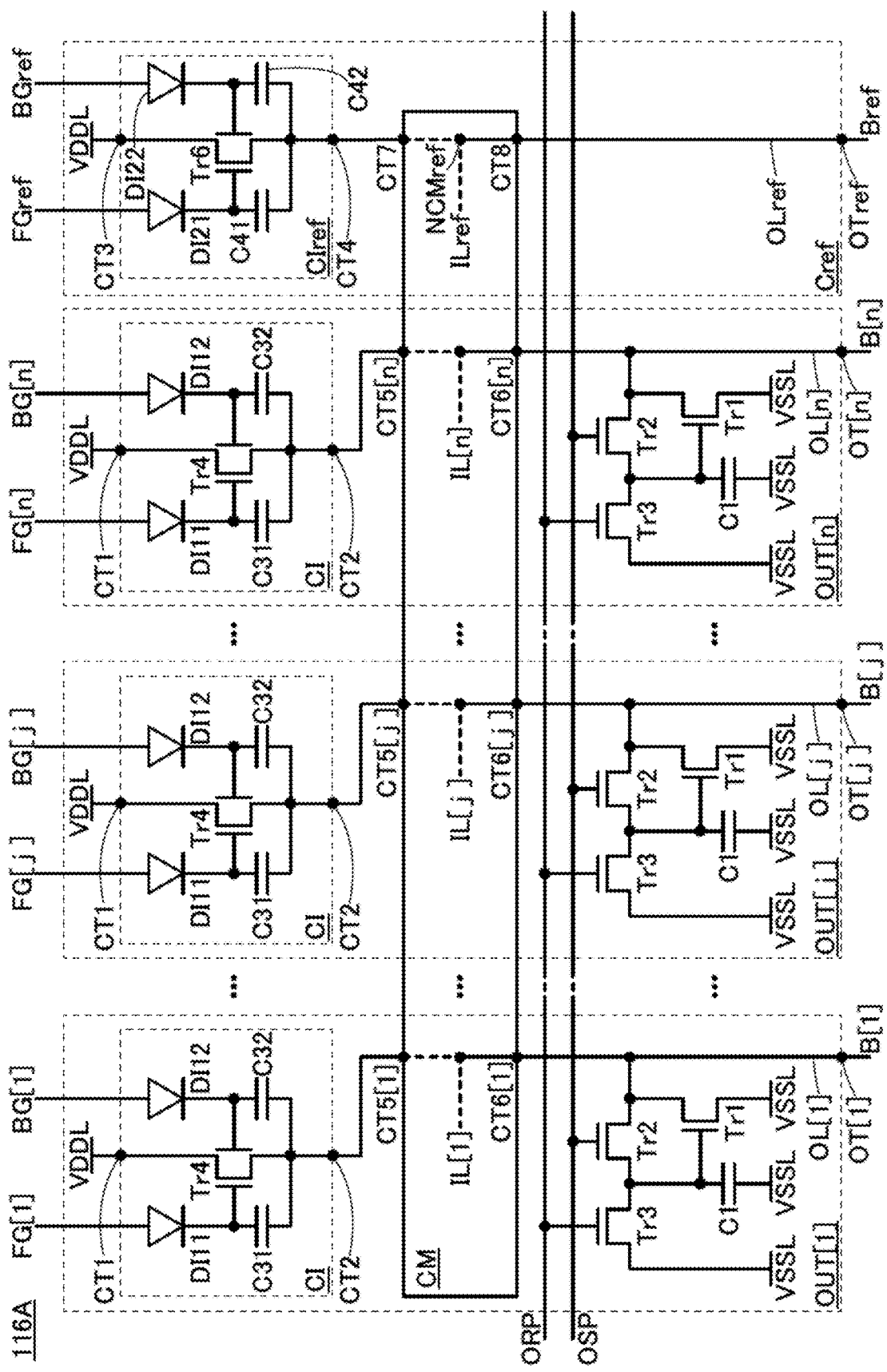
FIG. 8 is a circuit diagram illustrating an example of an offset circuit in the semiconductor device of FIG. 1.

An offset circuit 116A illustrated in FIG. 8 is a circuit diagram illustrating an example of internal structures of the constant current circuit CI and the constant current circuit $CI_{ref}$ included in the offset circuit 111 illustrated in FIG. 2 that are different from those in FIG. 3 to FIG. 7.

The circuit configurations of the constant current circuit CI and the constant current circuit $CI_{ref}$ of the offset circuit 116A will be described. The constant current circuit CI includes the transistor Tr4, a diode DI11, a diode DI12, the capacitor C31, and the capacitor C32. The constant current circuit $CI_{ref}$ includes the transistor Tr6, a diode DI21, a diode DI22, the capacitor C41, and the capacitor C42.

The constant current circuit CI of the column output circuit OUT[j] is focused on. The first terminal of the transistor Tr4 is electrically connected to the terminal CT1, the second terminal of the transistor Tr4 is electrically connected to the terminal CT2, the gate of the transistor Tr4 is electrically connected to the first terminal of the capacitor C31, and the back gate of the transistor Tr4 is electrically connected to the first terminal of the capacitor C32. The second terminal of the capacitor C31 is electrically connected to the second terminal of the transistor Tr4 and the second terminal of the capacitor C32 is electrically connected to the second terminal of the transistor Tr4. An input terminal of the diode DI11 is electrically connected to the wiring FG[j] and an output terminal of the diode DI11 is electrically connected to the first terminal of the capacitor C31. An input terminal of the diode DI12 is electrically connected to the wiring BG[j] and an output terminal of the diode DI12 is electrically connected to the first terminal of the capacitor C32.

The constant current circuit $CI_{ref}$ of the reference column output circuit $C_{ref}$ is focused on. The first terminal of the transistor Tr6 is electrically connected to the terminal CT3, the second terminal of the transistor Tr6 is electrically connected to the terminal CT4, the gate of the transistor Tr6 is electrically connected to the first terminal of the capacitor C41, and the back gate of the transistor Tr6 is electrically connected to the first terminal of the capacitor C42. The second terminal of the capacitor C41 is electrically connected to the second terminal of the transistor Tr6 and the second terminal of the capacitor C42 is electrically connected to the second terminal of the transistor Tr6. An input terminal of the diode DI21 is electrically connected to the wiring $FG_{ref}$ and an output terminal of the diode DI21 is electrically connected to the first terminal of the capacitor C41. An input terminal of the diode DI22 is electrically connected to the wiring $BG_{ref}$ and an output terminal of the diode DI22 is electrically connected to the first terminal of the capacitor C42.

The wiring FG[j] is a wiring for supplying a potential to the gate of the transistor Tr4 and the potential of the gate of the transistor Tr4 is retained by the capacitor C31. The wiring BG[j] is a wiring for supplying a potential to the back gate of the transistor Tr4 and the potential of the back gate of the transistor Tr4 is retained by the capacitor C32. The wiring $FG_{ref}$ is a wiring for supplying a potential to the gate of the transistor Tr6 and the potential of the gate of the transistor Tr6 is retained by the capacitor C41. The wiring $BG_{ref}$ is a wiring for supplying a potential to the back gate of the transistor Tr6 and the potential of the back gate of the transistor Tr6 is retained by the capacitor C42.

As described above, the constant current circuit CI illustrated in FIG. 8 has a configuration where the transistor Tr81 of the constant current circuit CI illustrated in FIG. 5 is replaced with the diode DI11 and the transistor Tr82 of the constant current circuit CI illustrated in FIG. 5 is replaced with the diode DI12, and the constant current circuit $CI_{ref}$ illustrated in FIG. 8 has a configuration where the transistor Tr91 of the constant current circuit $CI_{ref}$ illustrated in FIG. 5 is replaced with the diode DI21 and the transistor Tr92 of the constant current circuit $CI_{ref}$ illustrated in FIG. 5 is replaced with the diode DI22. Accordingly, the description of the constant current circuit CI in FIG. 5 can be referred to for the effect of the electrical connection between the second terminal and the gate of the transistor Tr4 and the effect of the capacitive coupling due to the capacitors C31 and C32, and the description of the constant current circuit $CI_{ref}$ in FIG. 5 can be referred to for the effect of the electrical connection between the second terminal and the gate of the transistor Tr6 and the effect of the capacitive coupling due to the capacitors C41 and C42.

[Current Mirror Circuit CM]

Next, an internal structure example of the current mirror circuit CM will be described.

Figure 9:
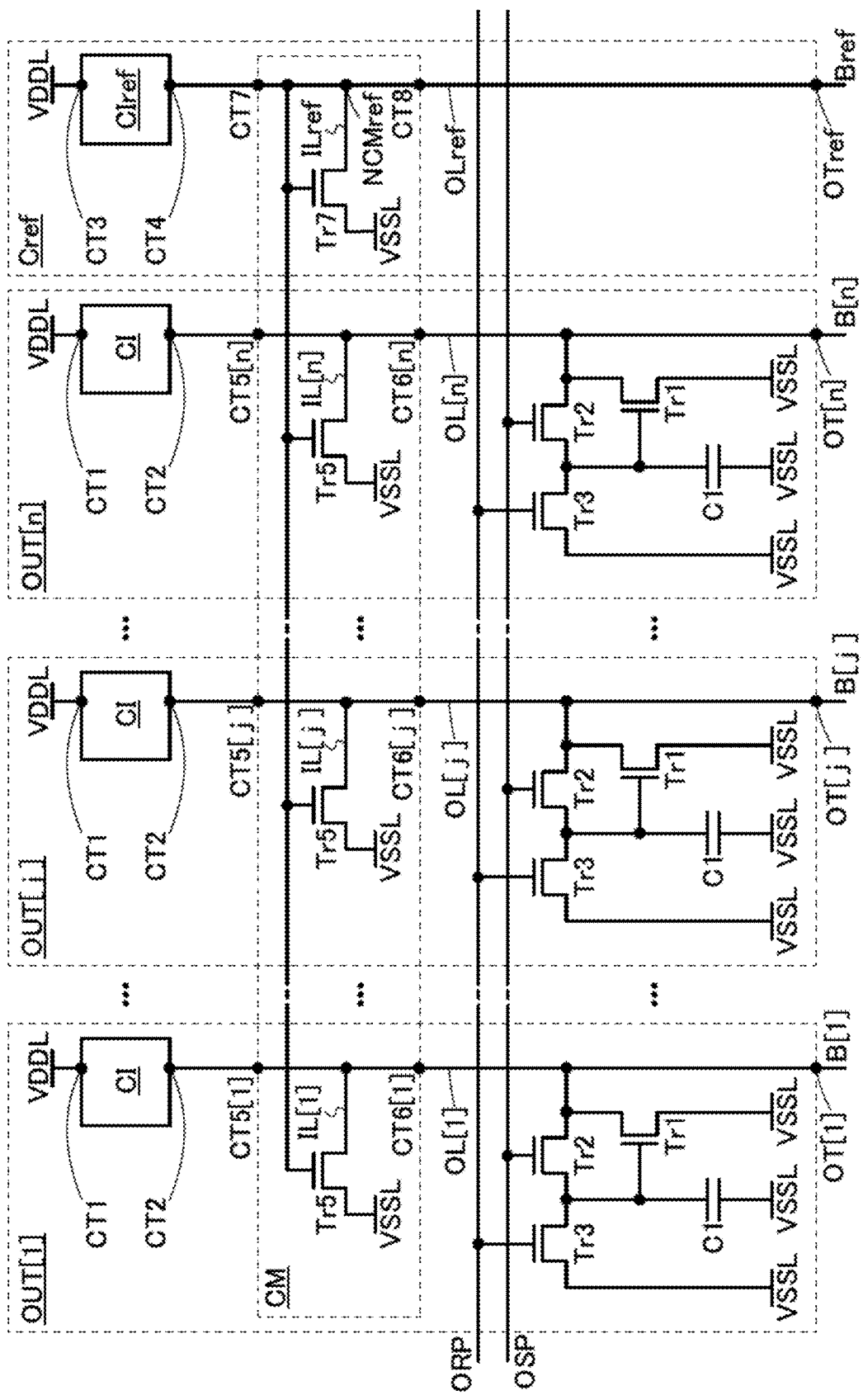
FIG. 9 is a circuit diagram illustrating an example of an offset circuit in the semiconductor device of FIG. 1.

An offset circuit 113 illustrated in FIG. 9 is a circuit diagram of an internal structure example of the current mirror circuit CM included in the offset circuit 111 illustrated in FIG. 2.

In the current mirror circuit CM, each of the column output circuits OUT[1] to OUT[n] includes a transistor Tr5, and the reference column output circuit $C_{ref}$ includes a transistor Tr7.

A first terminal of the transistor Tr5 in the column output circuit OUT[j] is electrically connected to the terminal CT5[j] and the terminal CT6[j] of the current mirror circuit CM. A second terminal of the transistor Tr5 in the column output circuit OUT[j] is electrically connected to the wiring VSSL. A gate of the transistor Tr5 in the column output circuit OUT[j] is electrically connected to the terminal CT7 and the terminal CT8 in the current mirror circuit CM.

A first terminal of the transistor Tr7 in the reference column output circuit $C_{ref}$ is electrically connected to the terminal CT7 and the terminal CT8 of the current mirror circuit CM. A second terminal of the transistor Tr7 in the reference column output circuit $C_{ref}$ is electrically connected to the wiring VSSL. A gate of the transistor Tr7 in the reference column output circuit $C_{ref}$ is electrically connected to the terminal CT7 and the terminal CT8 of the current mirror circuit CM.

In the offset circuit 113 illustrated in FIG. 9, only the following components are illustrated: the column output circuit OUT[1]; the column output circuit OUT[j]; the column output circuit OUT[n]; the reference column output circuit $C_{ref}$; the constant current circuit CI; the constant current circuit $CI_{ref}$; the current mirror circuit CM; the output terminal OT[1]; the output terminal OT[j]; the output terminal OT[n]; the output terminal $OT_{ref}$; the terminal CT1; the terminal CT2; the terminal CT3; the terminal CT4; the terminal CT5[1]; the terminal CT5[j]; the terminal CT5[n]; the terminal CT6[1]; the terminal CT6[j]; the terminal CT6[n]; the terminal CT7; the terminal CT8; the transistor Tr1; the transistor Tr2; the transistor Tr3; the transistor Tr5; the transistor Tr7; the capacitor C1; the wiring OL[1]; the wiring OL[j]; the wiring OL[n]; the wiring $OL_{ref}$; the wiring ORP; the wiring OSP; the wiring B[1]; the wiring B[j]; the wiring B[n]; the wiring Bra; the wiring IL[1]; the wiring IL[j]; the wiring IL[n]; the wiring $IL_{ref}$; the node $NCM_{ref}$; the wiring VDDL; and the wiring VSSL. Other circuits, wirings, elements, and reference numerals thereof are not illustrated.

<<Memory Cell Array 120>>

Figure 10:
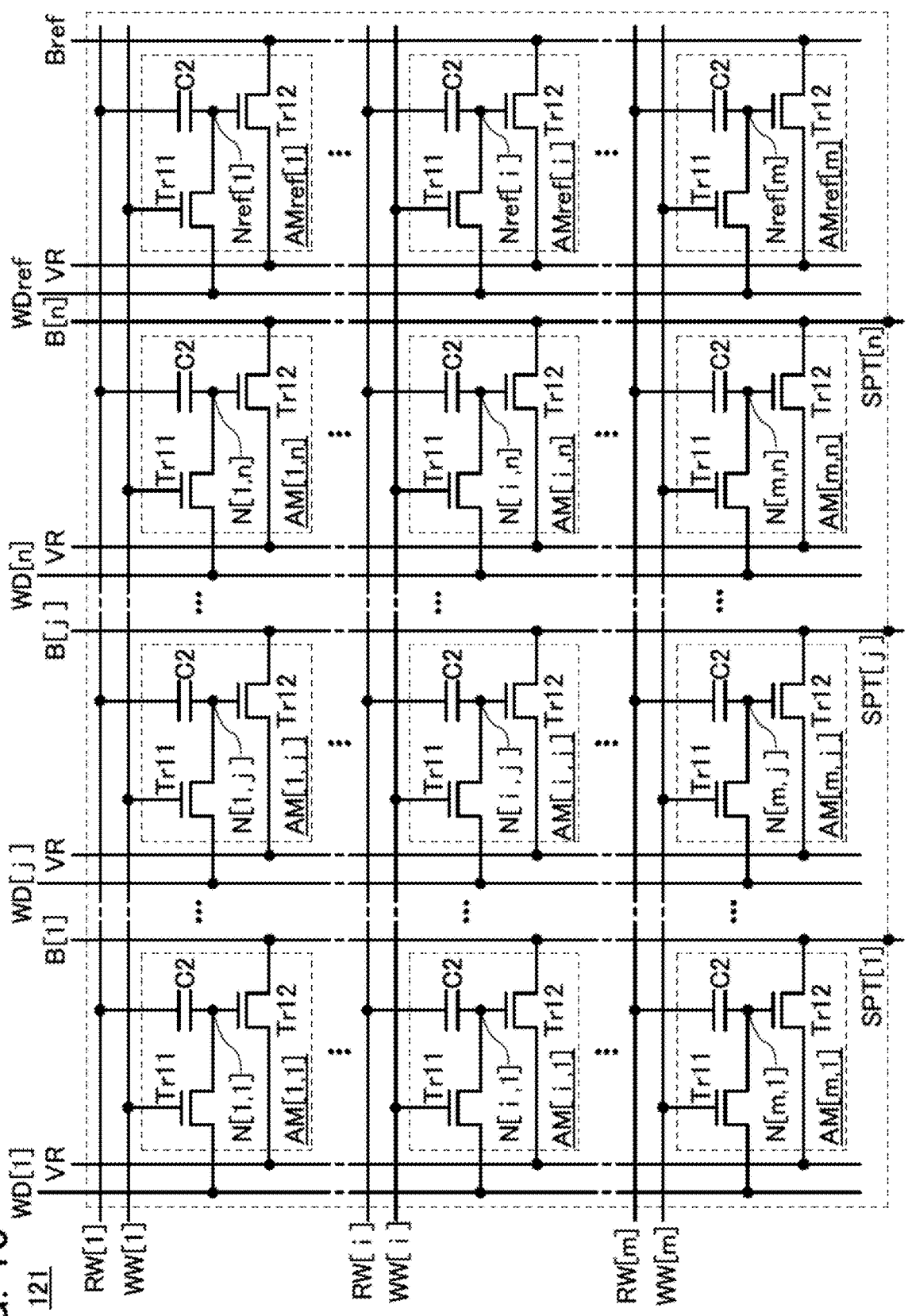
FIG. 10 is a circuit diagram illustrating an example of a memory cell array in the semiconductor device of FIG. 1.

Next, a circuit configuration example that can be employed in the memory cell array 120 will be described. FIG. 10 illustrates a memory cell array 121 as an example of the memory cell array 120.

The memory cell array 121 includes the memory cells AM and the memory cells $AM_{ref}$. Each of the memory cells AM included in the memory cell array 121 includes a transistor Tr11, a transistor Tr12, and a capacitor C2. The memory cells $AM_{ref}[1]$ to $AM_{ref}[m]$ each include the transistor Tr11, the transistor Tr12, and the capacitor C2.

For the connection structure in the memory cell array 121, the explanation is made with a focus on the memory cell AM[i,j]. A first terminal of the transistor Tr11 is electrically connected to a gate of the transistor Tr12 and a first terminal of the capacitor C2. A second terminal of the transistor Tr11 is electrically connected to the wiring WD[j]. A gate of the transistor Tr11 is electrically connected to the wiring WW[i]. A first terminal of the transistor Tr12 is electrically connected to the wiring B[j], and a second terminal of the transistor Tr12 is electrically connected to the wiring VR. A second terminal of the capacitor C2 is electrically connected to the wiring RW[i].

In the memory cell AM[i,j], a connection portion of the first terminal of the transistor Tr11, the gate of the transistor Tr12, and the first terminal of the capacitor C2 is a node N[i,j]. In one embodiment of the present invention, a potential corresponding to the first analog data is retained at the node N[i,j].

Next, the explanation is made with a focus on the memory cell $AM_{ref}[i]$. The first terminal of the transistor Tr11 is electrically connected to the gate of the transistor Tr12 and the first terminal of the capacitor C2. A second terminal of the transistor Tr11 is electrically connected to the wiring $WD_{ref}$. A gate of the transistor Tr11 is electrically connected to the wiring WW[i]. A first terminal of the transistor Tr12 is electrically connected to the wiring $B_{ref}$. A second terminal of the transistor Tr12 is electrically connected to the wiring VR. A second terminal of the capacitor C2 is electrically connected to the wiring RW[i].

In the memory cell $AM_{ref}[i]$, a connection portion of the first terminal of the transistor Tr11, the gate of the transistor Tr12, and the first terminal of the capacitor C2 is a node $N_{ref}[i]$.

In the memory cell array 121 illustrated in FIG. 10, only the following components are illustrated: the memory cell AM[1,1]; the memory cell AM[i,1]; the memory cell AM[m,1]; the memory cell AM[1,j]; the memory cell AM[i,j]; the memory cell AM[m,j]; the memory cell AM[1,n]; the memory cell AM[i,n]; the memory cell AM[m,n]; the memory cell $AM_{ref}[1]$; the memory cell $AM_{ref}[i]$; the memory cell $AM_{ref}[m]$; the wiring RW[1]; the wiring RW[i]; the wiring RW[m]; the wiring WW[1]; the wiring WW[i]; the wiring WW[m]; the wiring WD[1]; the wiring WD[j]; the wiring WD[n]; the wiring $WD_{ref}$; the wiring B[1]; the wiring B[j]; the wiring B[n]; the wiring $B_{ref}$; the wiring VR; the output terminal SPT[1]; the output terminal SPT[j]; the output terminal SPT[n]; a node N[1,1]; a node N[i,1]; a node N[m,1]; a node N[1,j]; the node N[i,j]; a node N[m,j]; a node N[1,n]; a node N[i,n]; a node N[m,n]; a node $N_{ref}[1]$; the node $N_{ref}[i]$; a node $N_{ref}[m]$; the transistor Tr11; the transistor Tr12; and the capacitor C2. Other circuits, wirings, elements, and reference numerals thereof are not illustrated.

Note that each of the transistors Tr1 to Tr9, Tr11, and Tr12 is preferably an OS transistor. In addition, each channel formation region in the transistors Tr1 to Tr9, Tr11, and Tr12 preferably contains a metal oxide described in Embodiment 5. Specifically, for example, a metal oxide preferably contains at least one of indium, zinc, and the element M (the element M is aluminum, gallium, yttrium, or tin).

With use of the OS transistors as the transistors Tr1 to Tr9, Tr11, and Tr12, the leakage current of each of the transistors Tr1 to Tr9, Tr11, and Tr12 can be suppressed, which enables a product-sum operation circuit with high calculation accuracy to be achieved in some cases. In particular, with use of the OS transistor as the transistor Tr11, the amount of leakage current from a retention node to a writing word line can be extremely small when the transistor Tr11 is in an off state. In other words, frequencies of refresh operation at the retention node can be reduced; thus, power consumption of a semiconductor device can be reduced.

Furthermore, when all of the above-described transistors Tr1 to Tr9, Tr11, and Tr12 are OS transistors, a manufacturing process of the semiconductor device can be shortened. Thus, a time needed for manufacturing semiconductor devices can be shortened, and the number of devices manufactured in a certain time period can be increased.

Note that the transistors Tr1, the transistors Tr4 to Tr7, and the transistor Tr12 operate in a saturation region unless otherwise specified. In other words, the gate voltage, source voltage, and drain voltage of each of the transistor Tr1, the transistors Tr4 to Tr7, and the transistor Tr12 are appropriately biased so that the transistors operate in the saturation region. Note that even when the operations of the transistor Tr1, the transistors Tr4 to Tr7, and the transistor Tr12 are deviated from ideal operation in a saturation region, the gate voltage, source voltage, and drain voltage of each of the transistors are regarded as being appropriately biased as long as the accuracy of output data is within a desired range.

Depending on circumstances or conditions or as needed, the semiconductor device of one embodiment of the present invention may have a combined structure of the above structure examples.

Operation Example

An operation example of the semiconductor device 100 of one embodiment of the present invention will be described. Note that the semiconductor device 100 described in this operation example includes an offset circuit 150 illustrated in FIG. 11 as the offset circuit 110 and a memory cell array 160 illustrated in FIG. 13 as the memory cell array 120 of the semiconductor device 100.

Figure 11:
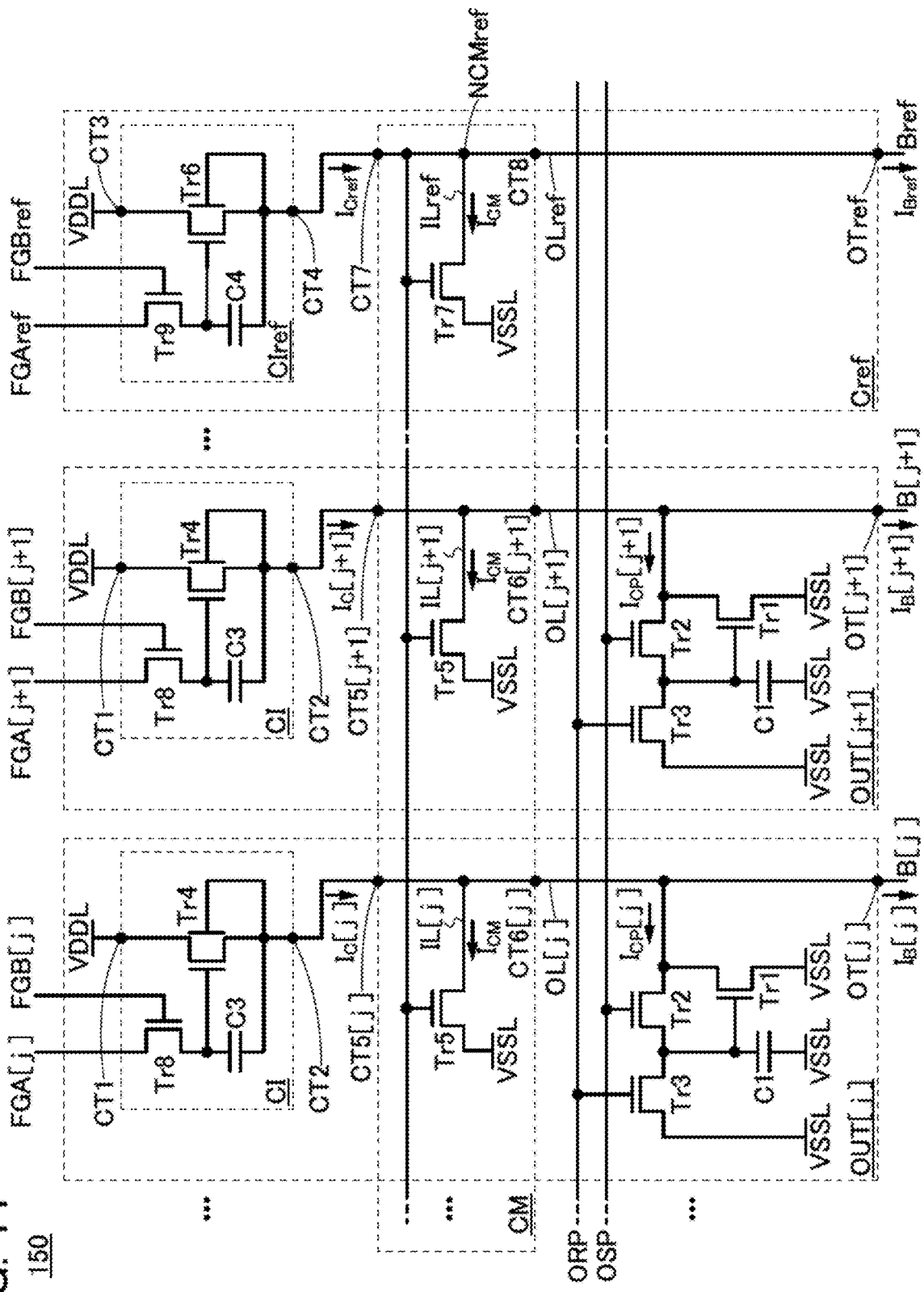
FIG. 11 is a circuit diagram illustrating an example of an offset circuit in the semiconductor device in FIG. 1.

The offset circuit 150 illustrated in FIG. 11 has a circuit configuration where the constant current circuit CI and the constant current circuit $CI_{ref}$ of the offset circuit 112 in FIG. 3 and the current mirror circuit CM of the offset circuit 113 in FIG. 9 are used. With use of the structure as illustrated in FIG. 11, all of the transistors in the offset circuit 150 can have the same polarity. For the description of this operation example, FIG. 11 illustrates the column output circuit OUT[j], a column output circuit OUT[j+1], and the reference column output circuit $C_{ref}$.

In FIG. 11, $I_C[j]$ denotes a current flowing from the terminal CT2 of the constant current circuit CI of the column output circuit OUT[j] to the terminal CT5[j] of the current mirror circuit CM, $I_C[j+1]$ denotes a current flowing from the terminal CT2 of the constant current circuit CI of the column output circuit OUT[j+1] to the terminal CT5[j+1] of the current mirror circuit CM, and $I_{Cref}$ denotes a current flowing from the terminal CT4 of the constant current circuit $CI_{ref}$ of the reference column output circuit $C_{ref}$ to the terminal CT7 of the current mirror circuit CM. In the current mirror circuit CM, $I_{CM}$ collectively denotes a current flowing to the first terminal of the transistor Tr5 through the wiring IL[j] in the column output circuit OUT[j], a current flowing to the first terminal of the transistor Tr5 through a wiring IL[j=1] in the column output circuit OUT[j+1], and a current flowing in the transistor Tr7 through the wiring $IL_{ref}$ in the reference column output circuit $C_{ref}$. In other words, a current $I_C[j]$-$I_{CM}$ flows through the terminal CT6[j] of the current mirror circuit CM in the column output circuit OUT[j] and a current $I_C[j+1]$-$I_{CM}$ flows through a terminal CT6[j+1] of the current mirror circuit CM in the column output circuit OUT[j+1]. Furthermore, $I_{CP}[j]$ denotes a current flowing from the wiring OL[j] to the first terminal of the transistor Tr1 or Tr2 in the column output circuit OUT[j], and $I_{CP}[j+1]$ denotes a current flowing from a wiring OL[j+1] to the first terminal of the transistor Tr1 or Tr2 in the column output circuit OUT[j+1]. Moreover, $I_B[j]$ denotes a current output from the output terminal OT[j] of the column output circuit OUT[j] to the wiring B[j], $I_B[j+1]$ denotes a current output from an output terminal OT[j+1] of the column output circuit OUT[j+1] to a wiring B[j+1], and $I_{Bref}$ denotes a current output from the output terminal $OT_{ref}$ of the reference column output circuit $C_{ref}$ to the wiring $B_{ref}$. In this operation example, $I_C[j]$ output from the constant current circuit CI of the column output circuit OUT[j], $I_C[j+1]$ output from the constant current circuit CI of the column output circuit OUT[j+1], and $I_{Cref}$ output from the constant current circuit $CI_{ref}$ of the reference column output circuit $C_{ref}$ are each a sufficiently high current value so that $I_B[j]$, $I_B[j+1]$, and $I_{Bref}$ are each a current value that is constantly 0 or more.

Figure 12:
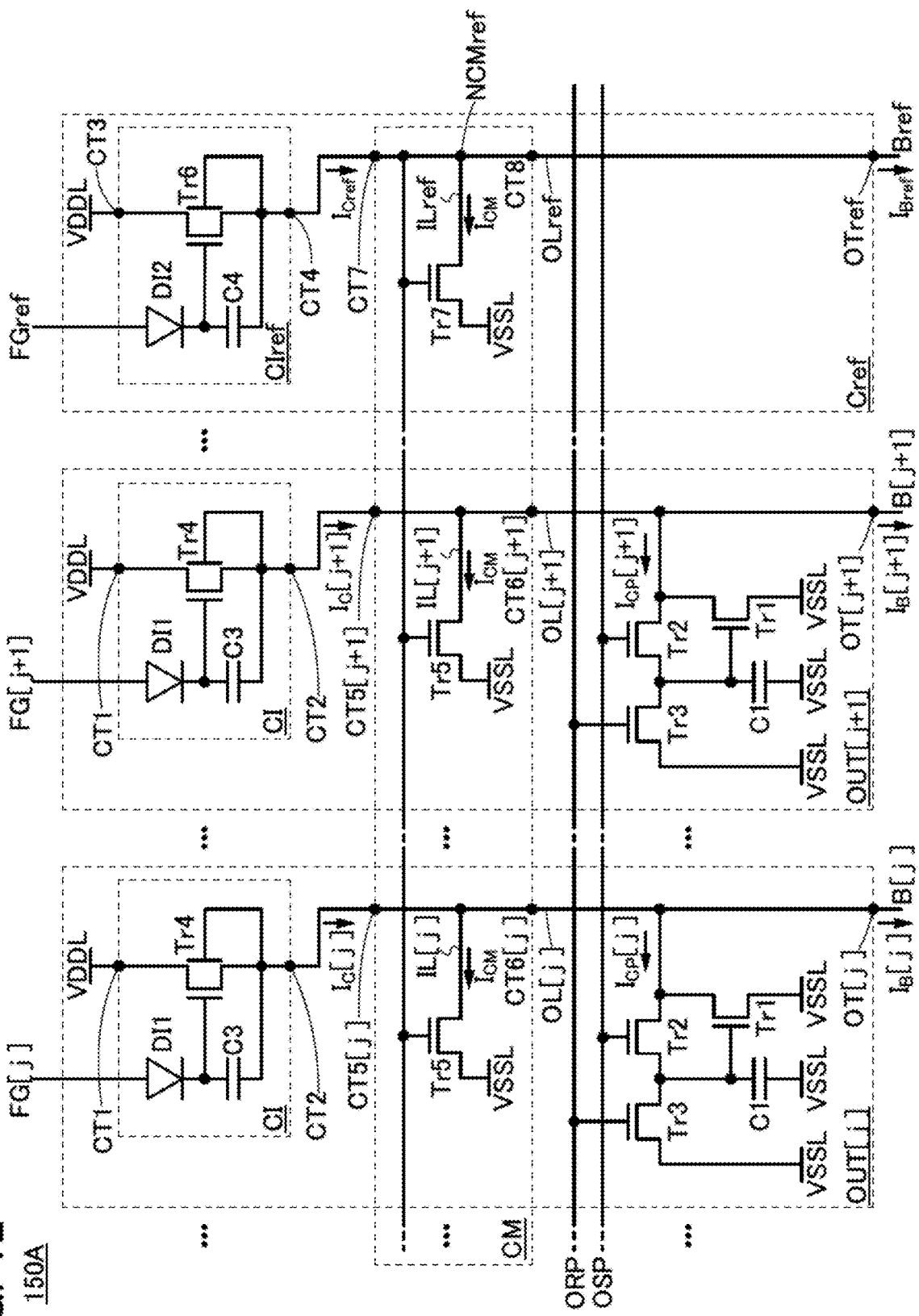
FIG. 12 is a circuit diagram illustrating an example of an offset circuit in the semiconductor device of FIG. 1.

Alternatively, the offset circuit 150 illustrated in FIG. 11 can be replaced with an offset circuit 150A illustrated in FIG. 12. The offset circuit 150A has a circuit configuration where the constant current circuit CI and the constant current circuit $CI_{ref}$ of the offset circuit 112A in FIG. 6 and the current mirror circuit CM of the offset circuit 113 in FIG. 9 are used. Since the offset circuit 150A has a configuration where the transistor Tr8 of the constant current circuit CI of the offset circuit 150 is replaced with the diode DI1 and the transistor Tr9 of the constant current circuit $CI_{ref}$ of the offset circuit 150 is replaced with the diode DI2, the offset circuit 150A can be considered as a substantially equivalent circuit of the offset circuit 150.

Figure 13:
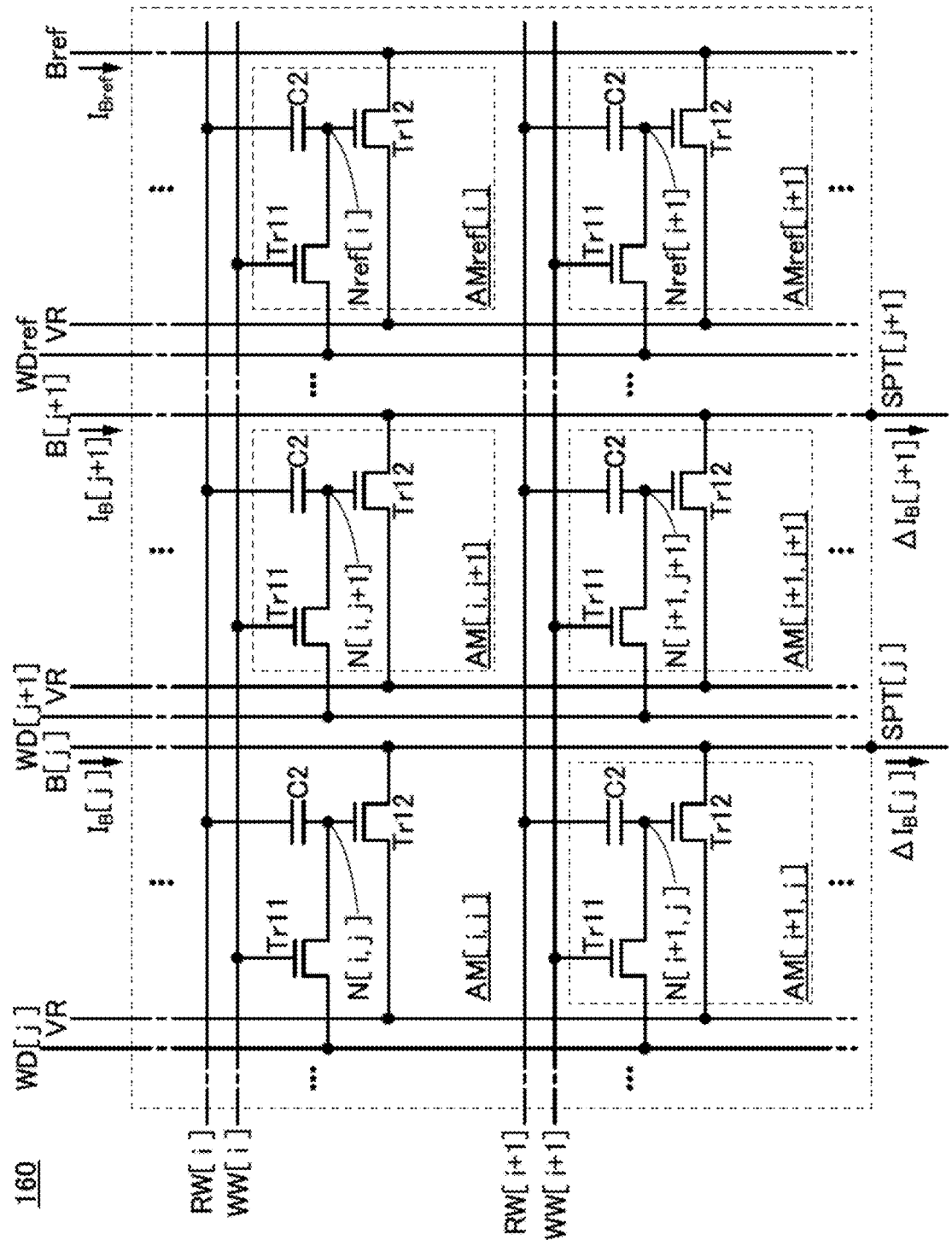
FIG. 13 is a circuit diagram illustrating an example of a memory cell array in the semiconductor device of FIG. 1.

The memory cell array 160 illustrated in FIG. 13 has a structure similar to that of the memory cell array 121 illustrated in FIG. 10. For the description of this operation example, FIG. 13 illustrates the memory cell AM[i,j], a memory cell AM[i+1,j], a memory cell AM[i,j+1], a memory cell AM[i+1,j+1], the memory cell $AM_{ref}$[i], and a memory cell $AM_{ref}$[i,j+1].

In FIG. 13, $I_B[j]$ denotes a current input from the wiring B[j], $I_B[j+1]$ denotes a current input from the wiring B[j+1], and $I_{Bref}$ denotes a current input from the wiring $B_{ref}$. In addition, $\Delta I_B[j]$ denotes a current output from the output terminal SPT[j] that is electrically connected to the wiring B[j], and $\Delta I_B[j+1]$ denotes a current output from an output terminal SPT[j+1] that is electrically connected to the wiring B[j+1].

Figure 14:
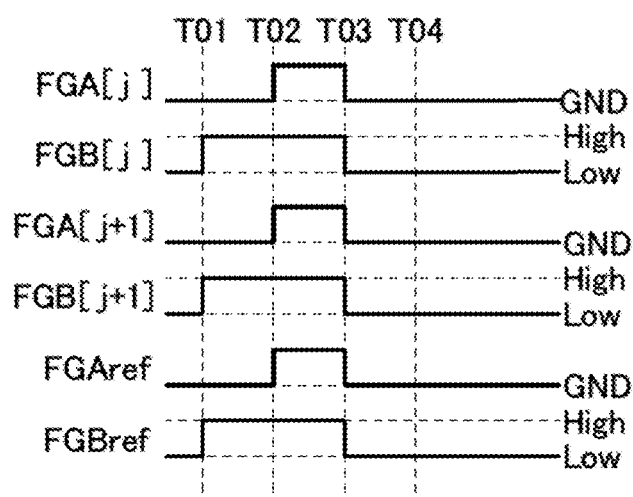
FIG. 14 is a timing chart showing an operation example of a semiconductor device.
Figure 15:
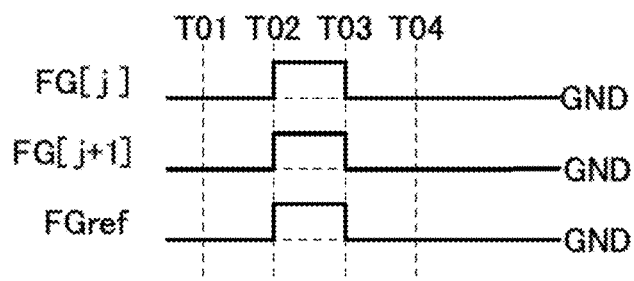
FIG. 15 is a timing chart showing an operation example of a semiconductor device.
Figure 16:
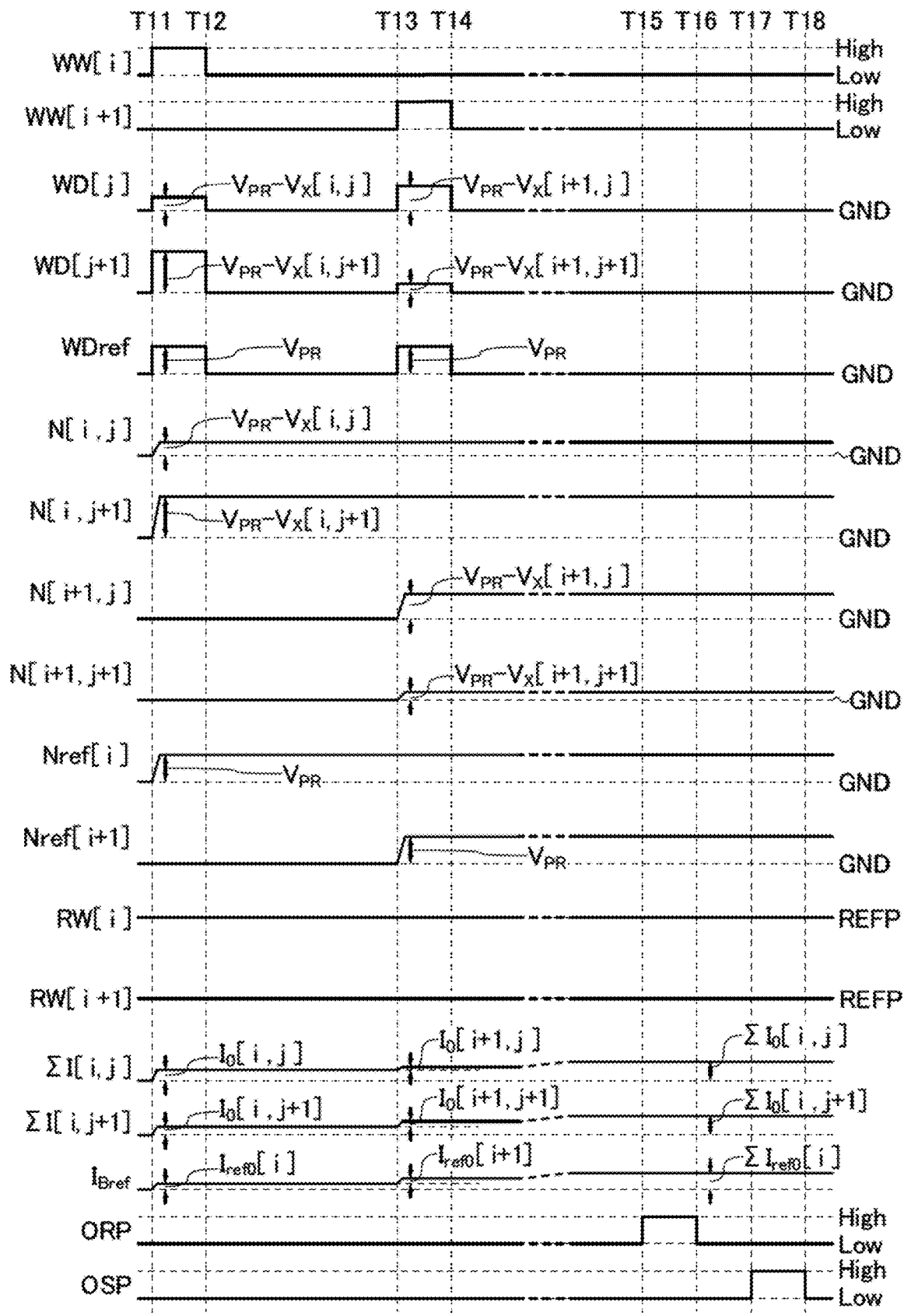
FIG. 16 is a timing chart showing an operation example of a semiconductor device.
Figure 17:
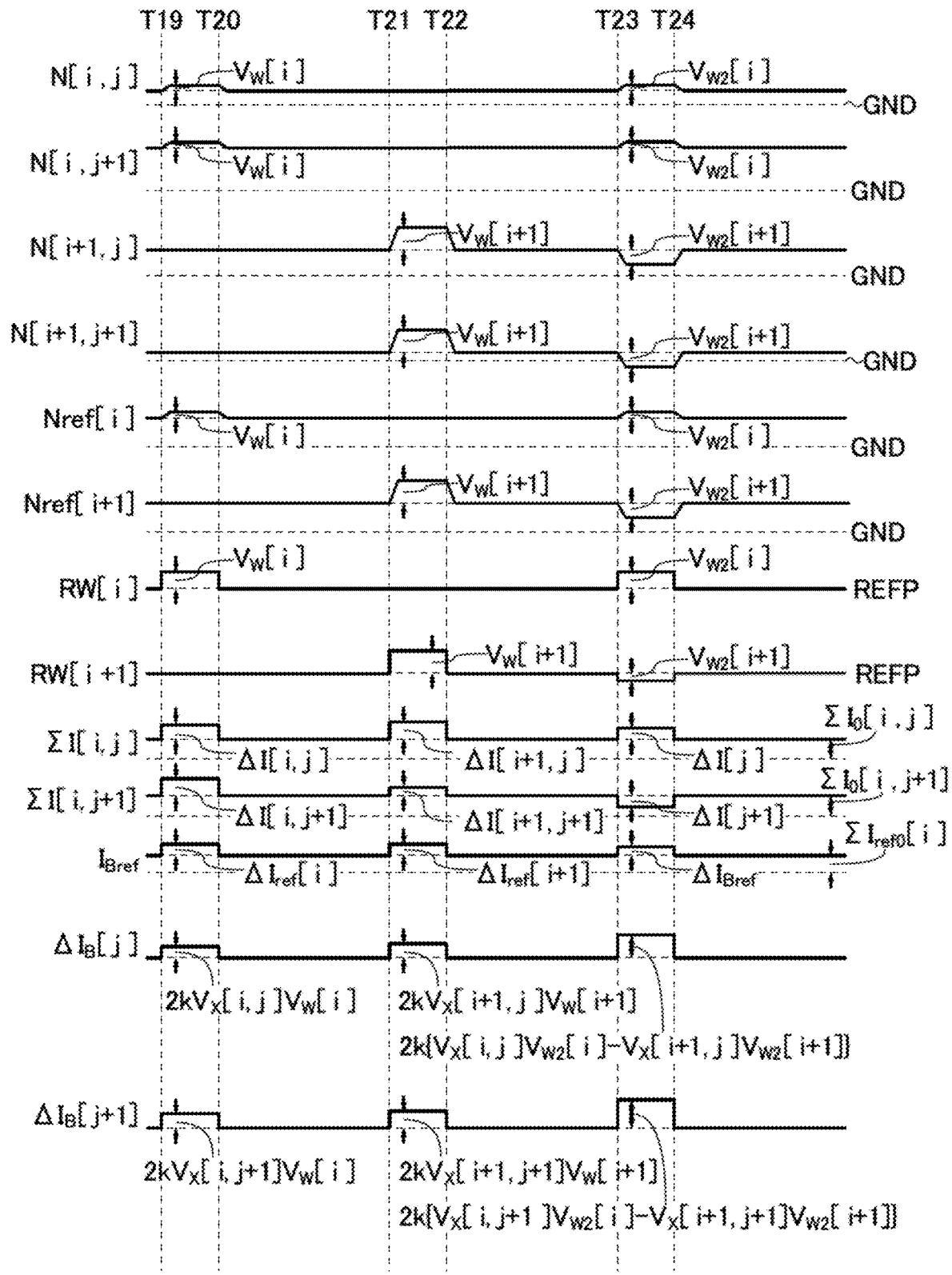
FIG. 17 is a timing chart showing an operation example of a semiconductor device.

FIG. 14 to FIG. 17 are timing charts showing the operation example of the semiconductor device 100 including the offset circuit 150 and the memory cell array 160. The timing chart of FIG. 14 shows changes in the potentials of the wiring FGA[j], the wiring FGB[j], a wiring FGA[j+1], a wiring FGB[j+1], the wiring $FGA_{ref}$, and the wiring $FGB_{ref}$ from Time T01 to Time T04. The timing chart of FIG. 16 shows changes in the potentials of the wiring WW[i], a wiring WW[i+1], the wiring WD[j], a wiring WD[j+1], the wiring $WD_{ref}$, the node N[i,j], a node N[i,j+1], a node N[i+1,j], a node N[i+1,j+1], the node $N_{ref}$[i], a node $N_{ref}$[i+1], the wiring RW[i], a wiring RW[i+1], the wiring OSP, and the wiring ORP from Time T11 to Time T18. This timing chart also shows the amount of changes in a current $\Sigma I[i,j]$, a current $\Sigma I[i,j+1]$, and a current $I_{Bref}$ from Time T11 to Time T18. Note that the current $\Sigma I[i,j]$ is a value of current flowing in the transistor Tr12 in the memory cell AM[i,j], which is obtained by summing over i from 1 to m, and the current $\Sigma I[i,j+1]$ is the sum of the amounts of a value of current flowing in the transistor Tr12 in the memory cell AM[i,j+1], which is obtained by summing over i from 1 to m. The operation example from Time T19 to Time T24 is shown in FIG. 17 as the rest of the operation shown in the timing chart of FIG. 16. At and after Time T19, the potentials of the wiring WW[i], the wiring WW[i+1], the wiring ORP, and the wiring OSP are kept at a low level without any change, and potentials of the wiring WD[j], the wiring WD[j+1], and the wiring WD$_{ref}$ are kept at a ground potential without any change. Thus, in the timing chart of FIG. 17, the changes in the potentials of the wiring WW[i], the wiring WW[i+1], the wiring WD[j], the wiring WD[j+1], the wiring WD$_{ref}$, the wiring ORP, and the wiring OSP are not shown. Furthermore, the timing chart of FIG. 17 shows variations in the amount of current $\Delta I_B[j]$ and the amount of current $\Delta I_B[j+1]$ described later.

<<Period from Time T01 to Time T03>>

During a period from Time T01 to Time T03, a high-level potential (denoted by High in FIG. 14) is supplied to the wiring FGB[j], the wiring FGB[j+1], and the wiring FGB$_{ref}$. At this time, a high-level potential is supplied to the gate of the transistor Tr8 of each of the constant current circuits CI in the column output circuits OUT[j] and OUT[j+1], so that the transistors Tr8 are turned on. Furthermore, a high-level potential is supplied to the gate of the transistor Tr9 of the constant current circuit CI$_{ref}$ in the reference column output circuit C$_{ref}$, so that the transistor Tr9 is turned on.

At Time T01, a GND potential is applied to each of the wiring FGA[j], the wiring FGA[j+1], and the wiring FGA$_{ref}$ as a ground potential.

At Time T02, a predetermined potential is supplied to each of the wiring FGA[j], the wiring FGA[j+1], and the wiring FGA$_{ref}$. At this time, the transistor Tr8 of the constant current circuit CI of each of the column output circuit OUT[j] and OUT[j+1] is in an on state; therefore, the potential of the wiring FGA[j] and the potential of the wiring FGA[j+1] are applied to the gate of the transistor Tr4 of the constant current circuit CI of the column output circuit OUT[j] and the gate of the transistor Tr4 of the constant current circuit CI of the column output circuit OUT[j+1], respectively. Furthermore, the transistor Tr9 of the constant current circuit CI$_{ref}$ of the reference column output circuit C$_{ref}$ is in an on state; therefore, the potential of the wiring FGA$_{ref}$ is applied to the gate of the transistor Tr6 of the constant current circuit CI$_{ref}$ of the reference column output circuit C$_{ref}$.

<<Period from Time T03 to Time T04>>

During a period from Time T03 to Time T04, a low-level potential (denoted by Low in FIG. 14) is supplied to the wiring FGB[j], the wiring FGB[j+1], and the wiring FGB$_{ref}$. At this time, a low-level potential is supplied to the gate of the transistor Tr8 of each of the constant current circuits CI in the column output circuits OUT[j] and OUT[j+1], so that the transistors Tr8 are turned off. Furthermore, a low-level potential is supplied to the gate of the transistor Tr9 of the constant current circuit CI$_{ref}$ in the reference column output circuit C$_{ref}$, so that the transistor Tr9 is turned off.

At this time, the potential of the gate of the transistor Tr4 of the constant current circuit CI of the column output circuit OUT[j] is retained by the capacitor C3 of the constant current circuit CI of the column output circuit OUT[j] and the potential of the gate of the transistor Tr4 of the constant current circuit CI of the column output circuit OUT[j+1] is retained by the capacitor C3 of the constant current circuit CI of the column output circuit OUT[j+1]. Similarly, the potential of the gate of the transistor Tr6 of the constant current circuit CI$_{ref}$ of the reference column output circuit C$_{ref}$ is retained by the capacitor C4 of the constant current circuit CI$_{ref}$ of the reference column output circuit C$_{ref}$.

Through the operation in the period from Time T01 to Time T04, operating points of the constant current circuit CI and the constant current circuit CI$_{ref}$ of the offset circuit 150 can be set.

FIG. 15 shows an operation example of the semiconductor device 100 including the offset circuit 150A and the memory cell array 160.

At Time T01, a GND potential is applied to each of the wiring FG[j], a wiring FG[j+1], and the wiring FG$_{ref}$ as a ground potential.

At Time T02, a predetermined potential is supplied to each of the wiring FG[j], the wiring FG[j+1], and the wiring FG$_{ref}$. At this time, the potential of the wiring FG[j] and the potential of the wiring FG[j+1] are applied to the gate of the transistor Tr4 of the constant current circuit CI of the column output circuit OUT[j] and the gate of the transistor Tr4 of the constant current circuit CI of the column output circuit OUT[j+1], respectively. Furthermore, the potential of the wiring FG$_{ref}$ is applied to the gate of the transistor Tr6 of the constant current circuit CI$_{ref}$ of the reference column output circuit C$_{ref}$.

At Time T03, the GND potential is applied to each of the wiring FG[j], the wiring FG[j+1], and the wiring FG$_{ref}$. At this time, since the diode DI1 of the constant current circuit CI of the column output circuit OUT[j] has a rectifying function, the potential of the gate of the transistor Tr4 of the constant current circuit CI of the column output circuit OUT[j] is retained in the capacitor C3 of the constant current circuit CI of the column output circuit OUT[j] and the potential of the gate of the transistor Tr4 of the constant current circuit CI of the column output circuit OUT[j+1] is retained in the capacitor C3 of the constant current circuit CI of the column output circuit OUT[j+1]. Similarly, since the diode DI2 of the constant current circuit CI$_{ref}$ of the reference column output circuit C$_{ref}$ has a rectifying function, the potential of the gate of the transistor Tr6 of the constant current circuit CI$_{ref}$ of the reference column output circuit C$_{ref}$ is retained in the capacitor C4 of the constant current circuit CI$_{ref}$ of the reference column output circuit C$_{ref}$.

Through the operation in the period from Time T01 to Time T04, operating points of the constant current circuit CI and the constant current circuit CI$_{ref}$ of the offset circuit 150A can be set.

<<Period from Time T11 to Time T12>>

During a period from Time T11 to Time T12, a high-level potential (denoted by High in FIG. 16) is applied to the wiring WW[i], and a low-level potential (denoted by Low in FIG. 16) is applied to the wiring WW[i+1]. Furthermore, a potential higher than the ground potential (denoted by GND in FIG. 16) by $V_{PR}-V_X[i,j]$ is applied to the wiring WD[j], a potential higher than the ground potential by $V_{PR}-V_X[i,j+1]$ is applied to the wiring WD[j+1], and a potential higher than the ground potential by $V_{PR}$ is applied to the wiring WD$_{ref}$. Moreover, a reference potential (denoted by REFP in FIG. 16) is applied to each of the wiring RW[i] and the wiring RW[i+1].

The potential $V_X[i,j]$ and the potential $V_X[i,j+1]$ each correspond to the first analog data. The potential $V_{PR}$ corresponds to the reference analog data.

In this period, a high-level potential is applied to the gates of the transistors Tr11 in the memory cell AM[i,j], the memory cell AM[i,j+1], and the memory cell AM$_{ref}$[i]; accordingly, the transistors Tr11 in the memory cell AM[i,j], the memory cell AM[i,j+1], and the memory cell AM$_{ref}$[i] are turned on. Thus, in the memory cell AM[i,j], the wiring WD[j] and the node N[i,j] are electrically connected to each other, and the potential of the node N[i,j] is $V_{PR}-V_X[i,j]$.

Similarly, in the memory cell AM[i,j+1], the wiring WD[j+1] and the node N[i,j+1] are electrically connected to each other, and the potential of the node N[i,j+1] is $V_{PR}-V_X[i,j+1]$. In the memory cell AM$_{ref}$[i], the wiring WD$_{ref}$ and the node N$_{ref}$[i] are electrically connected to each other, and the potential of the node N$_{ref}$[i] is $V_{PR}$.

A current flowing from the first to second terminal of the transistor Tr12 in each of the memory cell AM[i,j], the memory cell AM[i,j+1], and the memory cell AM$_{ref}$[i] is considered. A current $I_0[i,j]$ flowing from the wiring B[j] to the second terminal through the first terminal of the transistor Tr12 in the memory cell AM[i,j] can be expressed by the following formula.

[Formula 1]

$$I_0[i,j]=k(V_{PR}-V_X[i,j]-V_{th})^2 \quad \text{(E1)}$$

In the formula, k is a constant determined by the channel length, the channel width, the mobility, the capacitance of a gate insulating film, and the like of the transistor Tr12. Furthermore, $V_{th}$ is a threshold voltage of the transistor Tr12.

At this time, the current flowing from the output terminal OT[j] of the column output circuit OUT[j] to the wiring B[j] is $I_0[i,j]$.

A current $I_0[i,j+1]$ flowing from the wiring B[j+1] to the second terminal through the first terminal of the transistor Tr12 in the memory cell AM[i,j+1] can be expressed by the following formula.

$$I_0[i,j+1]=k(V_{PR}-V_X[i,j+1]-V_{th})^2 \quad \text{[Formula 2]}$$

At this time, the current flowing from the output terminal OT[j+1] of the column output circuit OUT[j+1] to the wiring B[j+1] is $I_0[i,j+1]$.

A current $I_{ref0}[i]$ flowing from the wiring B$_{ref}$ to the second terminal through the first terminal of the transistor Tr12 in the memory cell AM$_{ref}$[i] can be expressed by the following formula.

[Formula 3]

$$I_{ref0}[i]=k(V_{PR}-V_{th})^2 \quad \text{(E2)}$$

At this time, the current flowing from the output terminal OT$_{ref}$ of the reference column output circuit C$_{ref}$ to the wiring B$_{ref}$ is $I_{ref0}[i]$.

Note that since a low-level potential is applied to the gates of the transistors Tr11 in the memory cell AM[i+1,j], the memory cell AM[i+1,j+1], and the memory cell AM$_{ref}$[i+1], the transistors Tr11 in the memory cell AM[i+1,j], the memory cell AM[i+1,j+1], the memory cell AM$_{ref}$[i+1] are turned off. Thus, the potentials are not retained at the node N[i+1,j], the node N[i+1,j+1], and the node N$_{ref}$[i+1].

<<Period from Time T12 to Time T13>>

During a period from Time T12 to Time T13, a low-level potential is applied to the wiring WW[i]. At this time, the low-level potential is applied to the gates of the transistors Tr11 in the memory cell AM[i,j], the memory cell AM[i,j+1], and the memory cell AM$_{ref}$[i], and accordingly, the transistors Tr11 in the memory cell AM[i,j], the memory cell AM[i,j+1], and the memory cell AM$_{ref}$[i] are turned off.

The low-level potential has been applied to the wiring WW[i+1] continuously since before Time T02. Thus, the transistors Tr11 in the memory cell AM[i+1,j], the memory cell AM[i+1,j+1], and the memory cell AM$_{ref}$[i+1] have been kept in an off state since before Time T02.

Since the transistors Tr11 in the memory cell AM[i,j], the memory cell AM[i,j+1], the memory cell AM[i+1,j], the memory cell AM[i+1,j+1], the memory cell AM$_{ref}$[i], and the memory cell AM$_{ref}$[i+1] are each in an off state as described above, the potentials at the node N[i,j], the node N[i,j+1], the node N[i+1,j], the node N[i+1,j+1], the node N$_{ref}$[i], and the node N$_{ref}$[i+1] are retained in a period from Time T02 to Time T03.

In particular, when an OS transistor is used as each of the transistors Tr11 in the memory cell AM[i,j], the memory cell AM[i,j+1], the memory cell AM[i+1,j], the memory cell AM[i+1,j+1], the memory cell AM$_{ref}$[i] and the memory cell AM$_{ref}$[i+1] as described in the description of the circuit configuration of the semiconductor device 100, the amount of leakage current flowing between the sources and the drains of the transistors Tr11 can be made small, which makes it possible to retain the potentials at the nodes for a long time.

During the period from Time T12 to Time T13, the ground potential is applied to the wiring WD[j], the wiring WD[j+1], and the wiring WD$_{ref}$. Since the transistors Tr11 in the memory cell AM[i,j], the memory cell AM[i,j+1], the memory cell AM[i+1,j], the memory cell AM[i+1,j+1], the memory cell AM$_{ref}$[i], and the memory cell AM$_{ref}$[i+1] are each in an off state, the potentials retained at the nodes in the memory cell AM[i,j], the memory cell AM[i,j+1], the memory cell AM[i+1,j], the memory cell AM[i+1,j+1], the memory cell AM$_{ref}$[i], and the memory cell AM$_{ref}$[i+1] are not rewritten by application of potentials from the wiring WD[j], the wiring WD[j+1], and the wiring WD$_{ref}$.

<<Period from Time T13 to Time T14>>

During a period from Time T13 to Time T14, a low-level potential is applied to the wiring WW[i], and a high-level potential is applied to the wiring WW[i+1]. Furthermore, the potential higher than the ground potential by $V_{PR}-V_X[i+1,j]$ is applied to the wiring WD[j], the potential higher than the ground potential by $V_{PR}-V_X[i+1,j+1]$ is applied to the wiring WD[j+1], and the potential higher than the ground potential by $V_{PR}$ is applied to the wiring WD$_{ref}$. Moreover, the reference potential is continuously being applied to the wiring RW[i] and the wiring RW[i+1] continuously since Time T12.

Note that the potential $V_X[i+1,j]$ and the potential $V_X[i+1,j+1]$ are each a potential corresponding to the first analog data.

In this period, the high-level potential is applied to the gates of the transistors Tr11 in the memory cell AM[i+1,j], the memory cell AM[i+1,j+1], and the memory cell AM$_{ref}$[i+1], and accordingly, the transistors Tr11 in the memory cell AM[i+1,j], the memory cell AM[i+1,j+1], and the memory cell AM$_{ref}$[i+1] are each brought into an on state. Thus, in the memory cell AM[i+1,j], the node N[i+1,j] and the wiring WD[j] are electrically connected to each other, and the potential of the node N[i+1,j] becomes $V_{PR}-V_X[i+1,j]$. Similarly, in the memory cell AM[i+1,j+1], the wiring WD[j+1] and the node N[i+1,j+1] are electrically connected to each other, and the potential of the node N[i+1,j+1] becomes $V_{PR}-V_X[i+1,j+1]$. In the memory cell AM$_{ref}$[i+1], the wiring WD$_{ref}$ and the node N$_{ref}$[i+1] are electrically connected to each other, and the potential of the node N$_{ref}$[i+1] becomes $V_{PR}$.

A current flowing from the first to second terminal of the transistor Tr12 in each of the memory cell AM[i+1,j], the memory cell AM[i+1,j+1], and the memory cell AM$_{ref}$[i+1] is considered. The current $I_0[i+1,j]$ flowing from the wiring B[j] to the second terminal through the first terminal of the transistor Tr12 in the memory cell AM[i+1,j] can be expressed by the following formula.

$$I_0[i+1,j]=k(V_{PR}-V_X[i+1,j]-V_{th})^2 \quad \text{[Formula 4]}$$

At this time, the current flowing from the output terminal OT[j] of the column output circuit OUT[j] to the wiring B[j] is $I_0[i,j]+I_0[i+1,j]$.

The current $I_0[i+1,j+1]$ flowing from the wiring B[j+1] to the second terminal through the first terminal of the transistor Tr12 in the memory cell AM[i+1,j+1] can be expressed by the following formula.

$$I_0[i+1,j+1]=k(V_{PR}-V_X[i+1,j+1]-V_{th})^2 \quad \text{[Formula 5]}$$

At this time, the current flowing from the output terminal OT[j+1] of the column output circuit OUT[j+1] to the wiring B[j+1] is $I_0[i,j+1]+I_0[i+1,j+1]$.

The current $I_{ref0}[i+1]$ flowing from the wiring $B_{ref}$ to the second terminal through the first terminal of the transistor Tr12 in the memory cell $AM_{ref}[i+1]$ can be expressed by the following formula.

$$I_{ref0}[i+1]=k(V_{PR}-V_{th})^2 \quad \text{[Formula 6]}$$

At this time, the current flowing from the output terminal $OT_{ref}$ of the reference column output circuit $C_{ref}$ to the wiring $B_{ref}$ is $I_{ref0}[i]+I_{ref0}[i+1]$.

<<Period from Time T14 to Time T15>>

During a period from Time T14 to Time T15, the potential corresponding to the first analog data is written to the rest of the memory cells AM, and the potential $V_{PR}$ is written to the rest of memory cells $AM_{ref}$, in a manner similar to that of the operation during the period from Time T11 to Time T12 and that of the operation during the period from Time T13 to Time T14. Thus, the total amount of currents flowing in the transistors Tr12 in all of the memory cells AM corresponds to the amount of current flowing from the output terminal OT[j] of the column output circuit OUT[j] to the wiring B[j] which is denoted by $\Sigma I_0[i,j]$ ($\Sigma$ represents the current obtained by summing over i from 1 to m).

Here, the reference column output circuit $C_{ref}$ is focused on. The total amount of current flowing through the transistors Tr12 in the memory cells $AM_{ref}[1]$ to $AM_{ref}[m]$ flows into the wiring $B_{ref}$ of the reference column output circuit $C_{ref}$. In other words, the current $I_{Bref}=\Sigma I_{ref0}[i]$ ($\Sigma$ represents the current obtained by summing over i from 1 to m) flows into the wiring $B_{ref}$.

Although the current flowing in the wiring $IL_{ref}$ is denoted by $I_{CM}$ in FIG. 11, the current flowing in the wiring $IL_{ref}$ before Time T09 is denoted by $I_{CM0}$ in this specification.

The current $I_{Cref}$ is output from the terminal CT4 of the constant current circuit $CI_{ref}$. Thus, $I_{CM0}$ is determined by setting the potential of the gate of the transistor Tr7 (potential of the node $NCM_{ref}$) so that the following formula is satisfied.

[Formula 7]

$$I_{Cref} - I_{CM0} = \sum_i I_{ref0}[i] \quad \text{(E3)}$$

Note that since the potential of the gate of the transistor Tr7 (potential of the node $NCM_{ref}$) is used as a reference in the current mirror circuit CM, the current $I_{CM0}$ also flows in the wirings IL[1] to IL[n] of the column output circuits OUT[1] to OUT[n].

<<Period from Time T15 to Time T16>>

During a period from Time T15 to Time T16, the wiring ORP is set at the high-level potential. At this time, the high-level potential is applied to each of the gates of the transistors Tr3 in the column output circuits OUT[1] to OUT[n], so that the transistors Tr3 are brought into an on state. Concurrently, the low-level potential is applied to each of the first terminals of the capacitors C1 in the column output circuits OUT[1] to OUT[n], and thus the potentials of the capacitors C1 are initialized. When Time T16 starts, the low-level potential is applied to the wiring ORP, so that the transistors Tr3 in the column output circuits OUT[1] to OUT[n] are brought into an off state.

<<Period from Time T16 to Time T17>>

During a period from Time T16 to Time T17, the wiring ORP is set at the low-level potential. In the above manner, the low-level potential is applied to the gates of the transistors Tr3 in the column output circuits OUT[1] to OUT[n], so that the transistors Tr3 are brought into an off state.

<<Period from Time T17 to Time T18>>

During a period from Time T17 to Time T18, the wiring OSP is set at the high-level potential. In the above manner, the high-level potential is applied to each of the gates of the transistors Tr2 in the column output circuits OUT[1] to OUT[n], so that the transistors Tr2 are brought into an on state. At this time, the current flows into the first terminals of the capacitors C1 from the first terminals of the transistors Tr2 through the second terminals of the transistors Tr2, and the potentials are retained in the capacitors C1. Thus, the potentials of the gates of the transistors Tr1 are retained, so that the current corresponding to the potentials of the gates of the transistors Tr1 flows between the sources and the drains of the transistors Tr1.

When Time T18 starts, the low-level potential is applied to the wiring OSP, so that the transistors Tr2 in the column output circuits OUT[1] to OUT[n] are brought into an off state. The potentials of the gates of the transistors Tr1 are retained in the capacitors C1, so that even after Time T18, the same amount of current keeps flowing between the sources and the drains of the transistors Tr1.

Here, the column output circuit OUT[j] is focused on. In the column output circuit OUT[j], the current flowing between the source and the drain of the transistor Tr1 is denoted by $I_{CP}[j]$, and the current flowing between the source and the drain of the transistor Tr4 of the constant current circuit CI is denoted by $I_C[j]$. The current flowing between the source and the drain of the transistor Tr5 through the current mirror circuit CM is $I_{CM0}$. On the assumption that the current is not output from the output terminal SPT[j] from Time T11 to Time T18, the sum of the amounts of current flowing through each of the transistors Tr12 in the memory cells AM[1] to AM[n] flows in the wiring B[j] of the column output circuit OUT[j]. In other words, the current $\Sigma I_0[i,j]$ ($\Sigma$ represents the current obtained by summing over i from 1 to m) flows in the wiring B[j]. Thus, the above satisfies the following formula.

[Formula 8]

$$I_C[j] - I_{CM0} - I_{CP}[j] = \sum_i I_0[i,j] \quad \text{(E4)}$$

<<Period from Time T19 to Time T20>>

The operation from Time T19 will be described with reference to FIG. 17. During a period from Time T19 to Time T20, a potential higher than the reference potential (denoted by REFP in FIG. 17) by $V_W[i]$ is applied to the wiring RW[i]. At this time, the potential $V_W[i]$ is applied to the second terminals of the capacitors C2 in the memory cells AM[i,1] to AM[i,n] and the memory cell $AM_{ref}[i]$, so that the potentials of the gates of the transistors Tr12 increase.

Note that the potential $V_W[i]$ is a potential corresponding to the second analog data.

An increase in the potential of the gate of the transistor Tr12 corresponds to the potential obtained by multiplying a change in the potential of the wiring RW[i] by a capacitive coupling coefficient determined by the memory cell structure. The capacitive coupling coefficient is calculated on the basis of the capacitance of the capacitor C2, the gate capacitance of the transistor Tr2, and the parasitic capacitance. In this operation example, to avoid complexity of description, an increase in the potential of the wiring RW[i] is equal to an increase in the potential of the gate of the transistor Tr12, which corresponds to a case where the capacitive coupling coefficient in each of the memory cells AM and the memory cell $AM_{ref}$ is set to 1.

When the potential $V_W[i]$ is applied to the second terminals of the capacitors C2 in the memory cell AM[i,j], the memory cell AM[i,j+1], and the memory cell $AM_{ref}[i]$ on the assumption that the capacitive coupling coefficient is 1, the potentials of the node N[i,j], the node N[i,j+1], and the node $N_{ref}[i]$ each increase by $V_W[i]$.

The current flowing from the first to second terminal of the transistor Tr12 in each of the memory cell AM[i,j], the memory cell AM[i,j+1], and the memory cell $AM_{ref}[i]$ will be described. The current I[i,j] flowing from the wiring B[j] to the second terminal through the first terminal of the transistor Tr12 in the memory cell AM[i,j] can be expressed by the following formula.

[Formula 9]

$$I[i,j] = k(V_{PR} - V_X[i,j] + V_W[i] - V_{th})^2 \quad (E5)$$

In other words, by application of the potential $V_W[i]$ to the wiring RW[i], the current flowing from the wiring B[j] to the second terminal through the first terminal of the transistor Tr12 in the memory cell AMP[i,j] increases by $I[i,j] - I_0[i,j]$ (denoted by $\Delta I[i,j]$ in FIG. 17).

The current I[i,j+1] flowing from the wiring B[j+1] to the second terminal through the first terminal of the transistor Tr12 in the memory cell AM[i,j+1] can be expressed by the following formula.

$$I[i,j+1] = k(V_{PR} - V_X[i,j+1] + V_W[i] - V_{th})^2 \quad \text{[Formula 10]}$$

In other words, by application of the potential $V_W[i]$ to the wiring RW[i], the current flowing from the wiring B[j+1] to the second terminal through the first terminal of the transistor Tr12 in the memory cell AM[i,j+1] increases by $I[i,j+1] - I_0[i,j+1]$ (denoted by $\Delta I[i,j+1]$ in FIG. 17).

Furthermore, the current $I_{ref}[i]$ flowing from the wiring $B_{ref}$ to the second terminal through the first terminal of the transistor Tr12 in the memory cell $AM_{ref}[i]$ can be expressed by the following formula.

[Formula 11]

$$I_{ref}[i] = k(V_{PR} + V_W[i] - V_{th})^2 \quad (E6)$$

In other words, by application of the potential $V_W[i]$ to the wiring RW[i], the current flowing from the wiring $B_{ref}$ to the second terminal through the first terminal of the transistor Tr12 in the memory cell $AM_{ref}[i]$ increases by $I_{ref}[i] - I_{ref0}[i]$ (denoted by $\Delta I_{ref}[i]$ in FIG. 17).

Here, the reference column output circuit $C_{ref}$ is focused on. The total amount of current flowing through the transistors Tr12 in the memory cells $AM_{ref}[1]$ to $AM_{ref}[m]$ flows into the wiring $B_{ref}$ of the reference column output circuit $C_{ref}$. In other words, the current $I_{Bref} = \Sigma I_{ref0}[i]$ flows into the wiring $B_{ref}$.

The current $I_{Cref}$ is output from the terminal CT4 in the constant current circuit $CI_{ref}$. Thus, $I_{CM}$ is determined by setting the potential of the gate of the transistor Tr7 (potential of the node $NCM_{ref}$) so that the following formula is satisfied.

[Formula 12]

$$I_{Cref} - I_{CM} - \sum_i I_{ref}[i] \quad (E7)$$

Here, the current $\Delta I_B[j]$ output from the wiring B[j] is focused on. From Time T18 to Time T19, Formula (E4) is satisfied, and the current $\Delta I_B[j]$ is not output from the wiring B[j].

During the period from Time T19 to Time T20, a potential higher than the reference potential by $V_W[i]$ is applied to the wiring RW[i], and the current flowing between the source and the drain of the transistor Tr12 in the memory cell AM[i,j] changes. Then, the current $\Delta I_B[j]$ is output from the output terminal SPT[j] that is electrically connected to the wiring B[j]. Specifically, in the column output circuit OUT [j], the current $I_C[j]$ is output from the terminal CT2 of the constant current circuit CI, the current $I_{CM}$ flows between the source and the drain of the transistor Try, and the current $I_{CP}[j]$ flows between the source and the drain of the transistor Tr1. Thus, the current $\Delta I_B[j]$ can be expressed by the following formula using $\Sigma I[i,j]$ where the current flowing between the source and the drain of the transistor Tr12 in the memory cell AM[i,j] is calculated by summing over i from 1 to m.

[Formula 13]

$$\Delta I_B[j] = (I_C[j] - I_{CM} - I_{CP}[j]) - \sum_i I[i, j] \quad (E8)$$

Formulae (E1) to (E7) are applied to Formula (E8), so that the following formula can be obtained.

[Formula 14]

$$\Delta I_B[j] = 2k \sum_i (V_X[i, j] V_W[i]) \quad (E9)$$

According to Formula (E9), the current $\Delta I_B[j]$ is a value corresponding to the sum of products of the potential $V_X[i,j]$ that is the first analog data and the potential $V_W[i]$ that is the second analog data. Thus, when the current $\Delta I_B[j]$ is calculated, the value of the sum of products of the first analog data and the second analog data can be obtained.

During the period from Time T19 to Time T20, when all of the wirings RW[1] to RW[m] except the wiring RW[i] are set to have a reference potential, the relation, $V_W[g]=0$ (here, g is an integer that is greater than or equal to 1 and less than or equal to m and not i), is satisfied. Thus, according to Formula (E9), $\Delta I_B[j]=2 kV_X[i,j]V_W[i]$ is output. In other words, the data corresponding to the product of the first analog data stored in the memory cell AM[i,j] and the second analog data corresponding to a selection signal supplied to the wiring RW[i] is output from the output terminal SPT[j] that is electrically connected to the wiring B[j].

Furthermore, a differential current output from the output terminal SPT[j+1] that is electrically connected to the wiring B[j+1] is expressed as $\Delta I_B[j+1]=2\,kV_x[i,j+1]V_W[i]$. The data corresponding to the product of the first analog data stored in the memory cell AM[i,j+1] and the second analog data corresponding to a selection signal applied to the wiring RW[i] is output from the output terminal SPT[j+1] that is electrically connected to the wiring B[j+1].

<<Period from Time T20 to Time T21>>

During a period from T20 to Time T21, the ground potential is applied to the wiring RW[i]. The ground potential is applied to each of the second terminals of the capacitors C2 in the memory cells AM[i,1] to AM[i,n] and the memory cell $AM_{ref}[i]$. Thus, the potentials of the nodes N[i,1] to N[i,n] and the node $N_{ref}[i]$ return to the potentials during the period from Time T18 to Time T19.

<<Period from Time T21 to Time T22>>

During a period from Time T21 to Time T22, the wirings RW[1] to RW[m] except the wiring RW[i+1] are set to have the reference potential, and a potential higher than the reference potential by $V_W[i+1]$ is applied to the wiring RW[i+1]. At this time, as in the operation during the period from Time T19 to Time T20, the potential $V_W[i+1]$ is applied to each of the second terminals of the capacitors C2 in the memory cells AM[i+1,1] to AM[i+1,n] and the memory cell $AM_{ref}[i+1]$, so that the potentials of the gates of the transistors Tr12 increase.

The potential $V_W[i+1]$ corresponds to the second analog data.

As described above, the capacitive coupling coefficients of the memory cells AM and the memory cell $AM_{ref}$ are each 1. When the potential $V_W[i+1]$ is applied to each of the second terminals of the capacitors C2 in the memory cell AM[i+1,j], the memory cell AM[i+1,j+1], and the memory cell $AM_{ref}[i+1]$, the potentials of the node N[i+1,j], the node N[i+1,j+1], and the node $N_{ref}[i+1]$ each increase by $V_W[i+1]$.

When the potentials of the node N[i+1,j], the node N[i+1,j+1], and the node $N_{ref}[i+1]$ increase by $V_W[i+1]$, the amount of current flowing in each of the transistors Tr12 in the memory cell AM[i+1,j], the memory cell AM[i+1,j+1], and the memory cell $AM_{ref}[i+1]$ increases. When the current flowing in the transistor Tr12 in the memory cell AM[i+1,j] is denoted by I[i+1,j], the current flowing from the output terminal OT[j] of the column output circuit OUT[j] to the wiring B[j] increases by $I[i+1,j]-I_0[i+1,j]$ (denoted by $\Delta I[i+1,j]$ in FIG. 17). When the current flowing in the transistor Tr12 in the memory cell AM[i+1,j+1] is denoted by I[i+1,j+1], the current flowing from the output terminal OT[j+1] of the column output circuit OUT[j+1] to the wiring B[j+1] increases by $I[i+1,j+1]-I_0[i+1,j+1]$ (denoted by $\Delta I[i+1,j+1]$ in FIG. 17). When the current flowing in the transistor Tr12 in the memory cell $AM_{ref}[i+1]$ is denoted by $I_{ref}[i+1]$, the current flowing from the output terminal $OT_{ref}$ of the reference column output circuit $C_{ref}$ to the wiring $B_{ref}$ increases by $I_{ref}[i+1]-I_{ref0}[i+1]$ (denoted by $\Delta I_{ref}[i+1]$ in FIG. 17).

The operation during the period from Time T21 to Time T22 can be similar to the operation during the period from Time T19 to Time T20. Thus, when Formula (E9) is applied to the operation during the period from Time T21 to Time T22, the differential current output from the wiring B[j] is expressed as $\Delta I_B[j]=2\,kV_x[i+1,j]V_W[i+1]$. In other words, the data corresponding to the product of the first analog data stored in the memory cell AM[i+1,j] and the second analog data corresponding to a selection signal applied to the wiring RW[i+1] is output from the output terminal SPT[j] that is electrically connected to the wiring B[j].

Furthermore, the differential current output from the wiring B[j+1] is expressed as $\Delta I_B[j+1]=2\,kV_x[i+1,j+1]V_W[i+1]$. The data corresponding to the product of the first analog data stored in the memory cell AM[i+1,j+1] and the second analog data corresponding to a selection signal applied to the wiring RW[i+1] is output from the output terminal SPT[j+1] that is electrically connected to the wiring B[j+1].

<<Period from Time T22 to Time T23>>

During a period from Time T22 to Time T23, the ground potential is applied to the wiring RW[i+1]. In this period, the ground potential is applied to each of the second terminals of the capacitors C2 in the memory cells AM[i+1,1] to AM[i+1,n] and the memory cell $AM_{ref}[i+1]$, and the potentials of nodes N[i+1,1] to N[i+1,n] and the node $N_{ref}[i+1]$ return to the potentials in the period from Time T20 to Time T21.

<<Period from Time T23 to Time T24>>

During a period from Time T23 to Time T24, the wirings RW[1] to RW[m] except the wiring RW[i] and the wiring RW[i+1] are set to have the reference potential, a potential higher than the reference potential by $V_{W2}[i]$ is applied to the wiring RW[i], and a potential lower than the reference potential by $V_{W2}[i+1]$ is applied to the wiring RW[i+1]. At this time, as in the operation during the period from Time T19 to Time T20, the potential $V_{W2}[i]$ is applied to each of the second terminals of the capacitors C2 in the memory cells AM[i,1] to AM[i,n] and the memory cell $AM_{ref}[i]$, so that potentials of the gates of the transistors Tr12 in the memory cells AM[i,1] to AM[i,n] and the memory cell $AM_{ref}[i]$ increase. Concurrently, the potential $-V_{W2}[i+1]$ is applied to each of the second terminals of the capacitors C2 in the memory cells AM[i+1,1] to AM[i+1,n] and the memory cell $AM_{ref}[i+1]$, so that the potentials of the gates of the transistors Tr12 in the memory cells AM[i+1,1] to AM[i+1,n] and the memory cell $AM_{ref}[i+1]$ decrease.

The potential $V_{W2}[i]$ and the potential $V_{W2}[i+1]$ are potentials each corresponding to the second analog data.

Note that the capacitive coupling coefficients of the memory cell AM and the memory cell $AM_{ref}$ are each 1. When the potential $V_{W2}[i]$ is applied to each of the second terminals of the capacitors C2 in the memory cell AM[i,j], the memory cell AM[i,j+1], and the memory cell $AM_{ref}[i]$, the potentials of the node N[i,j], the node N[i,j+1], and the node $N_{ref}[i]$ each increase by $V_{W2}[i]$. When the potential $-V_{W2}[i+1]$ is applied to each of the second terminals of the capacitors C2 in the memory cell AM[i+1,j], the memory cell AM[i+1,j+1], and the memory cell $AM_{ref}[i+1]$, the potentials of the node N[i+1,j], the node N[i+1,j+1], and the node $N_{ref}[i+1]$ each decrease by $V_{W2}[i+1]$.

When each of the potentials of the node N[i,j], the node N[i,j+1], and the node $N_{ref}[i]$ increases by $V_{W2}[i]$, the amount of current flowing in each of the transistors Tr12 in the memory cell AM[i,j], the memory cell AM[i,j+1], and the memory cell $AM_{ref}[i]$ increases. Here, the current flowing in the transistor Tr12 in the memory cell AMP[i,j] is denoted by I[i,j], the current flowing in the transistor Tr12 in the memory cell AM[i,j+1] is denoted by I[i,j+1], and the current flowing in the transistor Tr12 in the memory cell $AM_{ref}[i]$ is denoted by $I_{ref}[i]$.

When the potentials of the node N[i+1,j], the node N[i+1,j+1], and the node $N_{ref}[i+1]$ each decrease by $V_{W2}[i+1]$, the amount of current flowing in each of the transistors Tr12 in the memory cell AM[i+1,j], the memory cell AM[i+1,j+1], and the memory cell $AM_{ref}[i+1]$ decreases. Here, the current flowing in the transistor Tr12 in the memory cell AM[i+1,j] is denoted by $I_2$[i,j], the current flowing in the transistor Tr12 in the memory cell AM[i+1,j+1] is denoted by $I_2$[i,j+1], and the current flowing in the transistor Tr12 in the memory cell AM$_{ref}$[i+1] is denoted by $I_{2ref}$[i+1].

At this time, the current flowing from the output terminal OT[j] of the column output circuit OUT[j] to the wiring B[j] increases by ($I_2$[i,j]–$I_0$[i,j])+($I_2$[i+1,j]–$I_0$[i+1,j]) (denoted by $\Delta I$[j] in FIG. 17). The current flowing from the output terminal OT[j+1] of the column output circuit OUT[j+1] to the wiring B[j+1] increases by ($I_2$[i,j+1]–$I_0$[i,j+1])+($I_2$[i+1,j+1]–$I_0$[i+1,j+1]) (denoted by $\Delta I$[j+1] in FIG. 17, which is a negative current). The current flowing from the output terminal OT$_{ref}$ of the reference column output circuit C$_{ref}$ to the wiring B$_{ref}$ increases by ($I_{ref}$[i,j]–$I_{ref0}$[i,j])+($I_{ref}$[i+1,j]–$I_{ref0}$[i+1,j]) (denoted by $\Delta I_{Bref}$ in FIG. 17).

The operation during the period from Time T23 to Time T24 can be similar to that operation during the period from Time T19 to Time T20. When Formula (E9) is applied to the operation during the period from Time T23 to Time T24, the differential current output from the wiring B[j] is expressed as $\Delta I_B$[j]=2 k$\{V_x$[i,j]$V_{W2}$[i]–$V_x$[i+1,j]$V_{W2}$[i+1]$\}$. Thus, the data corresponding to the sum of products of the first analog data stored in each of the memory cell AM[i,j] and the memory cell AM[i+1,j] and the second analog data corresponding to a selection signal applied to each of the wiring RW[i] and the wiring RW[i+1] is output from the output terminal SPT[j] that is electrically connected to the wiring B[j].

The differential current output from the wiring B[j+1] is expressed as $\Delta I_B$[j+1]=2 k$\{V_x$[i,j+1]$V_{W2}$[i]–$V_x$[i+1,j+1]$V_{W2}$[i+1]$\}$. The data corresponding to the product of the first analog data stored in each of the memory cell AM[i,j+1] and the memory cell AM[i+1,j+1] and the second analog data corresponding to a selection signal applied to each of the wiring RW[i] and the wiring RW[i+1] is output from the output terminal SPT[j+1] that is electrically connected to the wiring B[j+1].

<<After Time T24>>

From and after Time T24, the ground potential is applied to each of the wiring RW[i] and the wiring RW[i+1]. At this time, the ground potential is applied to each of the second terminals of the capacitors C2 in the memory cells AM[i,1] to AM[i,n], the memory cells AM[i+1,1] to AM[i+1,n], the memory cell AM$_{ref}$[i], and the memory cell AM$_{ref}$[i+1]. Thus, the potentials of the nodes N[i,1] to N[i,n], the nodes N[i+1,1] to N[i+1,n], the node N$_{ref}$[i], and the node N$_{ref}$[i+1] return to the potentials in the period from Time T22 to Time T23.

With the circuit configuration illustrated in FIG. 1, a plurality of product-sum operations can be executed concurrently. Thus, a semiconductor device enabling high-speed product-sum operations can be provided.

Note that this embodiment can be combined with any of the other embodiments in this specification as appropriate.

Embodiment 2

In this embodiment, a neural network will be described.

A neural network is an information processing system modeled on a biological neural network. A computer having higher performance than a conventional Neumann computer is expected to be provided by utilizing the neural network, and in these years, a variety of researches on a neural network formed using an electronic circuit have been carried out.

In the neural network, units which resemble neurons are connected to each other through units which resemble synapses. It is considered that a variety of input patterns are learned, and pattern recognition, associative storage, or the like can be performed at high speed by changing the connection strength.

For example, a product-sum operation circuit described in Embodiment 1 is used as a feature extraction filter for convolution or a fully connected arithmetic circuit, whereby the feature amount can be extracted using a convolutional neural network (CNN). Note that weight coefficients of the feature extraction filter can be set using random numbers.

<Hierarchical Neural Network>

A hierarchical neural network will be described as a kind of neural networks that can be used for the hybrid display device of one embodiment of the present invention.

Figure 18:
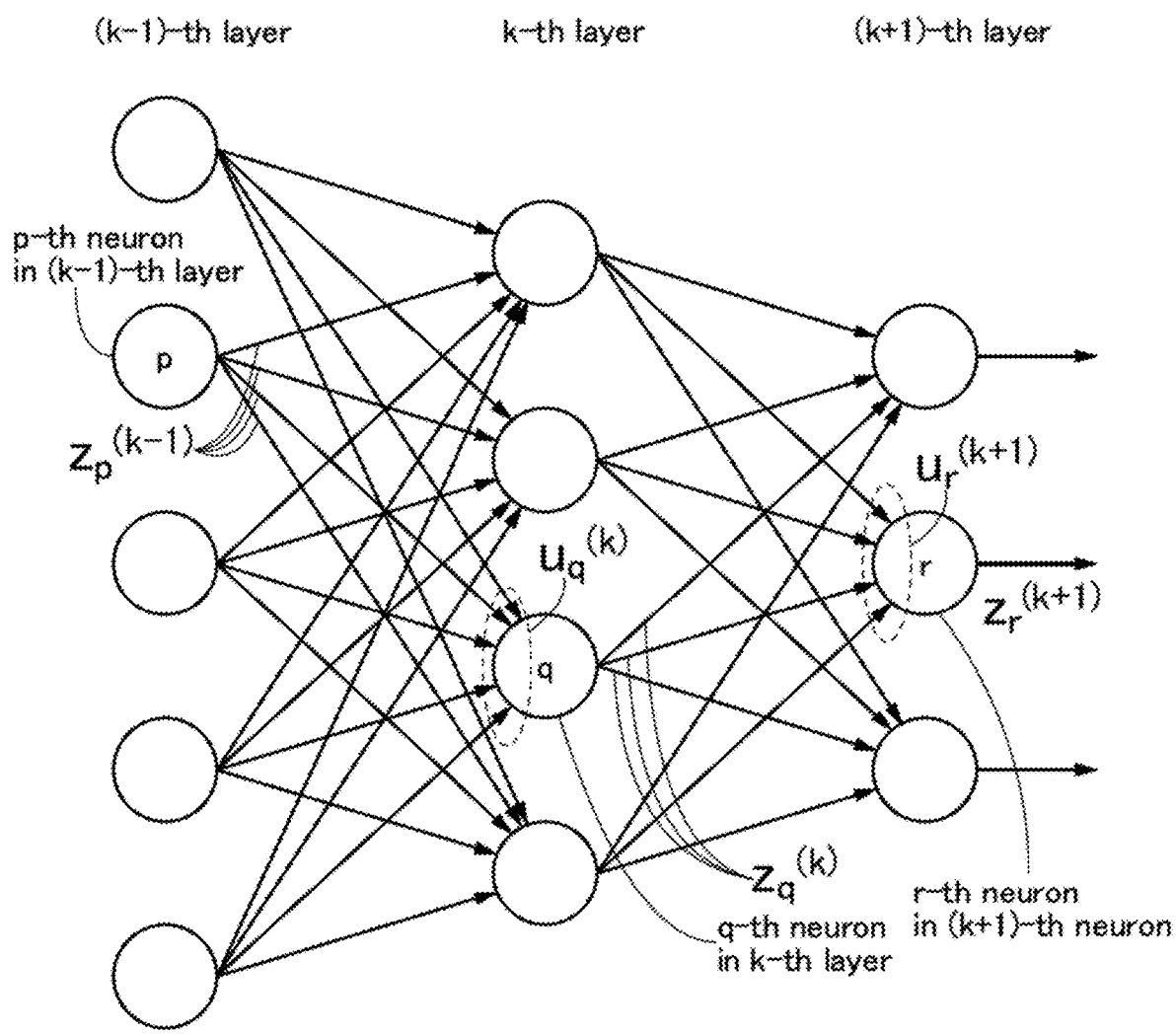
FIG. 18 illustrates an example of a hierarchical neural network.

FIG. 18 is a diagram illustrating an example of a hierarchical neural network. A (k−1)-th layer (here, k is an integer greater than or equal to 2) includes P neurons (here, P is an integer greater than or equal to 1). A k-th layer includes Q neurons (here, Q is an integer greater than or equal to 1). A (k+1)-th layer includes R neurons (here, R is an integer greater than or equal to 1).

The product of an output signal $z_p^{(k-1)}$ of the p-th neuron (here, p is an integer greater than or equal to 1 and less than or equal to P) in the (k−1)-th layer and a weight coefficient $w_{qp}^{(k)}$ is input to the q-th neuron (here, q is an integer greater than or equal to 1 and less than or equal to Q) in the k-th layer. The product of an output signal $z_q^{(k)}$ of the q-th neuron in the k-th layer and a weight coefficient $w_{rq}^{(k+1)}$ is input to the r-th neuron (here, r is an integer greater than or equal to 1 and less than or equal to R) in the (k+1)-th layer. The output signal of the r-th neuron in the (k+1)-th layer is $z_r^{(k+1)}$.

In this case, the summation $u_q$(k) of signals input to the q-th neuron in the k-th layer is expressed by the following formula.

[Formula 15]

$$u_q^{(k)} = \Sigma w_{qp}^{(k)} z_p^{(k-1)} \qquad (D1)$$

The output signal $z_q^{(k)}$ from the q-th neuron in the k-th layer is expressed by the following formula.

[Formula 16]

$$z_q^{(k)} = f(u_q^{(k)}) \qquad (D2)$$

Figure 21A:
FIGS. 21A to 21D illustrate configuration examples of a circuit.

A function $f(u_q^{(k)})$ is an activation function. A step function, a linear ramp function, a sigmoid function, or the like can be used as the function $f(u_q^{(k)})$. Product-sum operation of Formula (D1) can be performed with a product-sum operation circuit (semiconductor device 100) described above. Formula (D2) can be calculated with a circuit 411 illustrated in FIG. 21A, for example.

Note that the activation function may be the same among all neurons or may be different among neurons. Furthermore, an output function of the neuron in one layer may be the same as or different from that in another layer.

Figure 19:
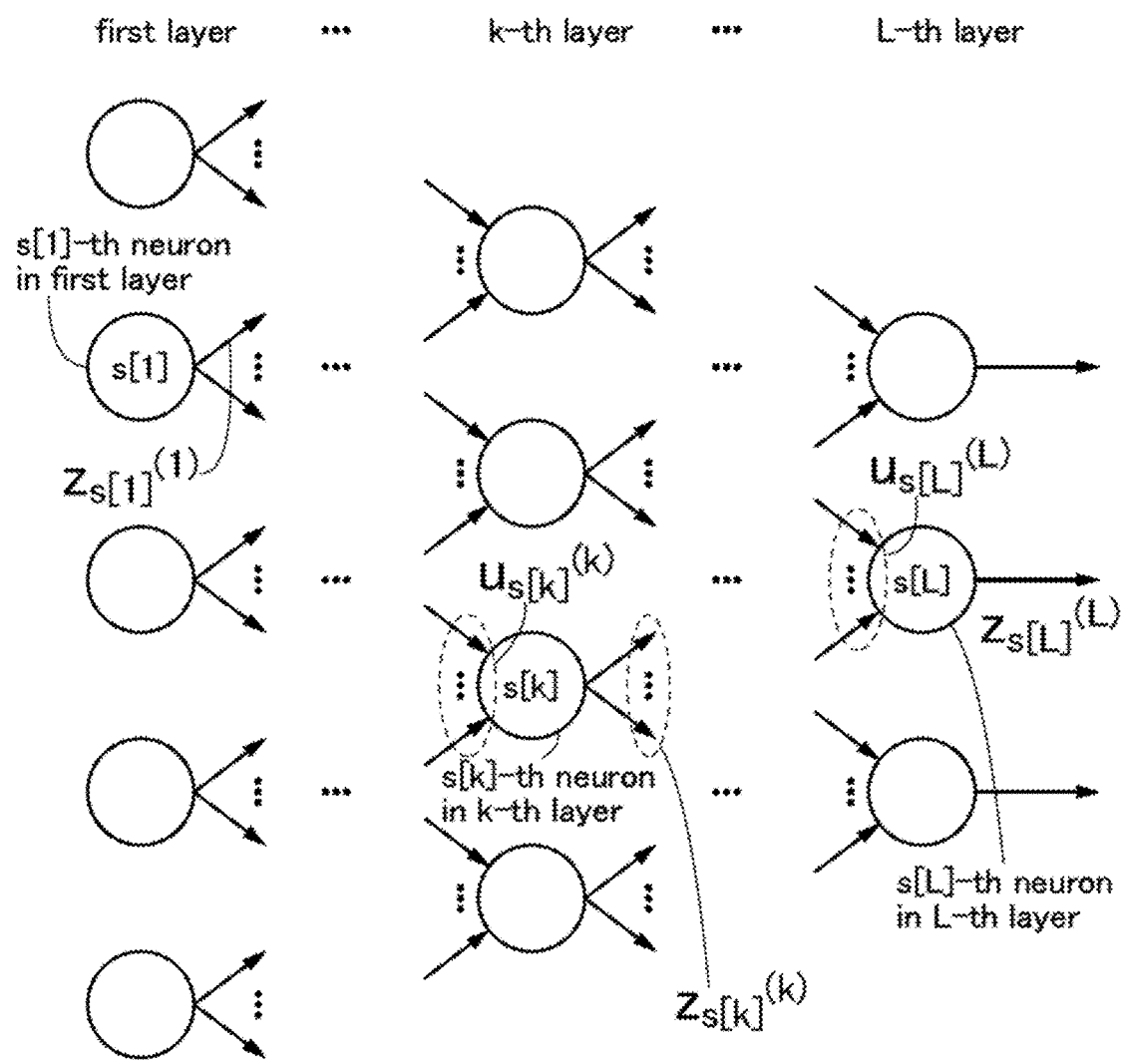
FIG. 19 illustrates an example of a hierarchical neural network.

Here, a hierarchical neural network including L layers (here, L is an integer greater than or equal to 3) in total illustrated in FIG. 19 will be described (that is, here, k is an integer greater than or equal to 2 and less than or equal to (L−1)). A first layer is an input layer of the hierarchical neural network, an L-th layer is an output layer of the hierarchical neural network, and second to (L−1)-th layers are hidden layers of the hierarchical neural network.

The first layer (input layer) includes P neurons, the k-th layer (hidden layer) includes Q[k] neurons (here, Q[k] is an integer greater than or equal to 1), and the L-th layer (output layer) includes R neurons.

An output signal of the s[1]-th neuron in the first layer (here, s[1] is an integer greater than or equal to 1 and less than or equal to P) is $z_{s[1]}^{(1)}$, an output signal of the s[k]-th neuron in the k-th layer (here, s[k] is an integer greater than or equal to 1 and less than or equal to Q[k]) is $z_{s[k]}^{(k)}$, and an output signal of the s[L]-th neuron in the L-th layer (here, s[L] is an integer greater than or equal to 1 and less than or equal to R) is $z_{s[L]}^{(L)}$.

The product $u_{s[k]}^{(k)}$ of an output signal $z_{s[k-1]}^{(k-1)}$ of the s[k−1]-th neuron in the (k−1)-th layer and a weight coefficient $w_{s[k]s[k-1]}^{(k)}$ (here, s[k−1] is an integer greater than or equal to 1 and less than or equal to Q[k−1]) is input to the s[k]-th neuron in the k-th layer. The product $u_{s[L]}^{(L)}$ of an output signal $z_{s[L-1]}^{(L-1)}$ of the s[L−1]-th neuron in the (L−1)-th layer and a weight coefficient $w_{s[L]s[L-1]}^{(L)}$ (here, s[L−1] is an integer greater than or equal to 1 and less than or equal to Q[L−1]) is input to the s[L]-th neuron in the L-th layer.

Next, supervised learning will be described. Supervised learning refers to operation of updating all weight coefficients of a hierarchical neural network on the basis of an output result and a desired result (also referred to as teacher data or a teacher signal in some cases) when the output result and the desired result differ from each other, in functions of the above-described hierarchical neural network.

Figure 20:
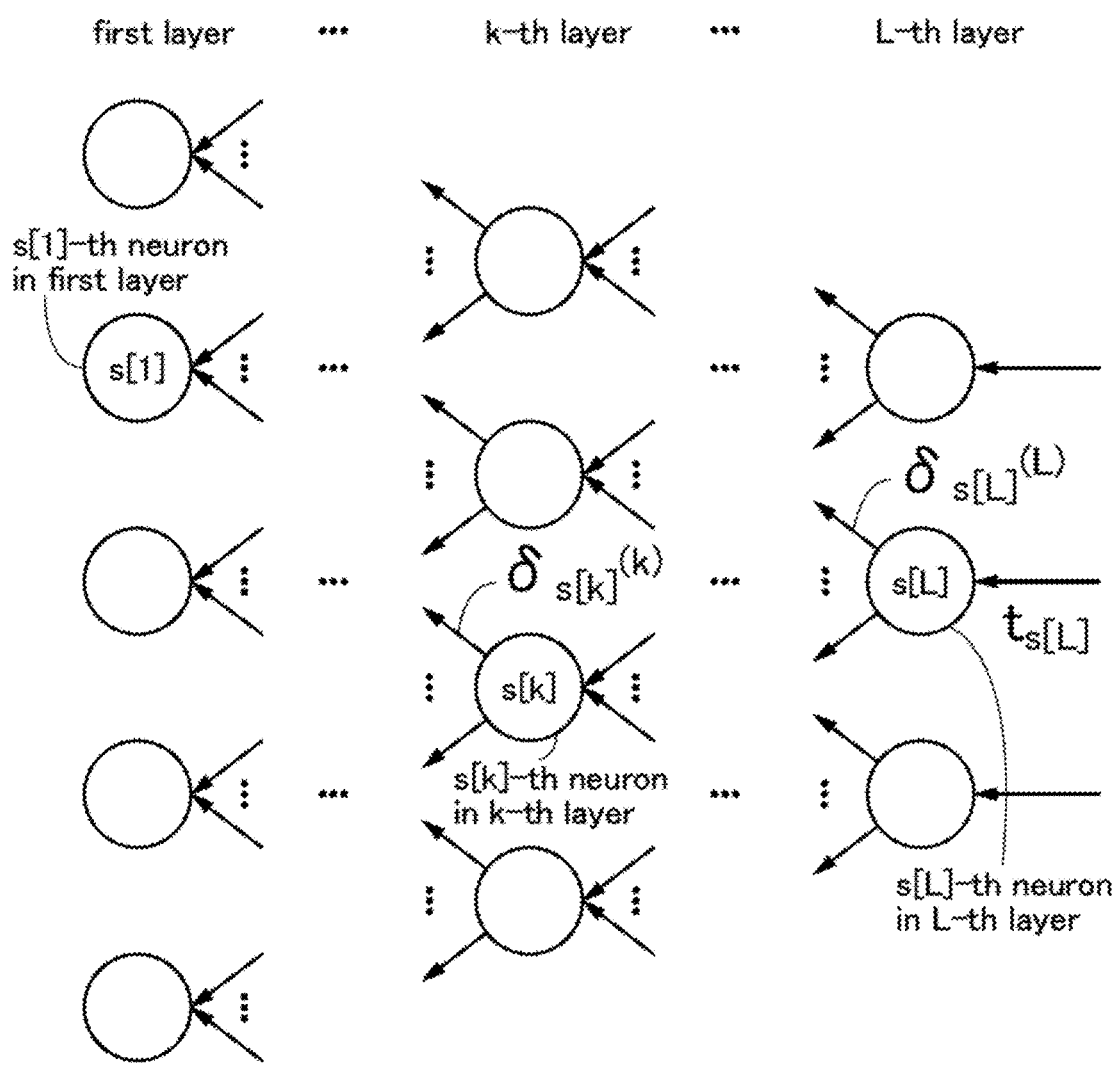
FIG. 20 illustrates an example of a hierarchical neural network.

A learning method using backpropagation will be described as a specific example of supervised learning. FIG. 20 is a diagram illustrating a learning method using backpropagation. Backpropagation is a method for changing a weight coefficient so that an error between an output of a hierarchical neural network and teacher data becomes small.

For example, assume that input data is input to the s[1]-th neuron in the first layer and output data $z_{s[L]}^{(L)}$ is output from the s[L]-th neuron in the L-th layer. Here, error energy E can be expressed using output data $z_{s[L]}^{(L)}$ and a teacher signal $t_{s[L]}$, when a teacher signal for the output data $z_{s[L]}^{(L)}$ is $t_{s[L]}$.

The update amount of a weight coefficient $w_{s[k]s[k-1]}^{(k)}$ of the s[k]-th neuron in the k-th layer with respect to the error energy E is set to $\partial E / \partial w_{s[k]s[k-1]}^{(k)}$, whereby the weight coefficient can be updated. Here, when an error $\partial_{s[k]}^{(k)}$ of the output value $z_{s[k]}^{(k)}$ of the s[k]-th neuron in the k-th layer is defined as $\partial E / \partial u_{s[k]}^{(k)}$, $\delta_{s[k]}^{(k)}$ and $\partial E/\partial w_{s[k]s[k-1]}^{(k)}$ can be expressed by the following respective formulae.

[Formula 17]

$$\delta_{s[k]}^{(k)} = \sum_{s[k+1]} \delta_{s[k+1]}^{(k+1)} \cdot w_{s[k+1]s[k]}^{(k+1)} \cdot f'(u_{s[k]}^{(k)}) \quad (D3)$$

[Formula 18]

$$\frac{\partial E}{\partial w_{s[k]s[k-1]}^{(k)}} = \delta_{s[k]}^{(k)} \cdot z_{s[k-1]}^{(k-1)} \quad (D4)$$

Figure 21B:
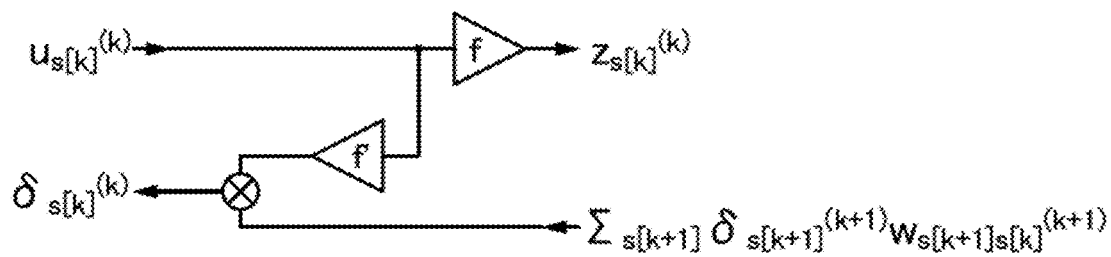
Figure 21C:
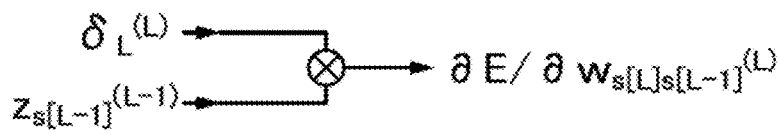

A function $f(u_{s[k]}^{(k)})$ is the derivative of an output function of a neuron circuit. Formula (D3) can be calculated with a circuit 413 illustrated in FIG. 21B, for example. Formula (D4) can be calculated with a circuit 414 illustrated in FIG. 21C, for example. The derivative of an output function can be obtained by connecting an arithmetic circuit that can execute a desired derivative to an output terminal of an operational amplifier, for example.

For example, $\Sigma \delta_{s[k+1]}^{(k+1)} \cdot w_{s[k+1]s[k]}^{(k+1)}$ in Formula (D3) can be calculated with a product-sum operation circuit (semiconductor device 100) described above.

Here, when the (k+1)-th layer is an output layer, or the L-th layer, $\delta_{s[L]}^{(L)}$ and $\partial E / \partial w_{s[L]s[L-1]}^{(L)}$ can be expressed by the following respective formulae.

[Formula 19]

$$\delta_{s[L]}^{(L)} = (z_{s[L]}^{(L)} - t_{s[L]}) \cdot f'(u_{s[L]}^{(L)}) \quad (D5)$$

[Formula 20]

$$\frac{\partial E}{\partial w_{s[L]s[L-1]}^{(L)}} = \delta_{s[L]}^{(L)} \cdot z_{s[L-1]}^{(L-1)} \quad (D6)$$

Figure 21D:
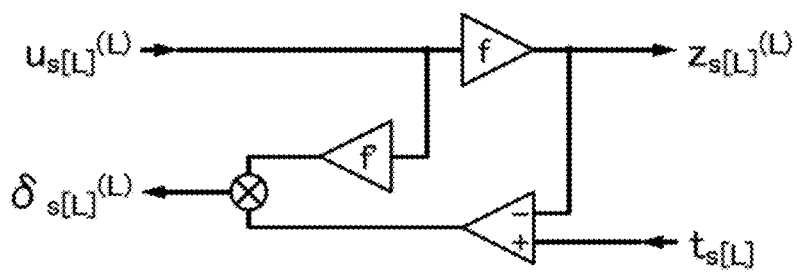

Formula (D5) can be calculated with a circuit 415 illustrated in FIG. 21D. Furthermore, Formula (D6) can be calculated with the circuit 414 illustrated in FIG. 21C.

That is to say, the errors $\delta_s[k]^{(k)}$ and $\delta_{s[L]}^{(L)}$ of all neuron circuits can be calculated by Formulae (D1) to (D6). Note that the update amounts of the weight coefficients are set on the basis of the errors $\delta_{s[k]}^{(k)}$ and $\delta_{s[L]}^{(L)}$, predetermined parameters, and the like.

As described above, by using the circuits illustrated in FIGS. 21A to 21D and the product-sum operation circuit (semiconductor device 100) described above, calculation of the hierarchical neural network using supervised learning can be performed.

Specifically, in Embodiment 1, the first analog data serves as weight coefficients and the second analog data corresponds to neuron outputs, whereby calculation of the weighted sums of the neuron outputs can be conducted concurrently. Thus, data corresponding to results of the calculation of the weighted sums, that is, synapse inputs can be obtained as the output signals. Specifically, weight coefficients $w_{s[k] \cdot 1}^{(k)}$ to $w_{s[k] \cdot Q[k-1]}^{(k)}$ of the s[k]-th neuron in the k-th layer are stored as the first analog data in the memory cells AMP[1,j] to AM[m,j] and output signals $z_{1 \cdot s[k]}^{(k-1)}$ to $z_{Q[k-1] \cdot s[k]}^{(k-1)}$ of the neurons in the (k−1)-th layer are supplied as the second analog data to the wirings RW[1] to RW[m], whereby the summation $u_{s[k]}^{(k)}$ of signals input to the s[k]-th neuron in the k-th layer can be obtained. That is, the product-sum operation expressed by Formula (D1) can be performed with the semiconductor device 100.

In the case where weight coefficients are updated in supervised learning, weight coefficients $w_{1 \cdot s[k]}^{(k+1)}$ to $w_{Q[k+1] s[k]}^{(k+1)}$ multiplied by when a signal is sent from the s[k]-th neuron in the k-th layer to each neuron in the (k+1)-th layer are stored as the first analog data in the memory cells AM[1,j] to AM[m,j] and errors $\delta_1^{(k+1)}$ to $\delta_{Q[k+1]}^{(k+1)}$ of the neurons in the (k+1)-th layer are supplied as the second analog data to the wirings RW[1] to RW[m], whereby a value of $\Sigma w_{s[k+1] \cdot s[k]}^{(k+1)} \cdot \delta_{s[k+1]}^{(k+1)}$ in Formula (D3) can be obtained from the differential current $\Delta I_B[j]$ flowing through the wiring B[j]. That is, part of the operation expressed by Formula (D3) can be performed with the semiconductor device 100.

Note that this embodiment can be combined with any of the other embodiments in this specification as appropriate.

Embodiment 3

In this embodiment, application examples of the semiconductor device described in Embodiment 1 will be described.

Since the semiconductor device 100 functions as a product-sum operation circuit, the semiconductor device 100 can be used as one of components of a neural network in some cases, as described in Embodiment 2.

The neural network has a configuration where units resembling neurons are connected to each other through units resembling synapses. It is considered that when the connection strength is changed, the neural network learns about a variety of input patterns and comes to enable pattern recognition, associative storage, and data mining to be executed at high speed. In particular, a novel electronic device utilizing pattern recognition of sound, voice, music, images, videos, or the like can be achieved in some cases.

In the semiconductor device described in Embodiment 1, the first analog data serves as weight coefficients, and the second analog data corresponds to neuron outputs, whereby the calculation of the weighted sums of neuron outputs can be conducted concurrently. Thus, data corresponding to results of the calculation of the weighted sums, that is, synapse inputs can be obtained as the output signals.

<Electronic Device>

Here, electronic devices or systems utilizing the neural network will be described.

Figure 22A:
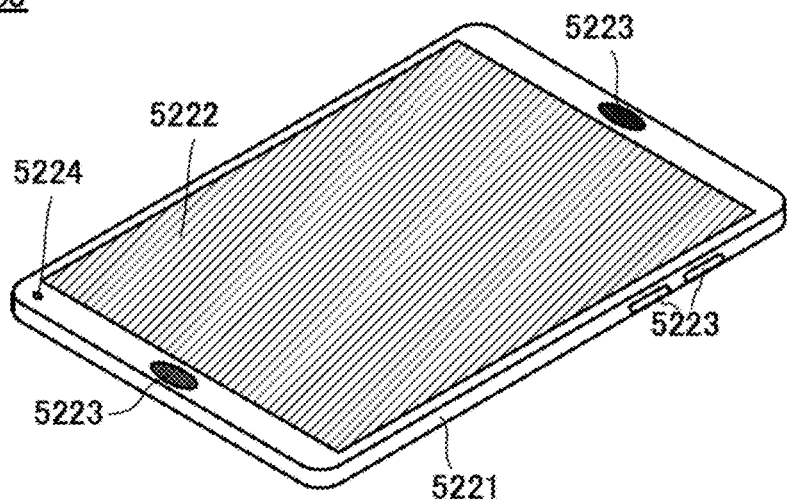
FIGS. 22A and 22B are perspective views illustrating examples of an electronic device.

FIG. 22A illustrates a tablet information terminal 5200, which includes a housing 5221, a display portion 5222, operation buttons 5223, and a speaker 5224. A display device with a position input function may be used for a display portion 5222. Note that the position input function can be added by provision of a touch panel in a display device. Alternatively, the position input function can be added by providing a photoelectric conversion element called a photosensor in a pixel area of a display device. As the operation buttons 5223, for example, a power switch for starting the information terminal, a button for operating an application of the information terminal, a volume control button, a switch for turning on or off the display portion 5222, and the like can be provided. Although the number of the operation buttons 5223 is four in the information terminal illustrated in FIG. 22A, the number and position of operation buttons included in the information terminal are not limited to this example. Although not illustrated, the information terminal illustrated in FIG. 22A may be provided with a camera. Although not illustrated, the information terminal illustrated in FIG. 22A may include a light-emitting device for use as a flashlight or a lighting device. Although not illustrated, the information terminal illustrated in FIG. 22A may include a sensor (which has a function of measuring force, displacement, position, speed, acceleration, angular velocity, rotational frequency, distance, light, liquid, magnetism, temperature, a chemical substance, a sound, time, hardness, electric field, current, voltage, electric power, radiation, flow rate, humidity, gradient, oscillation, smell, infrared rays, or the like) inside the housing 5221. In particular, when a sensing device including a sensor for detecting inclination, such as a gyroscope sensor or acceleration sensor is provided, display on the screen of the display portion 5222 can be automatically changed in accordance with the orientation of the information terminal illustrated in FIG. 22A by determining the orientation of the information terminal (the orientation of the information terminal with respect to the vertical direction).

Figure 22B:
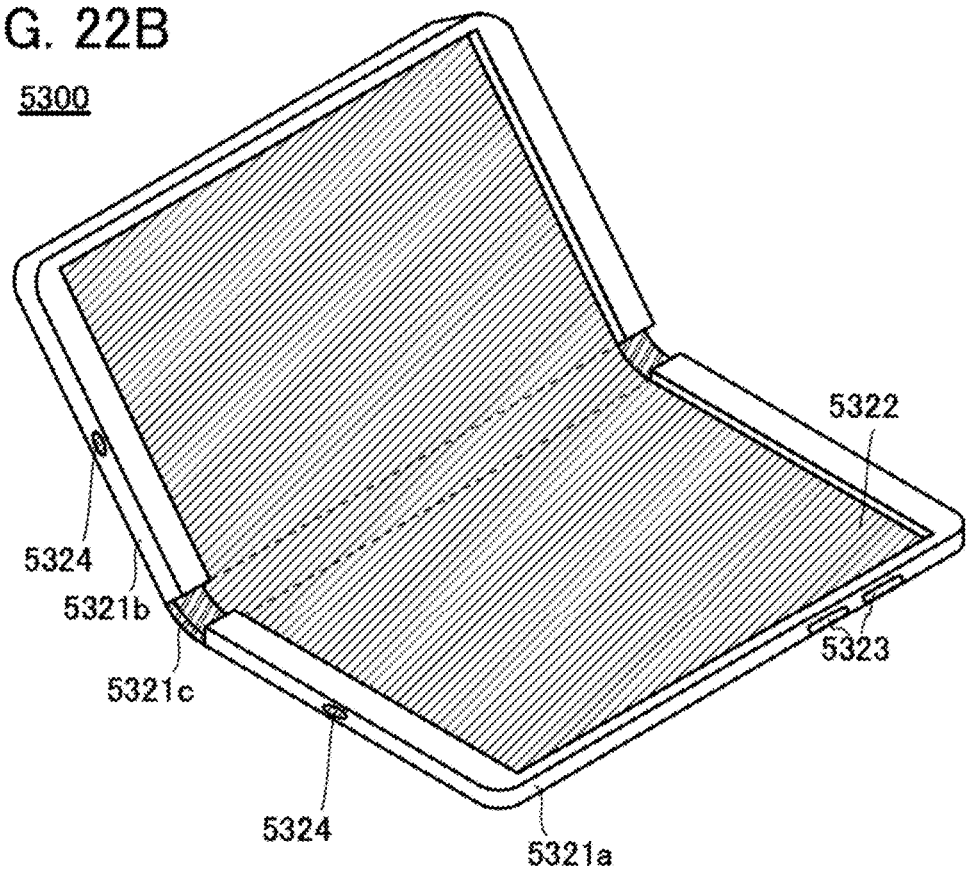

Furthermore, a flexible base may be used for the display portion 5222 of the information terminal 5200 so that the display portion 5222 is freely foldable. FIG. 22B illustrates such a structure. An information terminal 5300 is a tablet information terminal similar to the information terminal 5200 and includes a housing 5321a, a housing 5321b, a display portion 5322, operation buttons 5323, and speakers 5324.

The housing 5321a and the housing 5321b are connected to each other with a hinge portion 5321c that allows the display portion 5322 to be folded in half. The display portion 5322 is provided in the housing 5321a and the housing 5321b and over the hinge portion 5321c.

As a flexible base that can be used for the display portion 5222, any of the following materials that transmit visible light can be used: a poly(ethylene terephthalate) resin (PET), a poly(ethylene naphthalate) resin (PEN), a poly(ether sulfone) resin (PES), a polyacrylonitrile resin, an acrylic resin, a polyimide resin, a poly(methyl methacrylate) resin, a polycarbonate resin, a polyamide resin, a polycycloolefin resin, a polystyrene resin, a poly(amide imide) resin, a polypropylene resin, a polyester resin, a poly(vinyl halide) resin, an aramid resin, an epoxy resin, or the like. Alternatively, a mixture or a stack including any of these materials may be used.

In the case where a device for obtaining biological information of fingerprints, veins, iris, voice prints, or the like is provided, the information terminal 5200 and the information terminal 5300 having a biometric authentication function can be obtained. In particular, the neural network is used for the biometric authentication function, whereby a high-accuracy authentication system can be constructed in some cases. Furthermore, the application of the neural network in the information terminal is not limited only to the authentication system. For example, in the information terminal utilizing the neural network, speech interpretation can be performed in some cases. With the speech interpretation function, the information terminal can have a function of operating the tablet information terminal by speech recognition, a function of interpreting a speech or a conversation and creating a summary of the speech or the conversation, and the like. For example, when a touch panel is used for the display portion of the information terminal, a character that is written on the touch panel with a finger, a stylus pen, or the like can be recognized by use of a neural network in some cases. This method can be utilized to recognize a written character, convert the character into a predetermined font, and display the character on the display portion. Thus, the tablet information terminal can be used as a text for learning foreign languages or the like, for example. Alternatively, the tablet information terminal can be utilized to create meeting minutes or the like, for example.

Figure 23A:
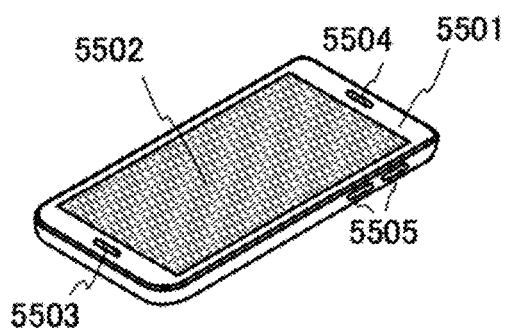
FIGS. 23A to 23C are perspective views illustrating examples of an electronic device.

Note that without limitation to the tablet information terminal illustrated in FIGS. 22A and 22B, one embodiment of the present invention may be a mode of a mobile phone (smartphone) as illustrated in FIG. 23A, which includes the small-sized information terminal illustrated in FIG. 22A and has a telephone function. The mobile phone illustrated in FIG. 23A includes a housing 5501, a display portion 5502, a microphone 5503, a speaker 5504, and operation buttons 5505. When a device for obtaining biological information of fingerprints, veins, iris, voice prints, or the like is provided for the mobile phone like the information terminal illustrated in FIGS. 22A and 22B, an information terminal having a biometric authentication function utilizing the neural network can be achieved in some cases. Furthermore, like the information terminal illustrated in FIGS. 22A and 22B, the mobile phone may have a speech interpretation function utilizing the neural network. Furthermore, like the information terminal illustrated in FIGS. 22A and 22B, the mobile phone may have a character recognition function utilizing the neural network.

Figure 23B:
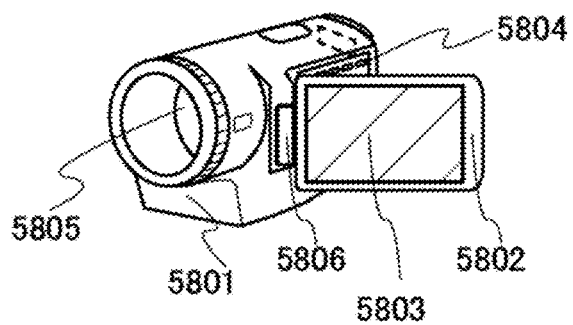

FIG. 23B illustrates a video camera including a first housing 5801, a second housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. Images displayed on the display portion 5803 may be switched in accordance with the angle at the joint 5806 between the first housing 5801 and the second housing 5802.

When images taken by a video camera are recorded, the images need to be encoded in accordance with a data recording format. In encoding of the images, the pattern recognition of the neural network is utilized to calculate a difference between the image data taken at the previous time and image data taken this time, so that the data can be compressed.

Figure 23C:
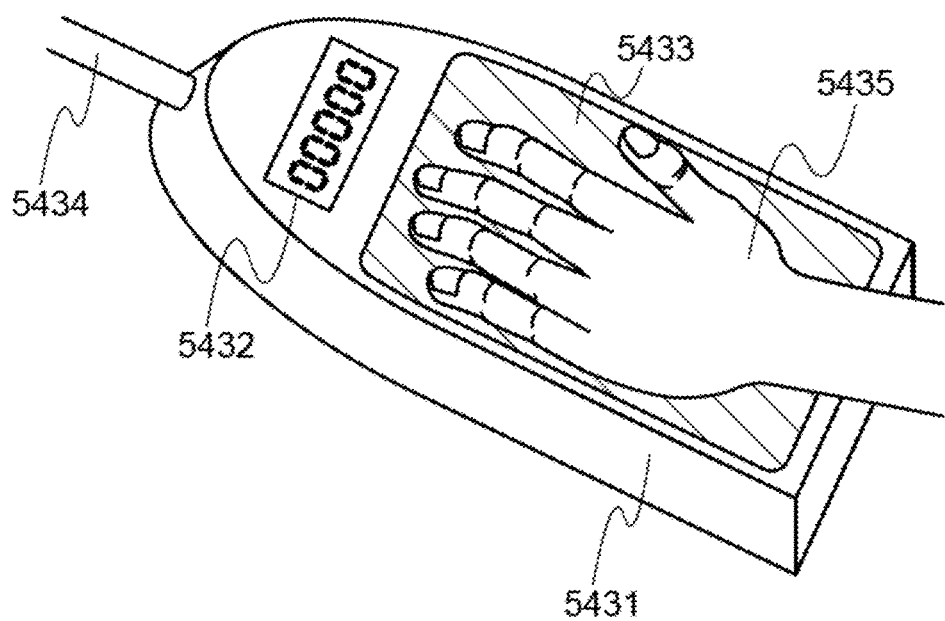

FIG. 23C illustrates a palm print authentication device, which includes a housing 5431, a display portion 5432, a palm print reading portion 5433, and a wiring 5434. Also, FIG. 23C illustrates a situation where a palm print of a hand 5435 is obtained. Without limitation to the palm print authentication device, one embodiment of the present invention may be a device for obtaining biological information of fingerprints, veins, faces, iris, voice prints, genes, or the like.

Figure 24:
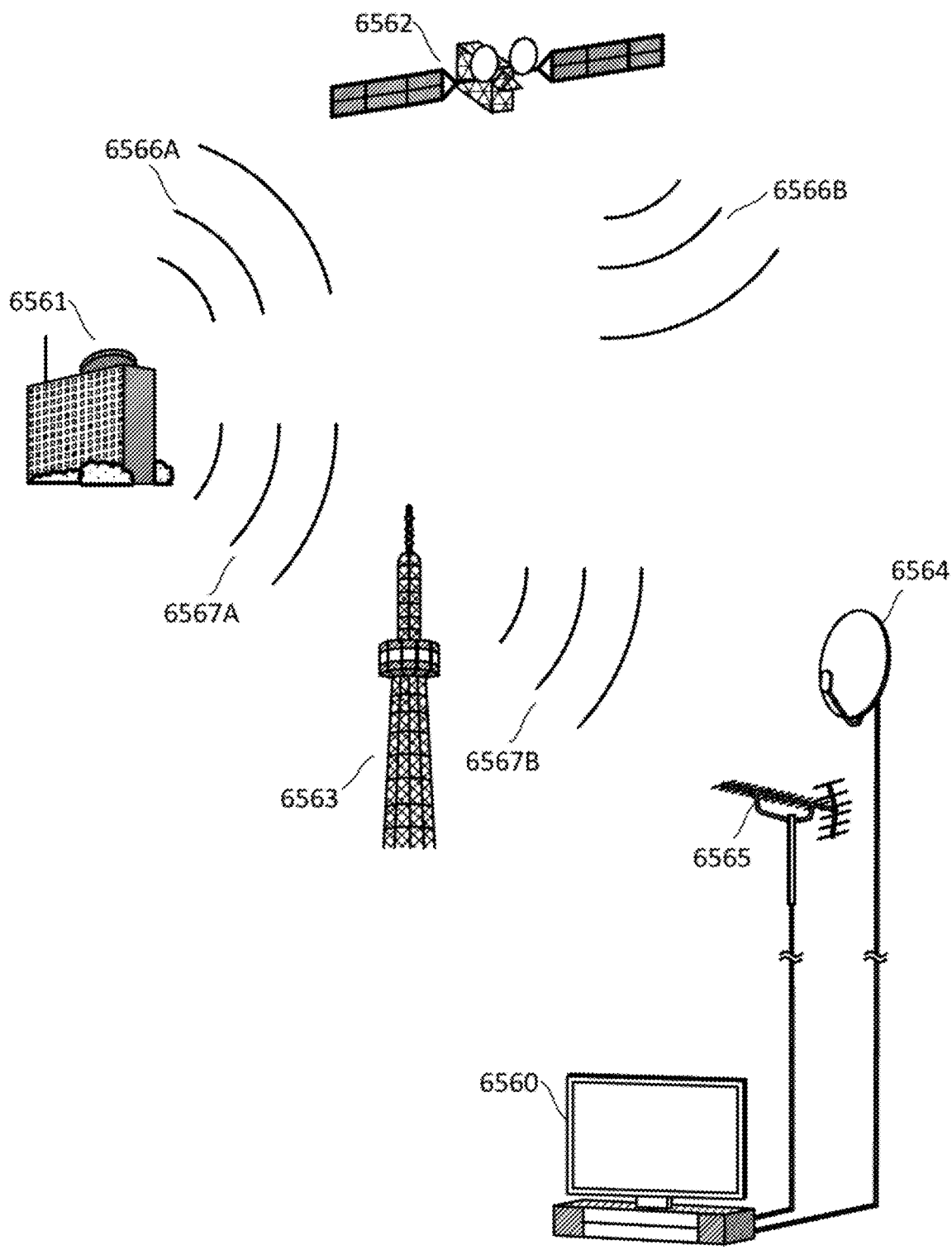
FIG. 24 is a schematic view illustrating data transmission in a broadcast system.

FIG. 24 schematically illustrates data transmission in the broadcast system. FIG. 24 illustrates a path in which a radio wave (a broadcast signal) transmitted from a broadcast station 6561 is delivered to a television receiver (TV) 6560 of every household. The TV 6560 is provided with a receiver and a display device. As examples of an artificial satellite 6562, a communication satellite (CS) and a broadcast satellite (BS) can be given. As examples of an antenna 6564, a BS·110° CS antenna and a CS antenna can be given. Examples of the antenna 6565 include an ultra-high frequency (UHF) antenna.

Radio waves 6566A and 6566B are broadcast signals for a satellite broadcast. When the artificial satellite 6562 receives the radio wave 6566A, the artificial satellite 6562 transmits the radio wave 6566B to the ground. The antenna 6564 of every household receives the radio wave 6566B, and a satellite TV broadcast can be watched on the TV 6560. Alternatively, the radio wave 6566B is received by an antenna of another broadcast station, and a receiver in the broadcast station processes the radio wave 6566B into a signal that can be transmitted to an optical cable. The broadcast station transmits the broadcast signal to the TV 6560 of every household using an optical cable network. Radio waves 6567A and 6567B are broadcast signals for a terrestrial broadcast. A radio wave tower 6563 amplifies the received radio wave 6567A and transmits it as the radio wave 6567B. A terrestrial TV broadcast can be watched on the TV 6560 of every household when the antenna 6565 receives the radio wave 6567B.

Before the radio wave 6566A or the radio wave 6567A is transmitted from the broadcast station 6561, the encoding processing of video data is conducted by an electronic device in the broadcast station 6561. At this time, the pattern recognition of the neural network is utilized to calculate a difference between the image data taken at the previous time and the image data taken this time, so that the data can be compressed.

A video distribution system of this embodiment is not limited to a system for a TV broadcast. Video data to be distributed may be either moving image data or still image data.

Figure 25:
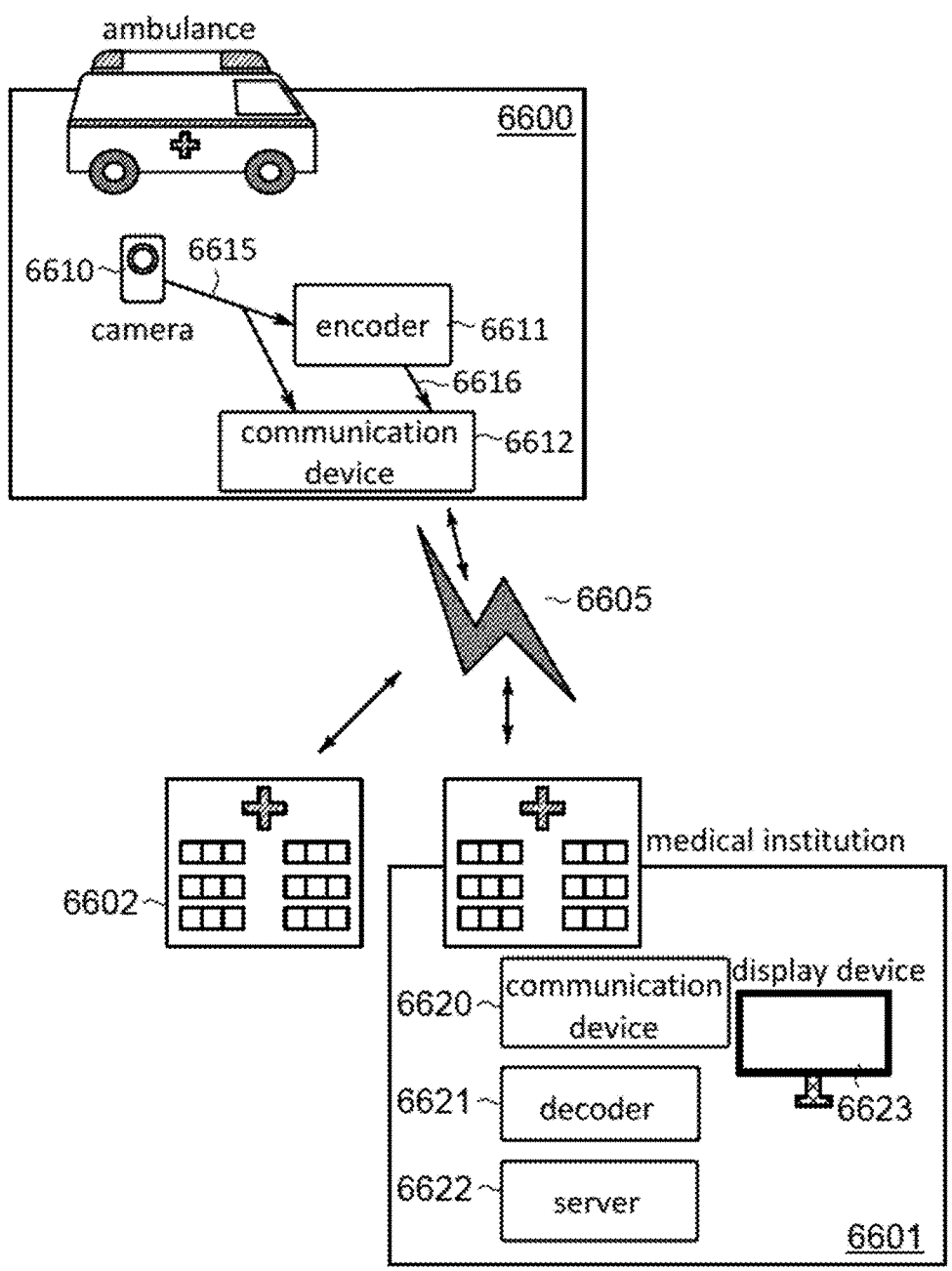
FIG. 25 illustrates a structure example of an image distribution system in the medical field.

For example, video data of a camera may be distributed via a high-speed IP network. The distribution system of the video data can be used in, for example, the medical field for remote diagnosis and remote treatment. Images with higher resolution are demanded for accurate image diagnoses and medical care; images with high resolution, such as 8K, 4K, and 2K images, are thus demanded for images for medical use. FIG. 25 schematically illustrates an emergency medical system that utilizes the video data distribution system.

A high-speed network 6605 performs communication between an emergency transportation vehicle (an ambulance) 6600 and a medical institution 6601 and between the medical institution 6601 and a medical institution 6602. The ambulance 6600 is equipped with a camera 6610, an encoder 6611, and a communication device 6612.

A patient taken to the medical institution 6601 is photographed with the camera 6610. Video data 6615 obtained by the camera 6610 may be transmitted without compression by the communication device 6612. This enables the transmission of the high-resolution video data 6615 to the medical institution 6601 with little delay. In the case where the high-speed network 6605 cannot be used for the communication between the ambulance 6600 and the medical institution 6601, the video data can be encoded with the encoder 6611 and encoded video data 6616 can be transmitted. At this time, the pattern recognition of the neural network is utilized, whereby the video data can be compressed in a manner similar to that of the above broadcast system.

In the medical institution 6601, a communication device 6620 receives the video data transmitted from the ambulance 6600. When the received video data is uncompressed data, the data is transmitted via the communication device 6620 and displayed on a display device 6623. When the video data is compressed data, the data is decompressed with a decoder 6621 and then transmitted to a server 6622 and the display device 6623. Judging from the image on the display device 6623, doctors give instructions to crews of the ambulance 6600 or staff members in the medical institution 6601 who treat the patient. The doctors can check the condition of the patient in detail in the medical institution 6601 while the patient is taken by the ambulance because the distribution system in FIG. 25 can transmit a high-definition image. Therefore, the doctors can instruct the ambulance crews or the staff members appropriately in a short time, resulting in improvement of a lifesaving rate of patients.

The communication of video data between the medical institution 6601 and the medical institution 6602 can be performed in the same way. A medical image obtained from an image diagnostic device (such as CT or MRI) of the medical institution 6601 can be transmitted to the medical institution 6602. Here, the ambulance 6600 is given as an example of the means to transport patients; however, an aircraft such as a helicopter or a vessel may be used.

The electronic device or system described in this embodiment can be combined with any other electronic devices or systems as appropriate.

This embodiment can be combined with any of the other embodiments in this specification as appropriate.

Embodiment 4

In this embodiment, a display device which can be applied to the display portion of the electronic device described in Embodiment 3 will be described with reference to FIGS. 26A to 26D, FIGS. 27A to 27D, FIG. 28, FIG. 29, and FIGS. 30A to 30D.

The display device of this embodiment includes a first display element reflecting visible light and a second display element emitting visible light. The display device has a function of displaying an image using one or both of light reflected by the first display element and light emitted from the second display element.

As the first display element, an element which displays an image by reflecting external light can be used. Such an element does not include a light source and thus power consumption in display can be significantly reduced.

As the first display element, a reflective liquid crystal element can be typically used. As the first display element, other than a micro electro mechanical systems (MEMS) shutter element or an optical interference type MEMS element, an element using a microcapsule method, an electrophoretic method, an electrowetting method, or the like can also be used.

As the second display element, a light-emitting element is preferably used. Since the luminance and the chromaticity of light emitted from such a display element are hardly affected by external light, a clear image that has high color reproducibility (wide color gamut) and a high contrast can be displayed.

As the second display element, a self-luminous light-emitting element such as an organic light-emitting diode (OLED), a light-emitting diode (LED), an inorganic EL element, a quantum-dot light-emitting diode (QLED), and a semiconductor laser (e.g., a nitride semiconductor light-emitting diode) can be used. Note that it is preferable to use a self-luminous light-emitting element as the second display element; however, the second display element is not limited thereto and may be a transmissive liquid crystal element combining a light source, such as a backlight or a sidelight, and a liquid crystal element, for example.

As described above, a display including a light-emitting element and a reflective element as display elements is called an emissive OLED and reflective LC hybrid display or an emission/reflection hybrid display (ER-hybrid display) in this specification. A display including a transmissive liquid crystal element and a reflective liquid crystal element as display elements is called a transmissive LC and reflective LC hybrid display or a transmission/reflection hybrid display (TR-hybrid display). A display device including a light-emitting element and a reflective element as display elements is called a hybrid display device, and a display including the hybrid display device is called a hybrid display.

The display device of this embodiment has a first mode in which an image is displayed using the first display element, a second mode in which an image is displayed using the second display element, and a third mode in which an image is displayed using both the first display element and the second display element. The display device of this embodiment can be switched between the first mode, the second mode, and the third mode automatically or manually. Details of the first to third modes will be described below.

In this specification, hybrid display (display in the third mode) is a method for displaying a letter and/or an image using reflected light and self-emitted light together in one panel that complement the color tone or light intensity of each other. Alternatively, hybrid display is a method for displaying a letter and/or an image using light from a plurality of display elements in one pixel or one subpixel. Note that when a hybrid display performing hybrid display is locally observed, a pixel or a subpixel performing display using any one of the plurality of display elements and a pixel or a subpixel performing display using two or more of the plurality of display elements are included in some cases.

Note that in the present specification and the like, hybrid display satisfies any one or a plurality of the above-described descriptions.

Furthermore, a hybrid display includes a plurality of display elements in one pixel or one subpixel. Note that as an example of the plurality of display elements, a reflective element that reflects light and a self-luminous element that emits light can be given. Note that the reflective element and the self-luminous element can be controlled independently. A hybrid display has a function of displaying a letter and/or an image using one or both of reflected light and self-emitted light in a display portion.

[First Mode]

In the first mode, an image is displayed using the first display element and external light. Since a light source is unnecessary in the first mode, power consumed in this mode is extremely low. When sufficient external light enters the display device (e.g., in a bright environment), for example, an image can be displayed by using light reflected by the first display element. The first mode is effective in the case where external light is white light or near white light and is sufficiently strong, for example. The first mode is suitable for displaying text. Furthermore, the first mode enables eye-friendly display owing to the use of reflected external light, which leads to an effect of easing eyestrain. Note that the first mode may be referred to as reflective display mode (reflection mode) because display is performed using reflected light.

[Second Mode]

In the second mode, an image is displayed utilizing light emitted from the second display element. Thus, an extremely vivid image (with high contrast and excellent color reproducibility) can be displayed regardless of the illuminance and the chromaticity of external light. The second mode is effective in the case of extremely low illuminance, such as in a night environment or in a dark room, for example. When a bright image is displayed in a dark environment, a user may feel that the image is too bright. To prevent this, an image with reduced luminance is preferably displayed in the second mode. Thus, not only a reduction in the luminance but also low power consumption can be achieved. The second mode is suitable for displaying a vivid (still and moving) image or the like. Note that the second mode may be referred to as emission display mode (emission mode) because display is performed using light emission, that is, emitted light.

[Third Mode]

In the third mode, display is performed utilizing both light reflected by the first display element and light emitted from the second display element. Note that display in which the first display element and the second display element are combined can be performed by driving the first display element and the second display element independently from each other during the same period. Note that in this specification and the like, display in which the first display element and the second display element are combined, i.e., the third mode, can be referred to as a hybrid display mode (HB display mode). Alternatively, the third mode may be referred to as a display mode in which an emission display mode and a reflective display mode are combined (ER-Hybrid mode).

By performing display in the third mode, a clearer image than in the first mode can be displayed and power consumption can be lower than in the second mode. For example, the third mode is effective when the illuminance is relatively low such as under indoor illumination or in the morning or evening hours, or when the external light does not represent a white chromaticity. With the use of the combination of reflected light and emitted light, an image that makes a viewer feel like looking at a painting can be displayed.

As described above, in the display device of this embodiment, the first display element displays subtitles and the second display element may display an image as described in the above embodiment. Accordingly, in the case of displaying both subtitles and an image, the display device is driven in the above-described third mode.

In the case of not displaying subtitles, the second display element may display an image; thus, the display device may be driven in the above-described second mode. Note that in the case where the illuminance is high, the first display element may display an image; thus, the display device may be driven not in the second mode but in the first mode.

<Specific Example of First to Third Modes>

Here, a specific example of the case where the above-described first to third modes are employed will be described with reference to FIGS. 26A to 26D and FIGS. 27A to 27D.

Note that the case where the first to third modes are switched automatically depending on the illuminance will be described below. In the case where the modes are switched automatically depending on the illuminance, an illuminance sensor or the like is provided in the display device and the display mode can be switched in response to data from the illuminance sensor, for example.

Figure 26A:
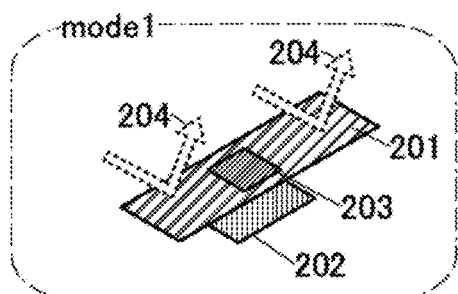
FIGS. 26A to 26D are schematic views illustrating structure examples of a display device.
Figure 26B:
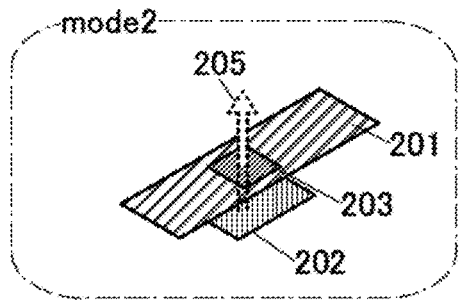
Figure 26C:
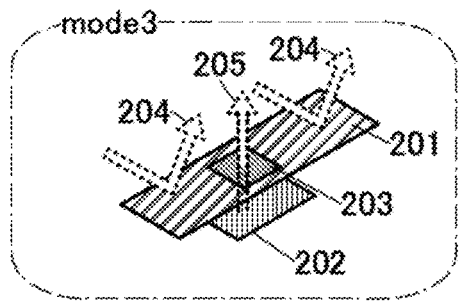

FIGS. 26A to 26C are schematic diagrams of a pixel for describing display modes that are possible for the display device in this embodiment.

In FIGS. 26A to 26C, a first display element 201, a second display element 202, an opening portion 203, reflected light 204 that is reflected by the first display element 201, and transmitted light 205 emitted from the second display element 202 through the opening portion 203 are illustrated. Note that FIG. 26A, FIG. 26B, and FIG. 26C are diagrams illustrating a first mode, a second mode, and a third mode, respectively.

FIGS. 26A to 26C illustrate the case where a reflective liquid crystal element is used as the first display element 201 and a self-luminous OLED is used as the second display element 202.

In the first mode illustrated in FIG. 26A, grayscale display can be performed by driving the reflective liquid crystal element that is the first display element 201 to adjust the intensity of reflected light. For example, as illustrated in FIG. 26A, the intensity of the reflected light 204 reflected by the reflective electrode in the reflective liquid crystal element that is the first display element 201 is adjusted with the liquid crystal layer. In this manner, grayscale can be performed.

In the second mode illustrated in FIG. 26B, grayscale can be expressed by adjusting the emission intensity of the self-luminous OLED that is the second display element 202. Note that light emitted from the second display element 202 passes through the opening portion 203 and is extracted to the outside as the transmitted light 205.

The third mode illustrated in FIG. 26C is a display mode in which the first mode and the second mode which are described above are combined. For example, as illustrated in FIG. 26C, grayscale is expressed in such a manner that the intensity of the reflected light 204 reflected by the reflective electrode in the reflective liquid crystal element that is the first display element 201 is adjusted with the liquid crystal layer. In addition, in a period during which the first display element 201 is driven, grayscale is expressed by adjusting the emission intensity of the self-luminous OLED that is the second display element 202, i.e., the intensity of the transmitted light 205.

[State Transition of First to Third Modes]

Figure 26D:
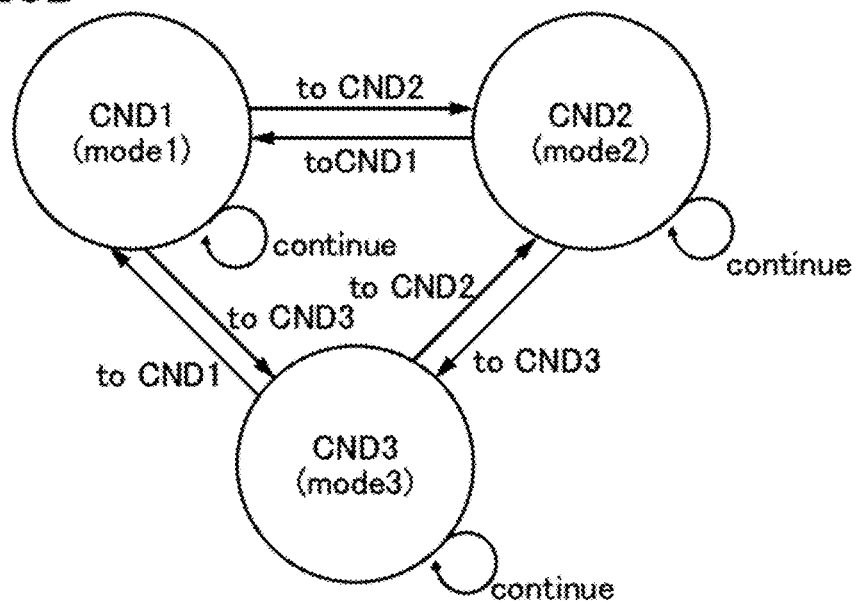

Next, a state transition of the first to third modes will be described with reference to FIG. 26D. FIG. 26D is a state transition diagram of the first mode, the second mode, and the third mode. In FIG. 26D, a state CND1, a state CND2, and a state CND3 correspond to the first mode, the second mode, and the third mode, respectively.

As shown in FIG. 26D, any of the display modes can be selected with illuminance in the states CND1 to CND3. For example, under a high illuminance such as in the day time, the state can be brought into the state CND1. In the case where the illuminance decreases as time passes from day to night, the state CND1 transitions to the state CND2. In the case where the 1 illuminance is low even in the day time and grayscale display with reflected light is not sufficient, the state CND2 transitions to the state CND3. Needless to say, transition from the state CND3 to the state CND1, transition from the state CND1 to the state CND3, transition from the state CND3 to the state CND2, or transition from the state CND2 to the state CND1 also occurs.

As shown in FIG. 26D, in the case where the illuminance does not change or slightly changes in the states CND1 to CND3, the present state may be maintained without transitioning to another state.

The above structure of switching the display mode in accordance with illuminance contributes to a reduction in the frequency of grayscale display with the intensity of light emitted from the light-emitting element, which requires a relatively high power consumption. Accordingly, the power consumption of the display device can be reduced. In the display device, the operation mode can be further switched in accordance with the amount of remaining battery power, the contents to be displayed, or the illuminance of the surrounding environment. Although the case where the display mode is automatically switched with illuminance is described above as an example, one embodiment of the present invention is not limited thereto, and a user may switch the display mode manually.

<Operation Mode>

Next, an operation mode which can be employed in the first display element and the second display element will be described with reference to FIGS. 27A to 27D.

A normal driving mode (Normal mode) with a normal frame frequency (typically, higher than or equal to 60 Hz and lower than or equal to 240 Hz) and an idling stop (IDS) driving mode with a low frame frequency will be described below.

Note that the idling stop (IDS) driving mode refers to a driving method in which after image data is written, rewriting of image data is stopped. This increases the interval between writing of image data and subsequent writing of image data, thereby reducing the power that would be consumed by writing of image data in that interval. The idling stop (IDS) driving mode can be performed at a frame frequency which is $\frac{1}{100}$ to $\frac{1}{10}$ of the normal driving mode, for example.

Figure 27A:
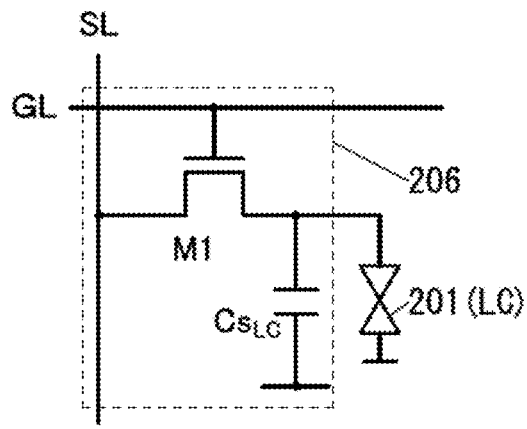
FIGS. 27A to 27D are circuit diagrams and timing charts illustrating a structure example of a display device.
Figure 27B:
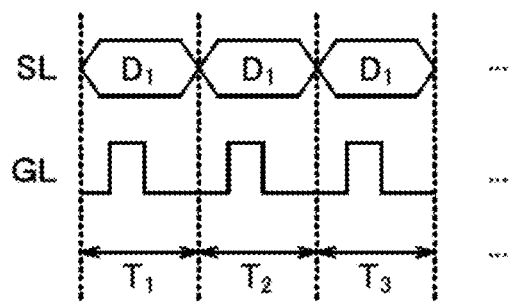
Figure 27C:
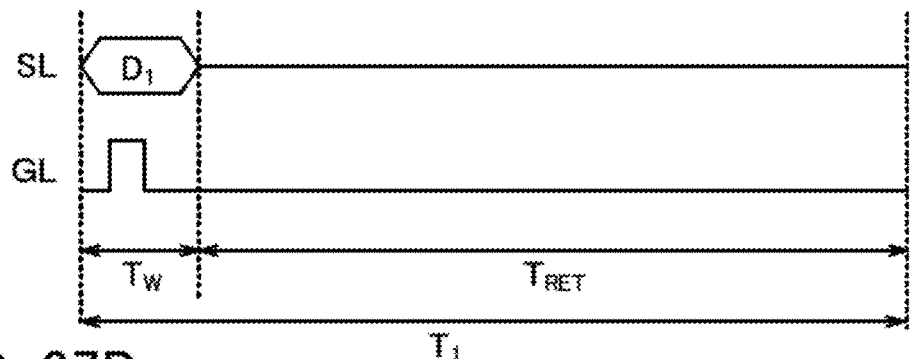

FIGS. 27A to 27C are a circuit diagram and timing charts illustrating the normal driving mode and the idling stop (IDS) driving mode. Note that in FIG. 27A, the first display element 201 (here, a liquid crystal element) and a pixel circuit 206 electrically connected to the first display element 201 are illustrated. In the pixel circuit 206 illustrated in FIG.

27A, a signal line SL, a gate line GL, a transistor M1 connected to the signal line SL and the gate line GL, and a capacitor $C_{SLC}$ connected to the transistor M1 are illustrated.

A transistor including a metal oxide in a semiconductor layer is preferably used as the transistor M1. As a typical example of a transistor, a transistor including an oxide semiconductor, which is a kind of a metal oxide, (OS transistor) will be described. The OS transistor has an extremely low leakage current in an off state (off-state current), so that charge can be retained in a pixel electrode of a liquid crystal element when the OS transistor is turned off.

FIG. 27B is a timing chart showing waveforms of signals supplied to the signal line SL and the gate line GL in the normal driving mode. In the normal driving mode, a normal frame frequency (e.g., 60 Hz) is used for operation. In the case where one frame period is divided into periods $T_1$ to $T_3$, a scanning signal is supplied to the gate line GL in each frame period and data $D_1$ is written from the signal line SL. This operation is performed both to write the same data $D_1$ in the periods $T_1$ to $T_3$ and to write different data in the periods $T_1$ to $T_3$.

FIG. 27C is a timing chart showing waveforms of signals supplied to the signal line SL and the gate line GL in the idling stop (IDS) driving mode. In the idling stop (IDS) driving, a low frame frequency (e.g., 1 Hz) is used for operation. One frame period is denoted by a period $T_1$ and includes a data writing period $T_W$ and a data retention period $T_{RET}$. In the idling stop (IDS) driving mode, a scanning signal is supplied to the gate line GL and the data $D_1$ of the signal line SL is written in the period $T_W$, the gate line GL is fixed to a low-level voltage in the period $T_{RET}$, and the transistor M1 is turned off so that the written data $D_1$ is retained.

The idling stop (IDS) driving mode is effective in combination with the aforementioned first mode or third mode, in which case power consumption can be further reduced.

Figure 27D:
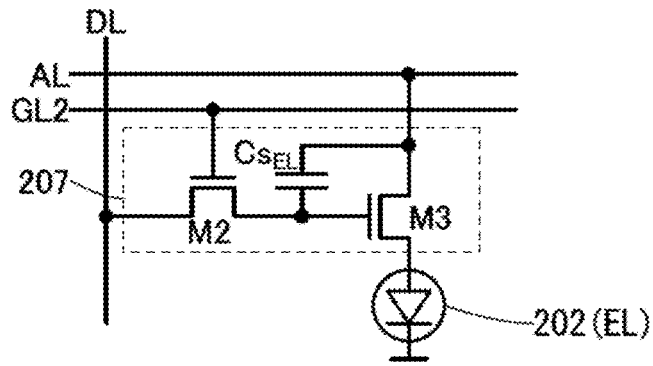

FIG. 27D illustrates the second display element 202 (here, an organic EL element) and a pixel circuit 207 electrically connected to the second display element. In the pixel circuit 207 illustrated in FIG. 27D, a signal line DL, a gate line GL2, a current supply line AL, a transistor M2 electrically connected to the signal line DL and the gate line GL2, a capacitor $C_{SEL}$ electrically connected to the transistor M2 and the current supply line AL, and a transistor M3 electrically connected to the transistor M2, the capacitor $C_{SEL}$, the current supply line AL, and the second display element 202 are illustrated.

The transistor M2 is preferably an OS transistor like the transistor M1. The OS transistor has an extremely low leakage current in an off state (off-state current), so that charge can be retained in the capacitor $C_{SEL}$ when the OS transistor is in an off state. In other words, the gate-drain voltage of the transistor M3 can be kept constant, whereby the emission intensity of the second display element 202 can be constant.

Therefore, as in the idling stop (IDS) driving of the first display element, a scan signal is supplied to the gate line GL2, the gate line GL2 is set at a low-level voltage after data is written from the signal line DL, and the transistor M2 is turned off and the written data is retained in the idling stop (IDS) driving of the second display element.

The transistor M3 is preferably formed using a material similar to that of the transistor M2. The use of the same material in the transistor M3 and the transistor M2 can shorten the fabrication process of the pixel circuit 207.

The idling stop (IDS) driving mode is effective in combination with the aforementioned first to third modes, in which case power consumption can be further reduced.

As described above, the display device of this embodiment can display an image by switching between the first to third modes. Thus, an all-weather display device or a highly convenient display device with high visibility regardless of the ambient brightness can be fabricated.

The display device of this embodiment preferably includes a plurality of first pixels including first display elements and a plurality of second pixels including second display elements. The first pixels and the second pixels are preferably arranged in matrices.

Each of the first pixels and the second pixels can include one or more subpixels. The pixel can include, for example, one subpixel (e.g., a white (W) subpixel), three subpixels (e.g., red (R), green (G), and blue (B) subpixels), or four subpixels (e.g., red (R), green (G), blue (B), and white (W) subpixels, or red (R), green (G), blue (B), and yellow (Y) subpixels). Note that color elements included in the first and second pixels are not limited to the above, and may be combined with another color such as cyan (C), magenta (M), or the like as necessary.

The display device of this embodiment can be configured to display a full color image using either the first pixels or the second pixels. Alternatively, the display device of this embodiment can be configured to display a black-and-white image or a grayscale image using the first pixels and can display a full-color image using the second pixels. The first pixels that can be used for displaying a black-and-white image or a grayscale image are suitable for displaying information that need not be displayed in color such as text information.

<Schematic Perspective View of Display Device>

Figure 28:
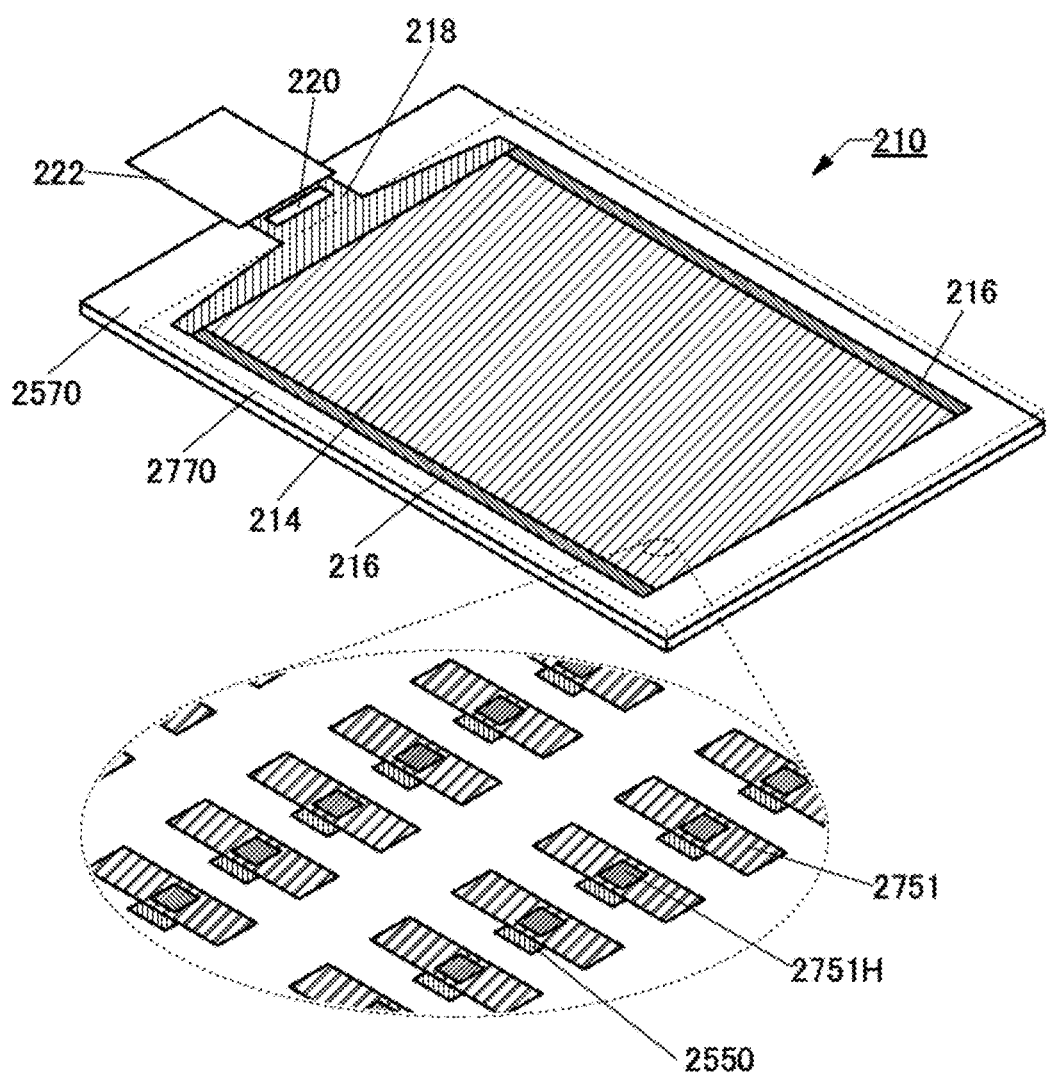
FIG. 28 is a perspective view illustrating an example of a display device.

Next, a display device of this embodiment is described with reference to FIG. 28. FIG. 28 is a schematic perspective view of a display device 210.

In the display device 210, a substrate 2570 and a substrate 2770 are attached to each other. In FIG. 28, the substrate 2770 is denoted by a dashed line.

The display device 210 includes a display portion 214, a circuit 216, a wiring 218, and the like. FIG. 28 illustrates an example in which the display device 210 is provided with an IC 220 and an FPC 222. Thus, the structure illustrated in FIG. 28 can be regarded as a display module including the display device 210, the IC 220, and the FPC 222.

As the circuit 216, for example, a scan line driver circuit can be used.

The wiring 218 has a function of supplying a signal and power to the display portion 214 and the circuit 216. The signal and the power are input to the wiring 218 from the outside through the FPC 222 or from the IC 220.

FIG. 28 illustrates an example in which the IC 220 is provided over the substrate 2570 by a chip on glass (COG) method, a chip on film (COF) method, or the like. An IC including a scan line driver circuit, a signal line driver circuit, or the like can be used as the IC 220, for example. Note that the display device 210 is not necessarily provided with the IC 220. The IC 220 may be mounted on the FPC by a COF method or the like.

FIG. 28 also illustrates an enlarged view of part of the display portion 214. Electrodes 2751 included in a plurality of display elements are arranged in a matrix in the display portion 214. The electrodes 2751 have a function of reflecting visible light, and serve as reflective electrodes of a first display element 2750 (described later).

Furthermore, as illustrated in FIG. 28, the electrode 2751 includes a region 2751H as an opening. In addition, as a light-emitting element, the display portion 214 includes a second display element 2550 that is positioned closer to the substrate 2570 than the electrode 2751 is. Light from the second display element 2550 is emitted to the substrate 2770 side through the region 2751H of the electrode 2751. The area of a light-emitting region in the second display element 2550 may be equal to that of the region 2751H. One of the area of the light-emitting region in the second display element 2550 and the area of the region 2751H is preferably larger than the other because a margin for misalignment can be increased.

A structure of an input/output panel in which a touch sensor unit is provided in the display device 210 illustrated in FIG. 28 will be described with reference to FIG. 29 and FIGS. 30A to 30D.

Figure 29:
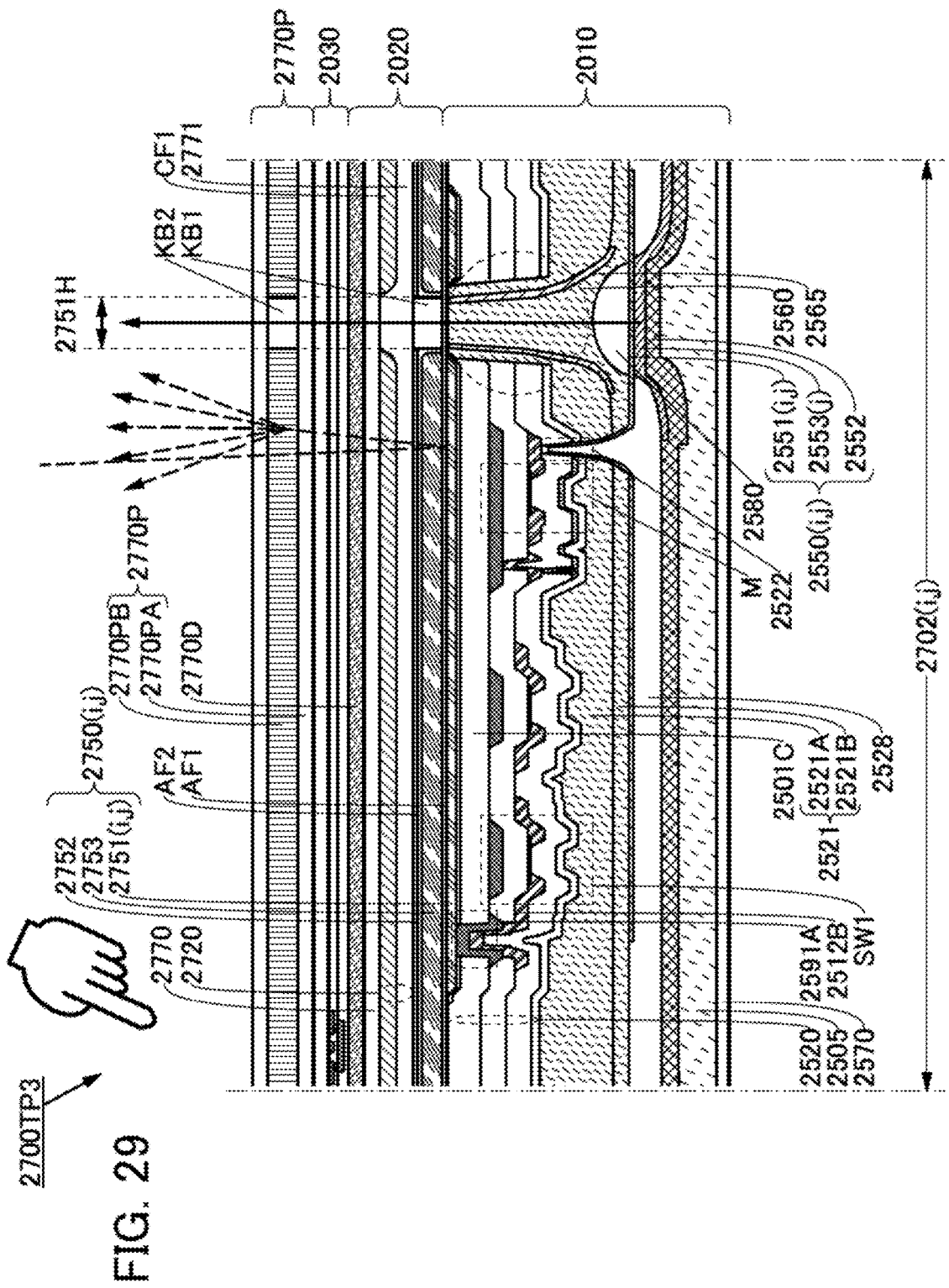
FIG. 29 is a cross-sectional view illustrating a structure example of an input/output panel.

FIG. 29 is a cross-sectional view of a pixel included in an input/output panel 2700TP3.

Figure 30A:
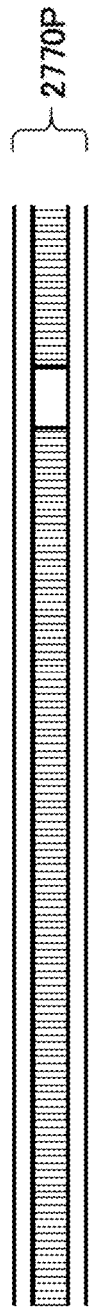
FIGS. 30A to 30D are cross-sectional views illustrating a structure example of an input/output panel.
Figure 30B:
Figure 30C:
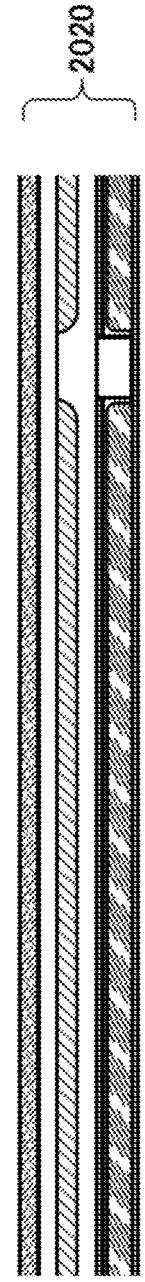
Figure 30D:
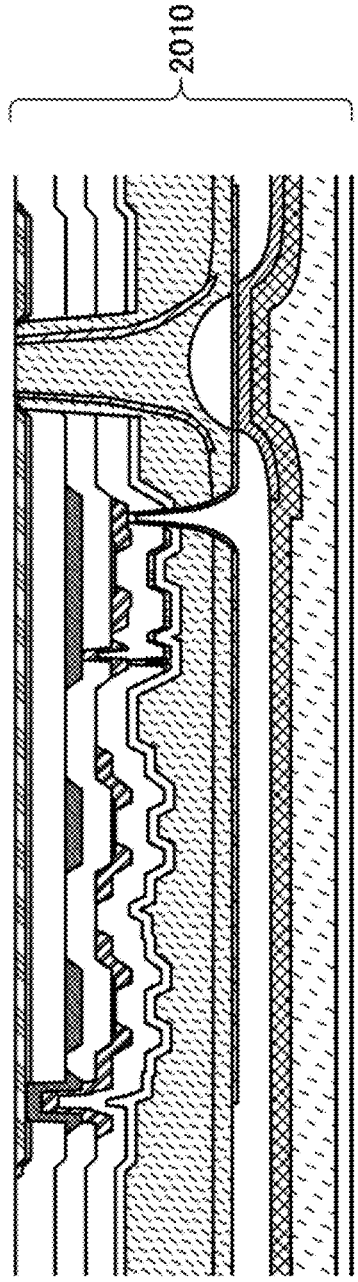

FIGS. 30A to 30D illustrate the structure of the input/output panel of one embodiment of the present invention. FIG. 30A is a cross-sectional view illustrating a structure of a functional film of the input/output panel illustrated in FIG. 29, FIG. 30B is a cross-sectional view illustrating a structure of an input unit, FIG. 30C is a cross-sectional view illustrating a structure of a second unit, and FIG. 30D is a cross-sectional view illustrating a structure of a first unit.

The input/output panel 2700TP3 described in this structure example includes a pixel 2702(i,j) (see FIG. 29). The input/output panel 2700TP3 includes a first unit 2010, a second unit 2020, an input unit 2030, and a functional film 2770P (see FIGS. 30A to 30D). The first unit 2010 includes a functional layer 2520, and the second unit 2020 includes a functional layer 2720.

<<Pixel 2702(i,j)>>

The pixel 2702(i,j) includes a portion of the functional layer 2520, a first display element 2750(i,j), and a second display element 2550(i,j) (see FIG. 29).

The functional layer 2520 includes a first conductive film, a second conductive film, an insulating film 2501C, and a pixel circuit. The pixel circuit includes the transistor M, for example. The functional layer 2520 includes an optical element 2560, a covering film 2565, and a lens 2580. The functional layer 2520 includes an insulating film 2528 and an insulating film 2521. A stack including an insulating film 2521A and an insulating film 2521B can be used as the insulating film 2521.

For example, a material whose refractive index is around 1.55 can be used for the insulating film 2521A or the insulating film 2521B. Alternatively, a material whose refractive index is around 1.6 can be used for the insulating film 2521A or the insulating film 2521B. Further alternatively, an acrylic resin or polyimide can be used for the insulating film 2521A or the insulating film 2521B.

The insulating film 2501C includes a region positioned between the first conductive film and the second conductive film and has an opening 2591A.

The first conductive film is electrically connected to the first display element 2750(i,j). Specifically, the first conductive film is electrically connected to an electrode 2751(i,j) of the first display element 2750(i,j). The electrode 2751(i,j) can be used as the first conductive film.

The second conductive film includes a region overlapping with the first conductive film. The second conductive film is electrically connected to the first conductive film through the opening 2591A. For example, the conductive film 2512B can be used as the second conductive film. The second conductive film is electrically connected to the pixel circuit. For example, a conductive film which functions as a source electrode or a drain electrode of a transistor used as a switch SW1 of the pixel circuit can be used as the second conductive film. Note that the first conductive film electrically connected to the second conductive film in the opening 2591A that is formed in the insulating film 2501C can be referred to as a through electrode.

The second display element 2550(i,j) is electrically connected to the pixel circuit. The second display element 2550(i,j) has a function of emitting light toward the functional layer 2520. The second display element 2550(i,j) has a function of emitting light toward the lens 2580 or the optical element 2560, for example.

The second display element 2550(i,j) is provided so that the display using the second display element 2550(i,j) can be seen from part of a region from which the display using the first display element 2750(i,j) can be seen. For example, the electrode 2751(i,j) of the first display element 2750(i,j) includes the region 2751H where light emitted from the second display element 2550(i,j) is not blocked. Note that dashed arrows illustrated in FIG. 29 denote the directions in which external light is incident on and reflected by the first display element 2750(i,j) that displays image data by controlling the intensity of external light reflection. In addition, a solid arrow illustrated in FIG. 29 denotes the direction in which the second display element 2550(i,j) emits light to the part of the region from which the display using the first display element 2750(i,j) can be seen.

Accordingly, display using the second display element can be seen from part of the region where display using the first display element can be seen. Alternatively, a user can see display without changing the attitude or the like of the input/output panel. Alternatively, an object color expressed by light reflected by the first display element and a light source color expressed by light emitted from the second display element can be mixed. Alternatively, an object color and a light source color can be used to display an image like a painting. As a result, a novel input/output panel that is highly convenient or reliable can be provided.

For example, the first display element 2750(i,j) includes the electrode 2751(i,j), an electrode 2752, and a layer 2753 containing a liquid crystal material. The first display element 2750(i,j) further includes an alignment film AF1 and an alignment film AF2. Specifically, a reflective liquid crystal element can be used as the first display element 2750(i,j).

For example, a transparent conductive film whose refractive index is around 2.0 can be used as the electrode 2752 or the electrode 2751(i,j). Specifically, an oxide including indium, tin, and silicon can be used for the electrode 2752 or the electrode 2751(i,j). Alternatively, a material whose refractive index is around 1.6 can be used for the alignment film. The dielectric anisotropy and resistivity of the liquid crystal layer are preferably greater than or equal to 2 and less than or equal to 3.8 and higher than or equal to $1.0 \times 10^{14}$ $\Omega \cdot cm$ and lower than or equal to $1.0 \times 10^{15}$ $\Omega \cdot cm$, respectively. In that case, the IDS driving can be performed and power consumption of the input/output panel can be reduced.

For example, the second display element 2550(i,j) includes an electrode 2551(i,j), an electrode 2552, and a layer 2553(j) containing a light-emitting material. The electrode 2552 includes a region overlapping with the electrode 2551(i,j). The layer 2553(j) containing a light-emitting material includes a region positioned between the electrode 2551(i,j) and the electrode 2552. The electrode 2551(i,j) is electrically connected to the pixel circuit at a connection portion 2522. Specifically, an organic EL element can be used as the second display element 2550(i,j).

For example, a transparent conductive film having a refractive index of around 2.0 can be used as the electrode 2551(i,j). Specifically, an oxide including indium, tin, and silicon can be used for the electrode 2551(i,j). Alternatively, a material whose refractive index is around 1.8 can be used for the layer 2553(j) containing a light-emitting material.

The optical element 2560 has a light-transmitting property and includes a first region, a second region, and a third region.

The first region includes a region to which visible light is supplied from the second display element 2550(i,j), the second region includes a region in contact with the covering film 2565, and the third region has a function of emitting part of visible light. The third region has an area smaller than or equal to the area of the region of the first region to which visible light is supplied.

The covering film 2565 has reflectivity with respect to visible light and has a function of reflecting part of visible light and supplying it to the third region.

For example, a metal can be used for the covering film 2565. Specifically, a material containing silver can be used for the covering film 2565. For example, a material containing silver, palladium, and the like or a material containing silver, copper, and the like can be used for the covering film 2565.

<<Lens 2580>>

A material that transmits visible light can be used for the lens 2580. Alternatively, a material whose refractive index is greater than or equal to 1.3 and less than or equal to 2.5 can be used for the lens 2580. For example, an inorganic material or an organic material can be used for the lens 2580.

For example, a material including an oxide or a sulfide can be used for the lens 2580.

Specifically, cerium oxide, hafnium oxide, lanthanum oxide, magnesium oxide, niobium oxide, tantalum oxide, titanium oxide, yttrium oxide, zinc oxide, an oxide including indium and tin, an oxide including indium, gallium, and zinc, or the like can be used for the lens 2580. Alternatively, zinc sulfide or the like can be used for the lens 2580.

For example, the lens 2580 can be formed using a material including resin. Specifically, the lens 2580 can be formed using a resin to which chlorine, bromine, or iodine is introduced, a resin to which a heavy metal atom is introduced, a resin to which an aromatic ring is introduced, a resin to which sulfur is introduced, or the like. Alternatively, the lens 2580 can be formed using a stack of a resin and a resin whose refractive index is higher than that of the above-described resin. Alternatively, the resin having high refractive index may be a resin containing a nanoparticle. Titanium oxide, zirconium oxide, or the like can be used for the nanoparticle.

<<Functional Layer 2720>>

The functional layer 2720 includes a region positioned between the substrate 2770 and the insulating film 2501C. The functional layer 2720 further includes an insulating film 2771 and a coloring film CF1.

The coloring film CF1 includes a region positioned between the substrate 2770 and the first display element 2750(i,j).

The insulating film 2771 includes a region positioned between the coloring film CF1 and the layer 2753 containing a liquid crystal material. The insulating film 2771 can reduce unevenness due to the thickness of the coloring film CF1. Furthermore, the insulating film 2771 can prevent impurities from diffusing from the coloring film CF1 or the like to the layer 2753 containing a liquid crystal material.

For example, an acrylic resin whose refractive index is around 1.55 can be used for the insulating film 2771.

<<Substrate 2570 and Substrate 2770>>

The input/output panel described in this embodiment includes a substrate 2570 and the substrate 2770.

The substrate 2770 includes a region overlapping with the substrate 2570. The substrate 2770 includes a region provided so that the functional layer 2520 is positioned between the substrate 2770 and the substrate 2570.

The substrate 2770 includes a region overlapping with the first display element 2750(i,j). For example, a material with low birefringence can be used for the region.

For example, a resin material whose refractive index is around 1.5 can be used for the substrate 2770.

<<Bonding Layer 2505>>

The input/output panel described in this embodiment also includes a bonding layer 2505.

The bonding layer 2505 includes a region positioned between the functional layer 2520 and the substrate 2570, and has a function of bonding the functional layer 2520 and the substrate 2570 together.

<<Structure Body KB1 and Structure Body KB2>>

The input/output panel described in this embodiment includes a structure body KB1 and a structure body KB2.

The structure body KB1 has a function of providing a certain space between the functional layer 2520 and the substrate 2770. The structure body KB1 includes a region overlapping with the region 2751H and has a light-transmitting property. Thus, light emitted from the second display element 2550(i,j) can be supplied to one surface of the structure body KB1 and emitted from the other surface.

Furthermore, the structure body KB1 includes a region overlapping with the optical element 2560 and is formed using a material whose refractive index is different from that of a material used for the optical element 2560 by 0.2 or less, for example. Thus, light emitted from the second display element 2550(i,j) can be efficiently utilized. The area of the second display element 2550(i,j) can be increased. The density of current flowing through the organic EL element can be decreased.

The structure body KB2 has a function of controlling the thickness of a polarizing layer 2770PB to a predetermined thickness. The structure body KB2 includes a region overlapping with the second display element 2550(i,j) and has a light-transmitting property.

Alternatively, a material that transmits light of a predetermined color can be used for the structure body KB1 or KB2. Thus, the structure body KB1 or KB2 can be used, for example, as a color filter. For example, a material that transmits blue light, green light, or red light can be used for the structure body KB1 or KB2. A material that transmits yellow light, white like, or the like can be used for the structure body KB1 or KB2.

Specifically, for the structure body KB1 or KB2, polyester, polyolefin, polyamide, polyimide, polycarbonate, polysiloxane, an acrylic resin, or the like, or a composite material of a plurality of resins selected from these can be used. Alternatively, a photosensitive material may be used.

For example, an acrylic resin whose refractive index is around 1.5 can be used for the structure body KB1. An acrylic resin whose refractive index is around 1.55 can be used for the structure body KB2.

<<Input Unit 2030>>

The input unit 2030 includes a sensor element. The sensor element has a function of sensing an object that approaches a region overlapping with the pixel 2702(i,j). Thus, a finger or the like is used as a pointer to input positional data on the screen by approaching the display portion.

For example, a capacitive proximity sensor, an electromagnetic inductive proximity sensor, an optical proximity sensor, a resistive proximity sensor, or a surface acoustic wave proximity sensor can be used as the input unit 2030. Specifically, a surface capacitive proximity sensor, a projection capacitive proximity sensor, an infrared light detection type proximity sensor, or the like can be used.

For example, a touch sensor which includes a capacitive proximity sensor and whose refractive index is around 1.6 can be used as the input unit 2030.

<<Functional Film 2770D, Functional Film 2770P, and the Like>>

The input/output panel 2700TP3 described in this embodiment includes a functional film 2770D and the functional film 2770P.

The functional film 2770D includes a region overlapping with the first display element 2750(i,j). The functional film 2770D includes a region provided so that the first display element 2750(i,j) is positioned between the functional film 2770D and the functional layer 2520.

For example, a light diffusion film can be used as the functional film 2770D. Specifically, a material with a columnar structure having an axis along the direction intersecting a surface of a substrate can be used for the functional film 2770D. In that case, light can be easily transmitted in the direction along the axis and scattered in other directions. For example, light reflected by the first display element 2750(i,j) can be diffused.

The functional film 2770P includes the polarizing layer 2770PB, a retardation film 2770PA, and the structure body KB2. The polarizing layer 2770PB includes an opening, and the retardation film 2770PA includes a region overlapping with the polarizing layer 2770PB. Note that the structure body KB2 is provided in the opening.

For example, a dichromatic pigment, a liquid crystal material, and a resin can be used for the polarizing layer 2770PB. The polarizing layer 2770PB has a polarization property. In that case, the functional film 2770P can be used as a polarizing plate.

The polarizing layer 2770PB includes a region overlapping with the first display element 2750(i,j), and the structure body KB2 includes a region overlapping with the second display element 2550(i,j). Thus, a liquid crystal element can be used as the first display element. For example, a reflective liquid crystal element can be used as the first display element. Light emitted from the second display element can be extracted efficiently. The density of current flowing through the organic EL element can be decreased. The reliability of the organic EL element can be increased.

For example, an anti-reflection film, a polarizing film, or a retardation film can be used as the functional film 2770P. Specifically, a film including a dichromatic pigment and a retardation film can be used as the functional film 2770P.

Alternatively, an antistatic film preventing the attachment of a foreign substance, a water repellent film suppressing the attachment of stain, a hard coat film suppressing a scratch in use, or the like can be used as the functional film 2770P.

For example, a material whose refractive index is around 1.6 can be used for the diffusion film. A material whose refractive index is around 1.6 can be used for the retardation film 2770PA.

This embodiment can be combined with any of the other embodiments in this specification as appropriate.

Embodiment 5

In this embodiment, a transistor described in this specification or the like will be described with reference to FIGS. 31A to 31C, FIGS. 32A to 32C, FIGS. 33A to 33C, FIGS. 34A to 34C, FIG. 35, and FIGS. 36A to 36C.

Transistors of one embodiment of the present invention each preferably include a CAC-OS, which is described in Embodiment 6.

<Transistor Structure 1>

Figure 31A:
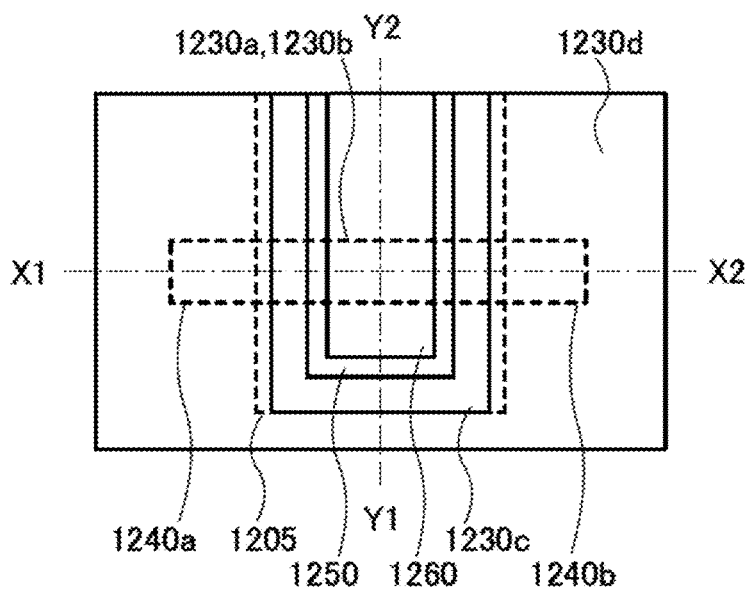
FIGS. 31A to 31C are a top view and cross-sectional views illustrating a structural example of a transistor.
Figure 31B:
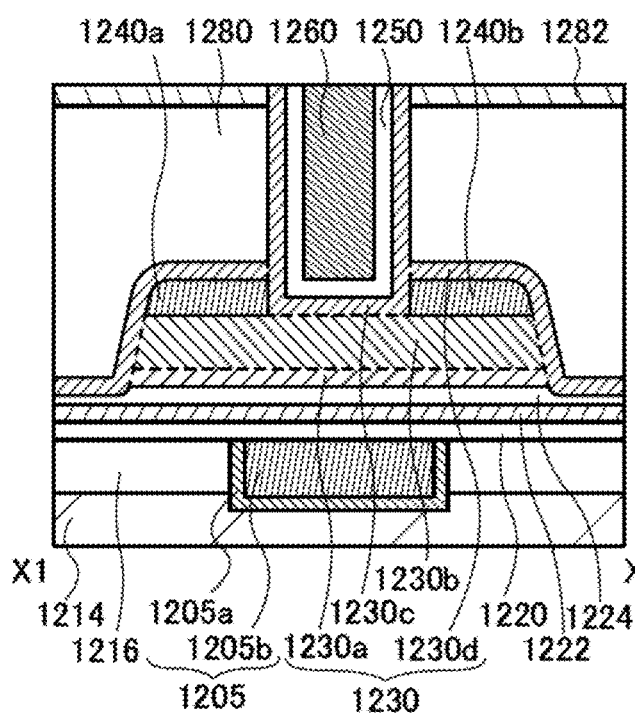
Figure 31C:
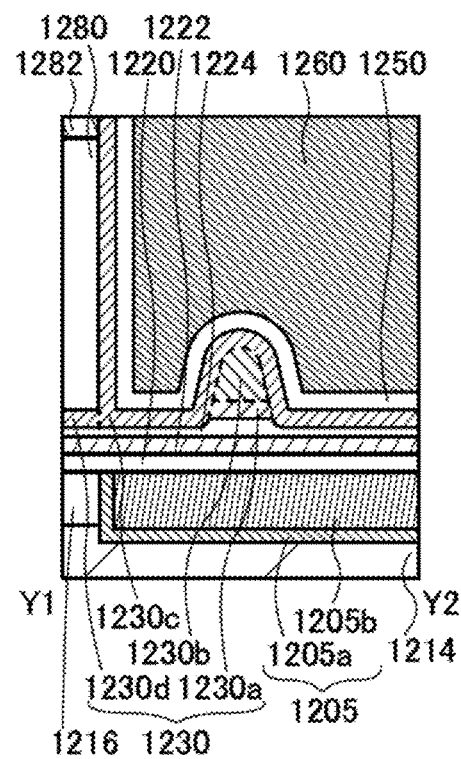

An example of transistors of one embodiment of the present invention will be described below. FIG. 31A is a top view of a transistor 1200A. Note that for simplification of the drawing, some films in FIG. 31A are not illustrated. FIG. 31B is a cross-sectional view taken along dashed-dotted line X1-X2 in FIG. 31A. FIG. 31C is a cross-sectional view taken along dashed-dotted line Y1-Y2 in FIG. 31A. Note that the direction of the dashed-dotted line X1-X2 may be called the channel length direction, and the direction of the dashed-dotted line Y1-Y2 may be called the channel width direction.

The transistor 1200A includes a conductor 1205 (conductors 1205a and 1205b) that functions as a back gate electrode; a conductor 1260 that functions as a gate electrode; an insulator 1220, an insulator 1222, an insulator 1224, and an insulator 1250 that function as gate insulating layers; an oxide 1230 (oxides 1230a, 1230b, and 1230c) that includes a region where a channel is formed; a conductor 1240a that functions as one of a source and a drain; a conductor 1240b that functions as the other of the source and the drain; an insulator 1280 that includes excess oxygen; and an insulator 1214, an insulator 1216, and an insulator 1282 that have a barrier property with respect to hydrogen or oxygen.

The oxide 1230 includes the oxide 1230a, the oxide 1230b over the oxide 1230a, the oxide 1230c over the oxide 1230b, and an oxide 1230d over the conductors 1240a and 1240b, the oxides 1230a and 1230b, and the insulator 1224. When the transistor 1200A is turned on, current flows (a channel is formed) mainly in the oxide 1230b. Although current sometimes flows through a region in the vicinity of the interface (a mixed region in some cases) between the oxide 1230b and the oxides 1230a and 1230c, the oxides 1230a and 1230c function as insulators at the other region in some cases.

The conductor 1240a, the conductor 1240b, and the oxide 1230c are in contact with the insulator 1280 having the oxygen-excess region with the oxide 1230d located therebetween. Thus, since the oxide 1230d exists between the insulator 1280 and the oxide 1230b including the region where the channel is formed, impurities such as hydrogen, water, and halogen can be prevented from diffusing from the insulator 1280 into the oxide 1230b.

As illustrated in FIGS. 31A to 31C, the oxide 1230c is preferably provided to cover side surfaces of the oxides 1230a and 1230b. Thus, since the oxide 1230c exists between the insulator 1280 and the oxide 1230b including the region where the channel is formed, impurities such as hydrogen, water, and halogen can be prevented from diffusing from the insulator 1280 into the oxide 1230b.

In the transistor 1200A, the oxide 1230c, the insulator 1250, and the conductor 1260 are formed in an opening formed in the insulator 1280. Furthermore, an end portion of each of the conductor 1240a and the conductor 1240b is aligned with an end portion of the opening formed in the insulator 1280. Furthermore, the end portion of each of the conductor 1240a and the conductor 1240b is aligned with part of an end portion of the oxide 1230. Thus, the conductors 1240*a* and 1240*b* can be formed concurrently with the oxide 1230 or the opening in the insulator 1280. This leads to a reduction in the number of masks and steps and improvement in yield and productivity.

The conductor 1205 that functions as a back gate electrode can be formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like. In particular, a metal nitride film such as a tantalum nitride film is preferable because it has a barrier property with respect to hydrogen or oxygen and is difficult to oxidize (has high oxidation resistance). Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

For example, a conductor having a barrier property with respect to hydrogen, e.g., tantalum nitride, may be used as the conductor 1205*a*, and tungsten, which has high conductivity, may be stacked thereover as the conductor 1205*b*. The use of the combination of the materials can prevent diffusion of hydrogen into the oxide 1230 while conductivity of a wiring is ensured. Although the two-layer structure formed of the conductors 1205*a* and 1205*b* is illustrated in FIGS. 31A to 31C, one embodiment of the present invention is not limited to this structure, and a single-layer structure or a structure of three or more stacked layers may be employed. For example, a structure where a conductor having a barrier property and a conductor with high conductivity are provided with a conductor which is highly adhesive to the conductor having a barrier property and the conductor with high conductivity positioned therebetween may be employed.

As the insulator 1214, metal oxide such as aluminum oxide, hafnium oxide, or tantalum oxide is preferably used. In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the oxide 1230 in and after a manufacturing process of the transistor. In addition, release of oxygen from the oxide 1230 in the transistor 1200A can be prevented. Therefore, aluminum oxide is suitably used for a protective film for the oxide 1230.

Each of the insulators 1216, 1220, and 1224 is preferably an insulator containing oxygen, such as a silicon oxide film or a silicon oxynitride film. In particular, the insulator 1224 is preferably an insulator containing excess oxygen (containing oxygen in excess of that in the stoichiometric composition). In the case where such an insulator containing excess oxygen is provided in contact with the oxide 1230 in the transistor 1200A, oxygen vacancies in the oxide 1230 can be compensated. Note that the insulators 1222 and 1224 are not necessarily formed of the same material.

For example, the insulator 1222 is preferably formed with a single layer or a stack using an insulator containing a material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST). In particular, an insulating film having a barrier property against oxygen or hydrogen, e.g., an aluminum oxide film or a hafnium oxide film, is preferably used. The insulator 1222 formed of such a material functions as a layer that prevents release of oxygen from the oxide 1230 and entry of an impurity such as hydrogen from the outside.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

Note that the insulator 1220, the insulator 1222, and the insulator 1224 may have a stacked-layer structure of two or more layers. In this case, the stacked layers are not necessarily formed of the same material but may be formed of different materials.

In the case where the insulator 1222 including a high-k material is provided between the insulator 1220 and the insulator 1224, electrons can be trapped in the insulator 1222 under specific conditions, and the threshold voltage can be increased. As a result, the insulator 1222 is negatively charged in some cases.

For example, in the case where the insulator 1220 and the insulator 1224 are formed using silicon oxide and the insulator 1222 is formed using a material having a lot of electron trap states such as hafnium oxide, aluminum oxide, or tantalum oxide, the state where the potential of the conductor 1205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide 1230 in the transistor 1200A to the conductor 1205. At this time, some of the moving electrons are trapped by the electron trap states of the insulator 1222.

In the transistor in which a necessary amount of electrons is trapped by the electron trap states of the insulator 1222, the threshold voltage is shifted in the positive direction. By controlling the voltage of the conductor 1205, the amount of electrons to be trapped can be controlled, and thus the threshold voltage can be controlled. The transistor 1200A having the structure is a normally-off transistor which is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging.

The threshold voltages can be controlled by appropriate adjustment of the thicknesses of the insulator 1220, the insulator 1222, and the insulator 1224. For example, when the total thickness of the insulators 1220, 1222, and 1224 is reduced, voltage is efficiently applied from the conductor 1205, resulting in low power consumption of the transistor. The total thickness of the insulators 1220, 1222, and 1224 is less than or equal to 65 nm, preferably less than or equal to 20 nm.

Thus, a transistor having a low leakage current in an off state can be provided. A transistor with stable electrical characteristics can be provided. A transistor having high on-state current can be provided. A transistor having a small subthreshold swing value can be provided. A highly reliable transistor can be provided.

The oxide 1230*a*, the oxide 1230*b*, and the oxide 1230*c* are formed using metal oxide such as In-M-Zn oxide (M is Al, Ga, Y, or Sn). Alternatively, an In—Ga oxide or an In—Zn oxide may be used for the oxide 1230.

The oxide 1230 of one embodiment of the present invention will be described below.

An oxide used as the oxide 1230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Next, preferred ranges of atomic ratios of indium, the element M, and zinc in the oxide of one embodiment of the present invention are described with reference to FIGS. 34A to 34C. Note that the proportion of oxygen atoms is not illustrated in FIGS. 34A to 34C. The terms of the atomic ratio of indium, the element M, and zinc in the oxide are denoted by [In], [M], and [Zn], respectively.

Figure 34A:
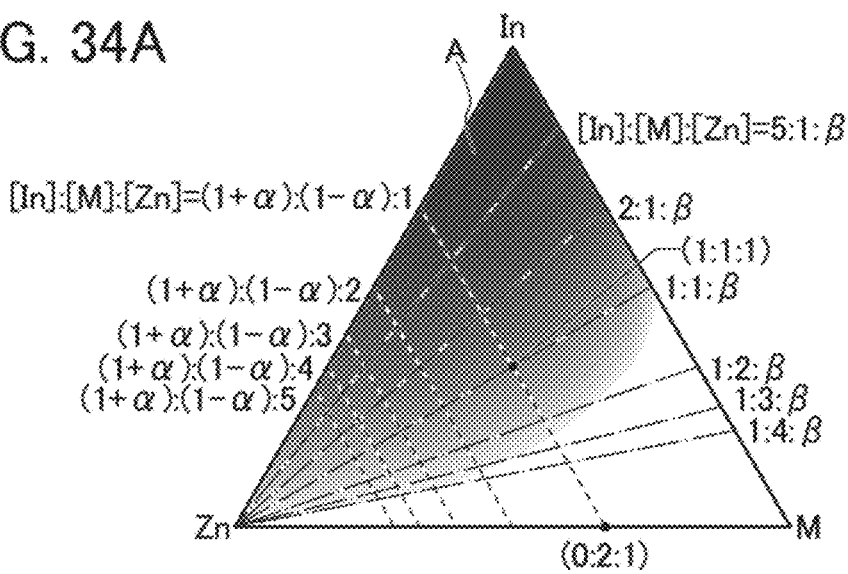
FIGS. 34A to 34C each illustrate an atomic ratio range of an oxide.
Figure 34B:
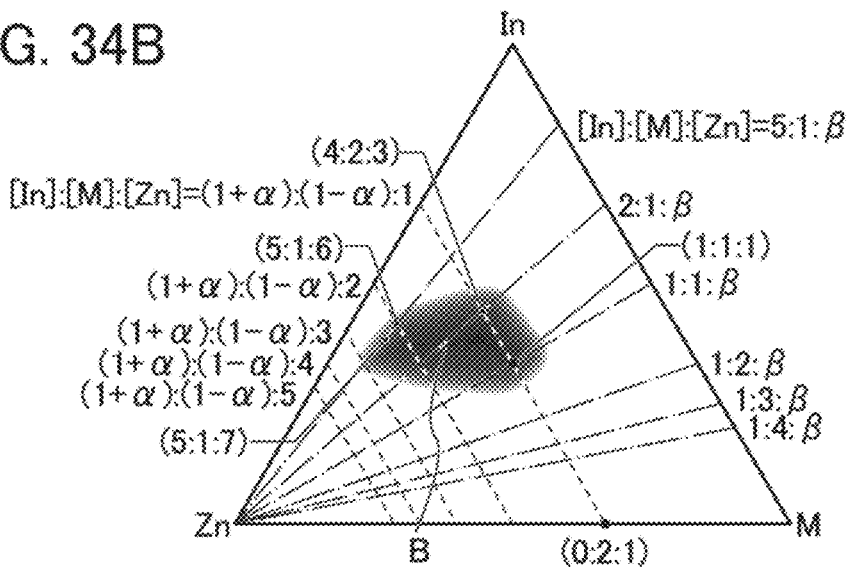
Figure 34C:
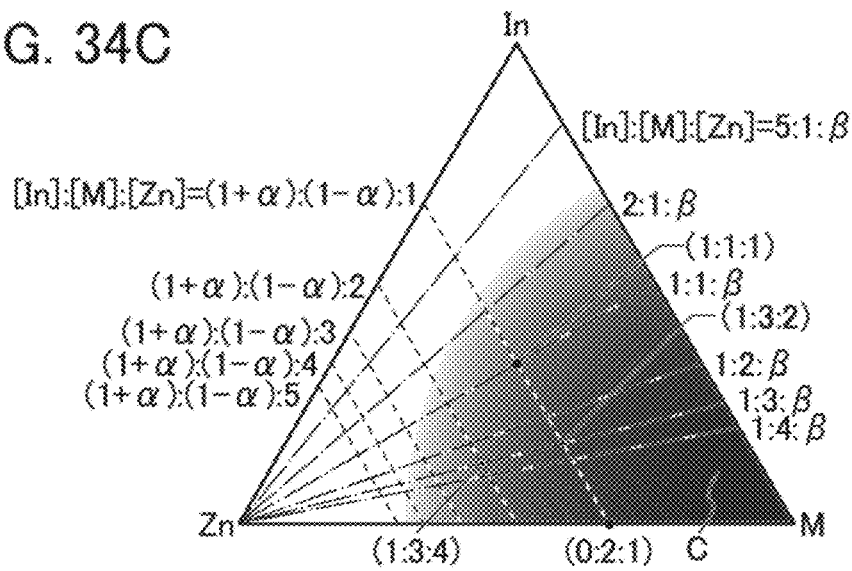

In FIGS. 34A to 34C, broken lines indicate a line where the atomic ratio [In]:[M]:[Zn] is $(1+\alpha):(1-\alpha):1$ ($\alpha$ is a real number greater than or equal to $-1$ and less than or equal to 1), a line where the atomic ratio [In]:M: [Zn] is $(1+\alpha):(1-\alpha):2$, a line where the atomic ratio [In]:M: [Zn] is $(1+\alpha):(1-\alpha):3$, a line where the atomic ratio [In]:M: [Zn] is $(1+\alpha):(1-\alpha):4$, and a line where the atomic ratio [In]:M: [Zn] is $(1+\alpha):(1-\alpha):5$.

Dashed-dotted lines indicate a line where the atomic ratio [In]:[M]:[Zn] is $1:1\beta$ ($\beta$ is a real number greater than or equal to 0), a line where the atomic ratio [In]:[M]:[Zn] is $1:2:\beta$, a line where the atomic ratio [In]:M: [Zn] is $1:3:\beta$, a line where the atomic ratio [In]:M: [Zn] is $1:4:\beta$, a line where the atomic ratio [In]:M:[Zn] is $2:1:\beta$, and a line where the atomic ratio [In]:M:[Zn] is $5:1:\beta$.

The oxide in FIGS. 34A to 34C with an atomic ratio of [In]:M:[Zn]=0:2:1 or an atomic ratio that is in the neighborhood thereof is likely to have a spinel crystal structure.

FIGS. 34A and 34B illustrate examples of the preferred ranges of the atomic ratios of indium, the element M, and zinc contained in the oxide of one embodiment of the present invention.

Figure 35:
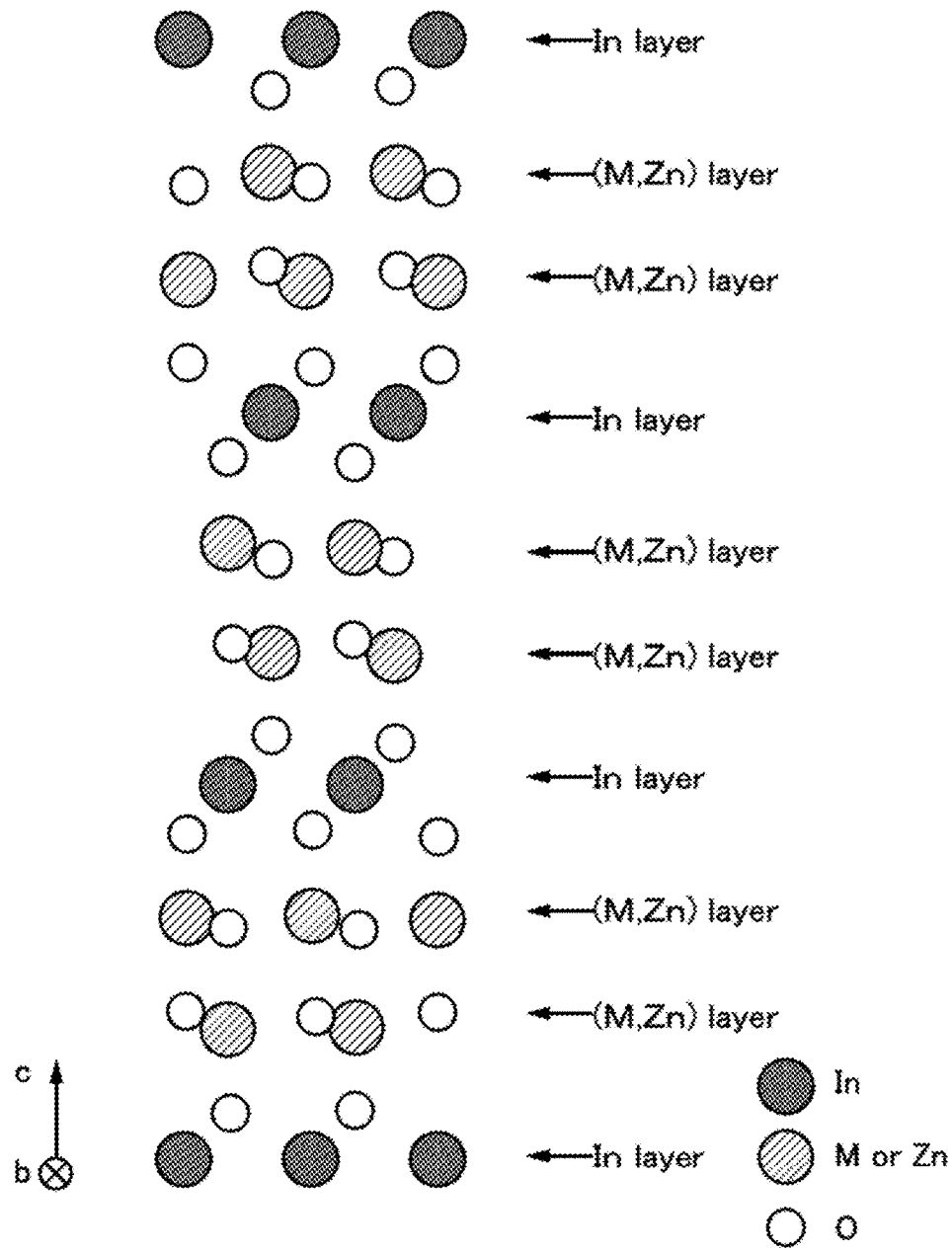
FIG. 35 illustrates a crystal of $InMZnO_4$.

FIG. 35 shows an example of the crystal structure of InMZnO$_4$ whose atomic ratio [In]:[M]:[Zn] is 1:1:1. The crystal structure shown in FIG. 35 is of InMZnO$_4$ observed from a direction parallel to a b-axis. Note that a metal element in a layer that contains M, Zn, and oxygen (hereinafter, this layer is referred to as an (M,Zn) layer) in FIG. 35 represents the element M or zinc. In that case, the proportion of the element M is the same as the proportion of zinc. The element M and zinc can be replaced with each other, and their arrangement is random.

Note that InMZnO$_4$ has a layered crystal structure (also referred to as a layered structure) and includes two (M,Zn) layers that contain the element M, zinc, and oxygen with respect to one layer that contains indium and oxygen (hereinafter referred to as an In layer), as illustrated in FIG. 35.

Indium and the element M can be replaced with each other. Therefore, when the element M in the (M,Zn) layer is replaced with indium, the layer can also be referred to as an (In,M,Zn) layer. In that case, a layered structure that includes two (In,M,Zn) layers with respect to one In layer is obtained.

An oxide whose atomic ratio [In]:[M]:[Zn] is 1:1:2 has a layered structure that includes three (M,Zn) layers with respect to one In layer. In other words, if [Zn] is larger than [In] and [M], the proportion of (M,Zn) layers to In layers becomes higher when the oxide is crystallized.

Note that in the case where the number of (M,Zn) layers with respect to one In layer is not an integer in the oxide, the oxide might have plural kinds of layered structures where the number of (M,Zn) layers with respect to one In layer is an integer. For example, in the case of [In]:[M]:[Zn]=1:1:1.5, the oxide might have the following layered structures: a layered structure of two (M,Zn) layers with respect to one In layer and a layered structure of three (M,Zn) layers with respect to one In layer.

For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:M:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have a higher carrier mobility (electron mobility). This is because in an oxide containing indium, the element M, and zinc, the s orbital of heavy metal mainly contributes to carrier transfer, and when the indium content in the oxide is increased, overlaps of the s orbitals of indium atoms are increased; therefore, an oxide having a high content of indium has a higher carrier mobility than an oxide having a low content of indium.

In contrast, when the indium content and the zinc content in an oxide become lower, carrier mobility becomes lower. Thus, with an atomic ratio of [In]:M:[Zn]=0:1:0 and the neighborhood thereof (e.g., a region C in FIG. 34C), insulation performance becomes better.

Accordingly, an oxide in one embodiment of the present invention preferably has an atomic ratio represented by a region A in FIG. 34A. With the atomic ratio, a layered structure with high carrier mobility and a few grain boundaries is easily obtained.

A region B in FIG. 34B represents an atomic ratio of [In]:M: [Zn]=4:2:3 to 4:2:4.1 and the neighborhood thereof. The neighborhood includes an atomic ratio of [In]:[M]:[Zn] =5:3:4. An oxide with an atomic ratio represented by the region B is an excellent oxide that has particularly high crystallinity and high carrier mobility.

Note that the condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor will be described.

Note that when the oxide is used for a transistor, carrier scattering or the like at a grain boundary can be reduced; thus, the transistor can have high field-effect mobility. In addition, the transistor can have high reliability.

An oxide with a low carrier density is preferably used for the transistor. For example, the oxide has a carrier density lower than $8\times10^{11}$ cm$^{-3}$, preferably lower than $1\times10^{11}$ cm$^{-3}$, further preferably lower than $1\times10^{10}$ cm$^{-3}$ and higher than or equal to $1\times10^{-9}$ cm$^3$.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

In order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. As examples of the impurities, hydrogen, nitrogen, alkali metal, alkaline earth metal, iron, nickel, silicon, and the like are given.

Here, the influence of impurities in the oxide will be described.

When silicon or carbon that is a Group 14 element is contained in the oxide, defect states are formed in the oxide. Thus, the concentration of silicon or carbon (measured by secondary ion mass spectrometry (SIMS)) is set to be lower than or equal to $2\times10^{18}$ atoms/cm$^3$, preferably lower than or equal to $2\times10^{17}$ atoms/cm$^3$ in the oxide or around an interface with the oxide.

When the oxide contains alkali metal or alkaline earth metal, defect states are formed and carriers are generated, in some cases. Thus, a transistor including an oxide that contains alkali metal or alkaline earth metal is likely to be normally-on. Therefore, it is preferable to reduce the concentration of alkali metal or alkaline earth metal in the oxide. Specifically, the concentration of alkali metal or alkaline earth metal measured by SIMS is set to be lower than or equal to $1\times10^{18}$ atoms/cm$^3$, preferably lower than or equal to $2\times10^{16}$ atoms/cm$^3$.

When containing nitrogen, the oxide easily becomes n-type by generation of electrons serving as carriers and an increase of carrier density. Thus, a transistor whose semiconductor includes an oxide containing nitrogen is likely to be normally-on. For this reason, nitrogen in the oxide is preferably reduced as much as possible; for example, the concentration of nitrogen in the oxide measured by SIMS is set to be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, hydrogen in the oxide is preferably reduced as much as possible. Specifically, the concentration of hydrogen in the oxide measured by SIMS is set to be lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide with sufficiently reduced impurity concentration is used for a channel region in a transistor, the transistor can have stable electrical characteristics.

Next, the case where the oxide has a two-layer structure or a three-layer structure will be described. A band diagram of a stacked-layer structure of an oxide S1, an oxide S2, and an oxide S3 and insulators that are in contact with the stacked-layer structure, a band diagram of a stacked-layer structure of the oxides S2 and S3 and insulators that are in contact with the stacked-layer structure, and a band diagram of a stacked-layer structure of the oxides S1 and S2 and insulators that are in contact with the stacked-layer structure are described with reference to FIGS. 36A to 36C.

Figure 36A:
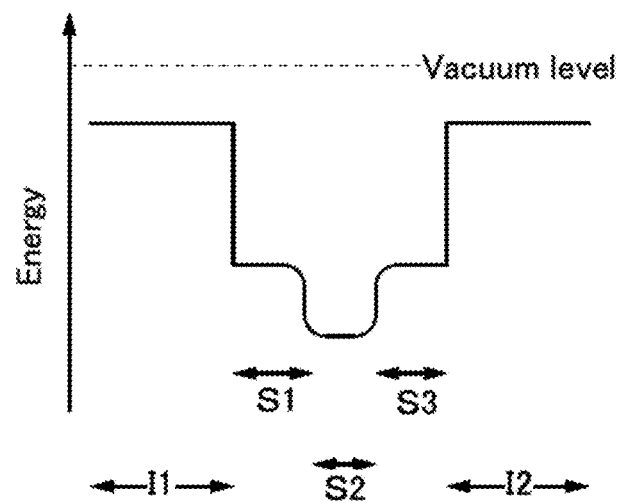
FIGS. 36A to 36C each illustrate a band structure in a stacked-layer structure of an oxide.
Figure 36B:
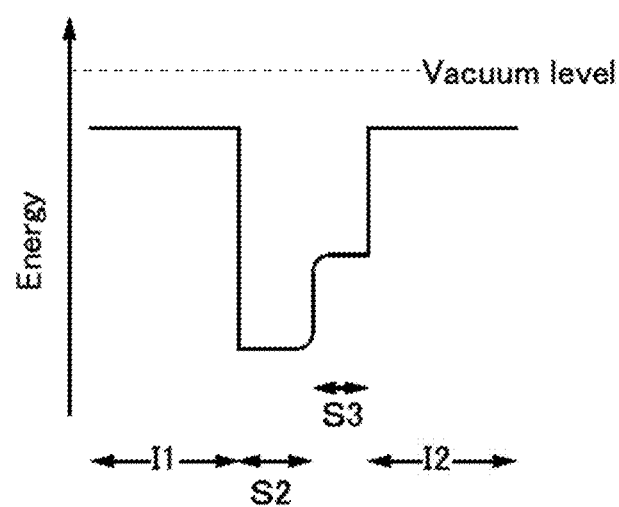
Figure 36C:
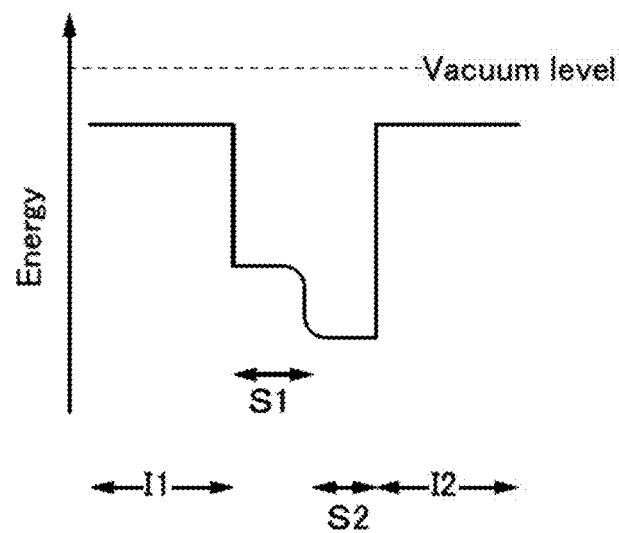

FIG. 36A is an example of a band diagram of a layered structure including an insulator I1, the oxide S1, the oxide S2, the oxide S3, and an insulator 12 in a thickness direction. FIG. 36B is an example of a band diagram of a layered structure including the insulator I1, the oxide S2, the oxide S3, and the insulator 12 in a thickness direction. FIG. 36C is an example of a band diagram of a layered structure including the insulator I1, the oxide S1, the oxide S2, and the insulator 12 in a thickness direction. Note that for easy understanding, the band diagrams show the energy level of the conduction band minimum (Ec) of each of the insulator I1, the oxide S1, the oxide S2, the oxide S3, and the insulator 12.

The energy level of the conduction band minimum of each of the oxides S1 and S3 is closer to the vacuum level than that of the oxide S2 is. Typically, the conduction band minimum of the oxide S2 is lower than the conduction band minimum of each of the oxide S1 and the oxide S3. Specifically, a difference in the energy level between the conduction band minimum of the oxide S2 and the conduction band minimum of each of the oxides S1 and S3 is preferably greater than or equal to 0.15 eV and less than or equal to 2 eV, further preferably greater than or equal to 0.5 eV and less than or equal to 1 eV. That is, it is preferable that the electron affinity of the oxide S2 be higher than the electron affinity of each of the oxides S1 and S3, and the difference between the electron affinity of each of the oxides S1 and S3 and the electron affinity of the oxide S2 be greater than or equal to 0.15 eV and less than or equal to 2 eV, further preferably greater than or equal to 0.5 eV and less than or equal to 1 eV.

As shown in FIGS. 36A to 36C, the energy level of the conduction band minimum of each of the oxides S1 to S3 is gradually varied. In other words, the energy level of the conduction band minimum is continuously varied or continuously connected. In order to obtain such a band diagram, the density of defect states in a mixed layer formed at the interface between the oxides S1 and S2 or the interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, in the case where the oxide S2 is an In—Ga—Zn oxide, it is preferable to use an In—Ga—Zn oxide, a Ga—Zn oxide, gallium oxide, or the like as each of the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. In that case, the oxide S2, the interface between the oxides S1 and S2, and the interface between the oxides S2 and S3 mainly function as a channel region. For example, an oxide with high insulation performance and the atomic ratio represented by the region C in FIG. 34C may be used as each of the oxides S1 and S3. Note that the region C in FIG. 34C represents the atomic ratio of [In]:[M]:[Zn]=0:1:0 or the vicinity thereof.

In the case where an oxide with the atomic ratio represented by the region A is used as the oxide S2, it is particularly preferable to use an oxide with an atomic ratio where [M]/[In] is greater than or equal to 1, preferably greater than or equal to 2 as each of the oxides S1 and S3. In addition, it is suitable to use an oxide with sufficiently high insulation performance and an atomic ratio where [M]/([Zn]+[In]) is greater than or equal to 1 as the oxide S3.

Alternatively, the insulator 1250 can be formed with a single layer or a stack using, for example, an insulator containing a material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Like the insulator 1224, the insulator 1250 is preferably formed using an oxide insulator that contains oxygen in excess of that in the stoichiometric composition. When such an insulator containing excess oxygen is provided in contact with the oxide 1230, oxygen vacancies in the oxide 1230 can be reduced.

As the insulator 1250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has a barrier property against oxygen or hydrogen, can be used. The insulator 1250 formed of such a material serves as a layer that prevents release of oxygen from the oxide 1230 and entry of an impurity such as hydrogen from the outside.

Note that the insulator 1250 may have a stacked-layer structure similar to that of the insulator 1220, the insulator 1222, and the insulator 1224. When the insulator 1250 includes an insulator in which a necessary amount of electrons are trapped by electron trap states, the threshold voltage of the transistor 1200A can be shifted in the positive direction. The transistor 1200A having the structure is a normally-off transistor which is in a non-conduction state (also referred to as an off state) even when the gate voltage is 0 V.

In addition to the insulator 1250, a barrier film may be provided between the oxide 1230 and the conductor 1260 in the semiconductor device illustrated in FIGS. 31A to 31C. Alternatively, the oxide 1230c may have a barrier property.

For example, an insulating film containing excess oxygen is provided in contact with the oxide 1230 and enclosed with a barrier film, whereby the composition of the oxide can be almost the same as the stoichiometric composition or can be in a supersaturated state containing more oxygen than that in the stoichiometric composition. It is also possible to prevent entry of impurities such as hydrogen into the oxide 1230.

One of the conductors 1240a and 1240b functions as a source electrode, and the other thereof functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 1240a and 1240b. In particular, a metal nitride film such as a tantalum nitride film is preferable because it has a barrier property with respect to hydrogen or oxygen and has a high oxidation resistance.

Although a single-layer structure is shown in FIGS. 31A to 31C, a stacked-layer structure of two or more layers may be used. For example, a tantalum nitride film and a tungsten film may be stacked. Alternatively, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

The conductor 1260 functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. In particular, a metal nitride film such as a tantalum nitride film is preferable because it has a barrier property with respect to hydrogen or oxygen and has a high oxidation resistance. Furthermore, one or both of manganese and zirconium may be used. Alternatively, a semiconductor typified by polycrystalline silicon doped with an impurity element such as phosphorus, or a silicide such as nickel silicide may be used. Although a single-layer structure is shown in FIGS. 31A to 31C, a stacked-layer structure of two or more layers may be used.

A two-layer structure where a titanium film is stacked over an aluminum film may be employed, for example.

Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. Alternatively, an alloy film or a nitride film that contains aluminum and one or more elements selected from titanium, tantalum, tungsten, molybdenum, chromium, neodymium, and scandium may be used.

The conductor 1260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 1260 can have a stacked-layer structure using any of the above-described light-transmitting conductive materials and any of the above-described metals.

Next, the insulator 1280 and the insulator 1282 are provided over the transistor 1200A.

The insulator 1280 preferably includes an oxide containing oxygen in excess of that in the stoichiometric composition. That is, in the insulator 1280, a region containing oxygen in excess of that in the stoichiometric composition (hereinafter also referred to as excess-oxygen region) is preferably formed. In particular, in the case of using an oxide semiconductor in the transistor 1200A, when an insulator including an excess-oxygen region is provided in an interlayer film or the like in the vicinity of the transistor 1200A, oxygen vacancies in the oxide 1230 included in the transistor 1200A are reduced, whereby the reliability can be improved.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 1280 that covers the transistor 1200A may function as a planarization film that covers a roughness thereunder.

The insulator 1282 is preferably formed using an insulating film having a barrier property against oxygen or hydrogen, e.g., an aluminum oxide film or a hafnium oxide film. The insulator 1282 formed of such a material serves as a layer that prevents release of oxygen from the oxide 1230 and entry of an impurity such as hydrogen from the outside.

The above structure makes it possible to provide a transistor including an oxide semiconductor with high on-state current. Alternatively, a transistor including an oxide semiconductor with low off-state current can be provided. Furthermore, when the transistor with the above structure is used in a semiconductor device, variation in the electrical characteristics of the semiconductor device can be reduced, and the reliability thereof can be improved. Alternatively, the power consumption of the semiconductor device can be reduced.

Since the transistor 1200A has a structure in which the conductors 1240a and 1240b hardly overlap with the conductor 1260, the parasitic capacitance added to the conductor 1260 can be reduced. Thus, the transistor with a high operation frequency can be provided.

<Transistor Structure 2>

Figure 32A:
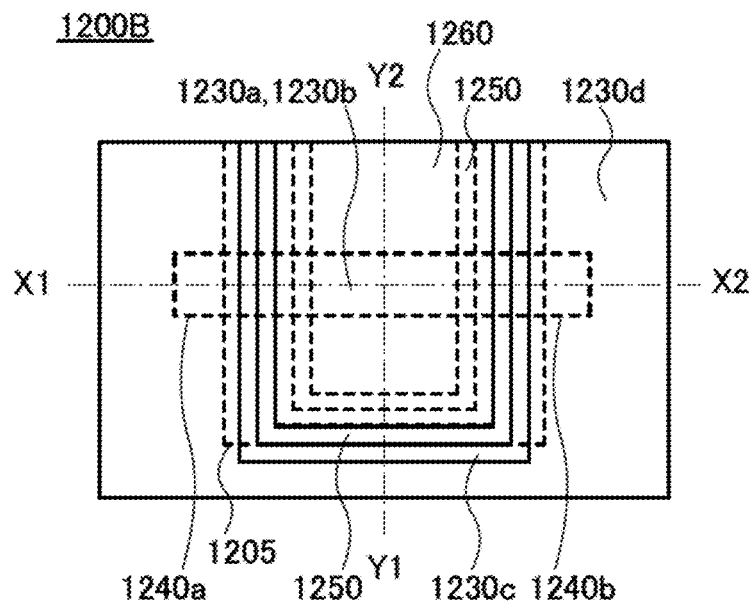
FIGS. 32A to 32C are a top view and cross-sectional views illustrating a structure example of a transistor.
Figure 32B:
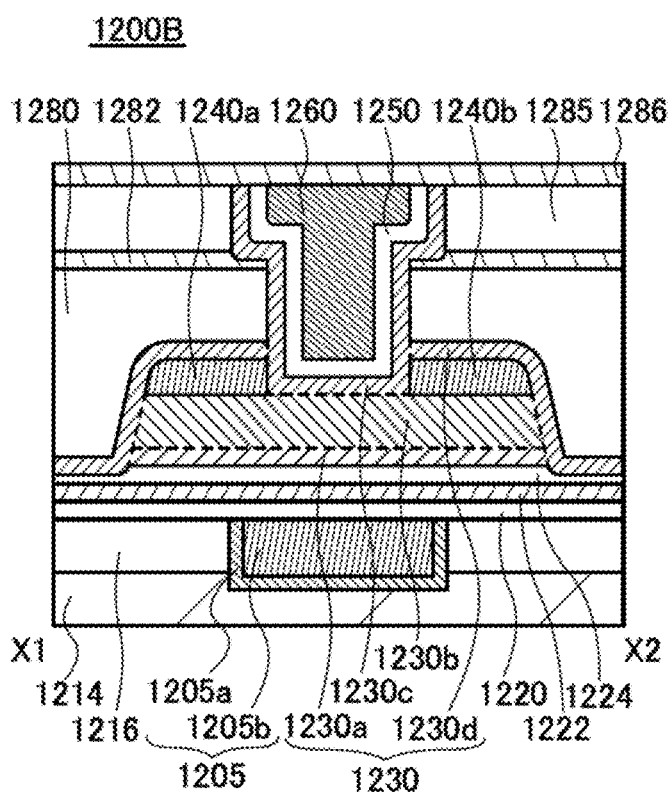
Figure 32C:
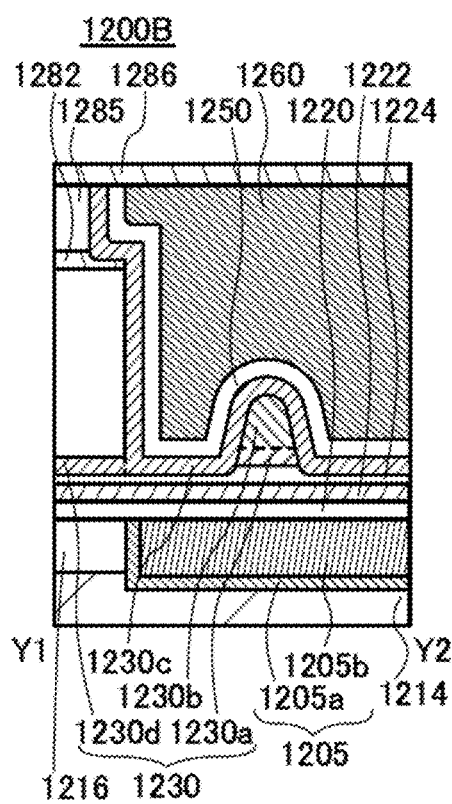

FIGS. 32A to 32C illustrate a structure example of a transistor different from the transistor in FIGS. 31A to 31C. FIG. 32A illustrates a top surface of a transistor 1200B. For simplification of the figure, some films are not illustrated in FIG. 32A. FIG. 32B is a cross-sectional view taken along the dashed-dotted line X1-X2 in FIG. 32A, and FIG. 32C is a cross-sectional view taken along the dashed-dotted line Y1-Y2 in FIG. 32A. Note that the direction of the dashed-dotted line X1-X2 may be called the channel length direction, and the direction of the dashed-dotted line Y1-Y2 may be called the channel width direction.

Note that in the transistor 1200B illustrated in FIGS. 32A to 32C, components having the same function as the components in the transistor 1200A illustrated in FIGS. 31A to 31C are denoted by the same reference numerals.

An insulator 1285 and an insulator 1286 are formed over the insulator 1282.

The oxide 1230c, the insulator 1250, and the conductor 1260 are formed in an opening formed in the insulators 1280, 1282, and 1285. One end portion of the conductor 1240a and one end portion of the conductor 1240b are aligned with an end portion of the opening formed in the insulator 1280. Furthermore, an end portion of each of the conductor 1240a and the conductor 1240b is aligned with part of an end portion of the oxide 1230. Therefore, the conductor 1240a and the conductor 1240b can be formed concurrently with the oxide 1230 or the opening in the insulator 1280. This leads to a reduction in the number of masks and steps and improvement in yield and productivity.

The conductor 1240a, the conductor 1240b, the oxide 1230c, and the oxide 1230b are in contact with the insulator 1280 having the oxygen-excess region with the oxide 1230d positioned therebetween. Thus, since the oxide 1230d exists between the insulator 1280 and the oxide 1230b including the region where the channel is formed, impurities such as hydrogen, water, and halogen can be prevented from diffusing from the insulator 1280 into the oxide 1230b.

In addition, a high-resistance offset region is not formed in the transistor 1200B illustrated in FIGS. 32A to 32C, the on-state current of the transistor 1200B can be increased.

<Transistor Structure 3>

Figure 33A:
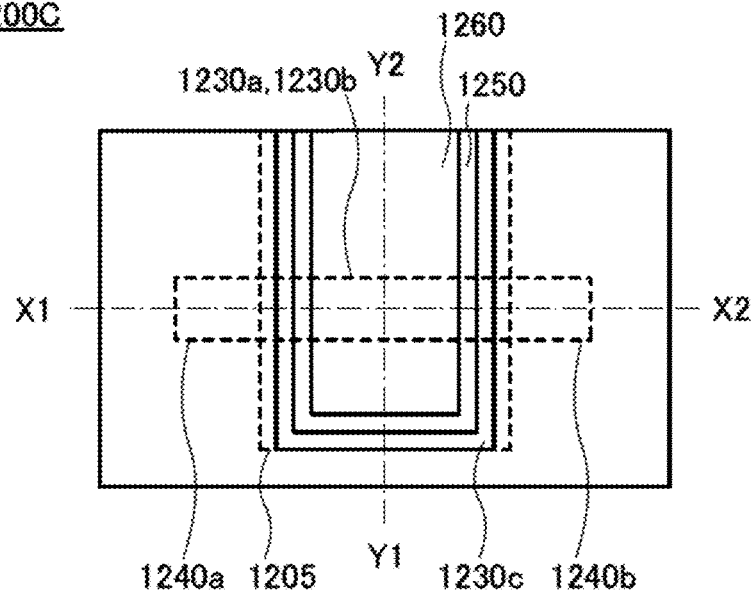
FIGS. 33A to 33C are a top view and cross-sectional views illustrating a structure example of a transistor.
Figure 33B:
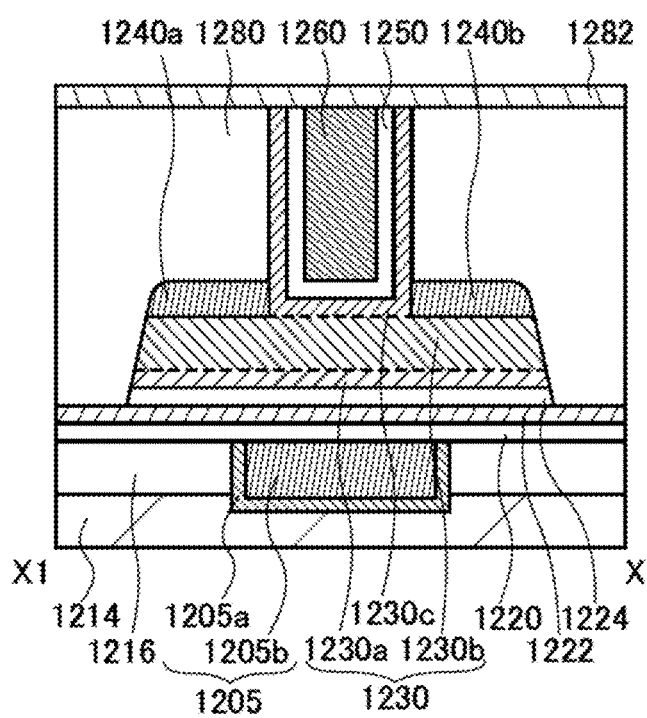
Figure 33C:
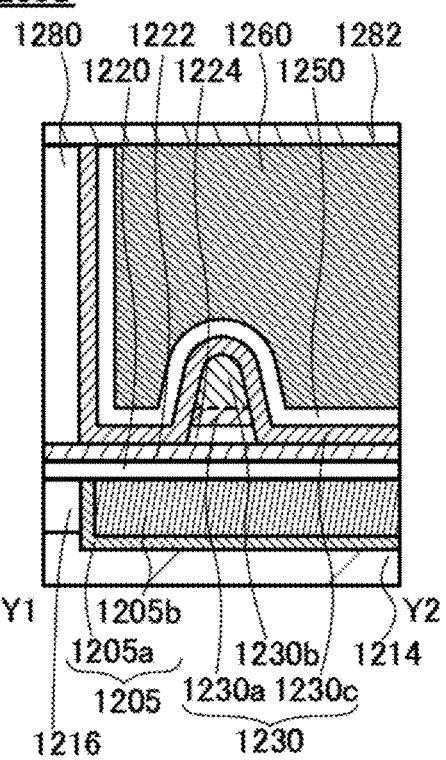

FIGS. 33A to 33C illustrate a structure example of a transistor different from the transistor in FIGS. 31A to 31C and FIGS. 32A to 32C. FIG. 33A illustrates a top surface of a transistor 1200C. For simplification of the figure, some films are not illustrated in FIG. 33A. FIG. 33B is a cross-sectional view taken along the dashed-dotted line X1-X2 in FIG. 33A, and FIG. 33C is a cross-sectional view taken along the dashed-dotted line Y1-Y2 in FIG. 33A. Note that the direction of the dashed-dotted line X1-X2 may be called the channel length direction, and the direction of the dashed-dotted line Y1-Y2 may be called the channel width direction.

Note that in the transistor 1200C illustrated in FIGS. 33A to 33C, components having the same function as the components in the transistor 1200A in FIGS. 31A to 31C are denoted by the same reference numerals.

The transistor 1200C illustrated in FIGS. 33A to 33C does not have the oxide 1230d. For example, when the conductor 1240a and the conductor 1240b are formed using a conductor with a high oxidation resistance, the oxide 1230d is not necessarily provided. This leads to a reduction in the number of masks and steps and improvement in yield and productivity.

The insulator 1224 may be provided only in the region overlapping with the oxides 1230a and 1230b. In that case, the oxides 1230a and 1230b and the insulator 1224 can be processed using the insulator 1222 as an etching stopper. Accordingly, yield and productivity can be improved.

Since the transistor 1200C illustrated in FIGS. 33A to 33C has a structure in which the conductors 1240a and 1240b hardly overlap with the conductor 1260, the parasitic capacitance added to the conductor 1260 can be reduced. Thus, the transistor 1200C with a high operation frequency can be provided.

Note that this embodiment can be combined with any of the other embodiments in this specification as appropriate.

Embodiment 6

Described in this embodiment is a metal oxide applicable to a transistor disclosed in this specification. In particular, the details of a metal oxide and a cloud-aligned composite (CAC) will be described below.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, a CAC-OS or a CAC metal oxide can be called a matrix composite or a metal matrix composite. Thus, CAC-OS may be called a cloud-aligned composite OS.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0), gallium zinc oxide (Ga$_{X4}$Zn$_{Y4}$O$_{Z4}$, where X4, Y4, and Z4 are real numbers greater than 0), or the like, and a mosaic pattern is formed. Then, InO$_{X1}$ or In$_{X2}$Zn$_{Y2}$O$_{Z2}$ forming the mosaic pattern is evenly distributed in the film. This composition is also referred to as a cloud-like composition.

That is, the CAC-OS is a composite metal oxide with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)m$_1$ (m1 is a natural number) and a crystalline compound represented by In$_{(1+x0)}$Ga$_{(1-x0)}$O$_3$(ZnO)$_{m0}$ (−1≤x0≤1; m0 is a given number).

The above crystalline compounds have a single crystal structure, a polycrystalline structure, or a c-axis-aligned crystal (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

This embodiment can be combined with any of the other embodiments in this specification as appropriate.

Embodiment 7

In this embodiment, an example of a touch sensor unit that can be provided in an electronic device will be described.

Figure 37A:
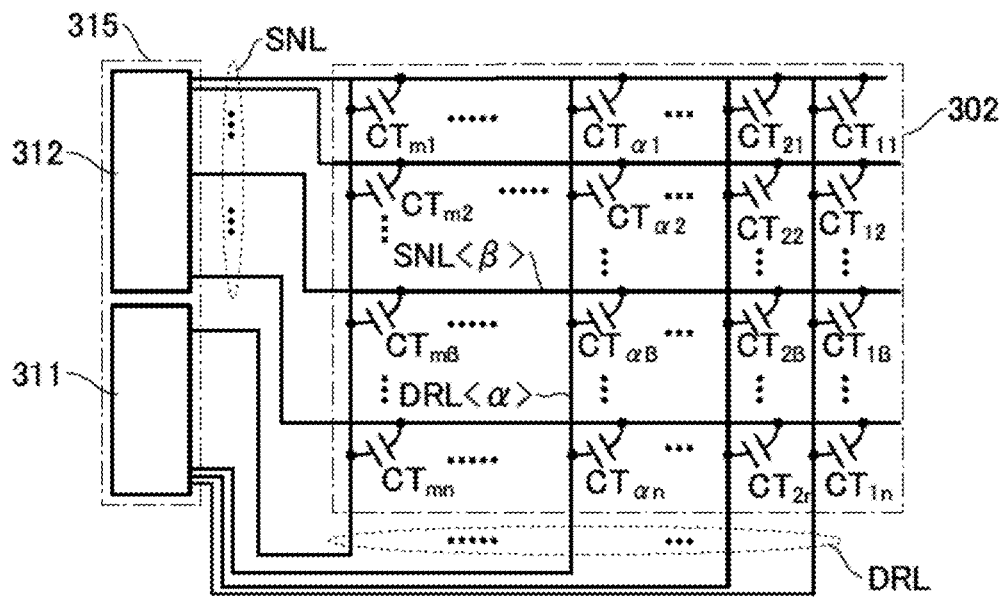
FIGS. 37A and 37B are a circuit diagram illustrating a structure example of a touch sensor unit and a top view illustrating an example of a schematic view of the touch sensor unit.

FIG. 37A illustrates a circuit configuration example of a touch sensor unit that can be provided in the display device described in another embodiment. A touch sensor unit 300 includes a sensor array 302, a touch sensor (TS) driver IC 311, and a sensing circuit 312. In FIG. 37A, the TS driver IC 311 and the sensing circuit 312 are collectively referred to as a peripheral circuit 315.

Here, a structure example of the touch sensor unit 300 which is a mutual capacitive touch sensor unit is illustrated. The sensor array 302 includes m wirings DRL (here, m is an integer larger than 1) and n wirings SNL (here, n is an integer larger than 1). The wiring DRL is a driver line. The wiring SNL is a sensing line. In this example, the α-th wiring DRL is referred to as wiring DRL<α>, and the β-th wiring SNL is referred to as wiring SNL<β>. A capacitor $CT_{\alpha\beta}$ refers to a capacitor formed between the wiring DRL<α> and the wiring SNL<β>.

The m wirings DRL are electrically connected to the TS driver IC 311. The TS driver IC 311 has a function of driving the wirings DRL. The n wirings SNL are electrically connected to the sensing circuit 312. The sensing circuit 312 has a function of sensing signals of the wirings SNL. A signal of the wiring SNL<β> at the time when the wiring DRL<α> is driven by the TS driver IC 311 includes information on the amount of change in capacitance of the capacitor $CT_{\alpha\beta}$. By analyzing signals of n wirings SNL, information on the presence or absence of touch, the touch position, and the like can be obtained.

Figure 37B:
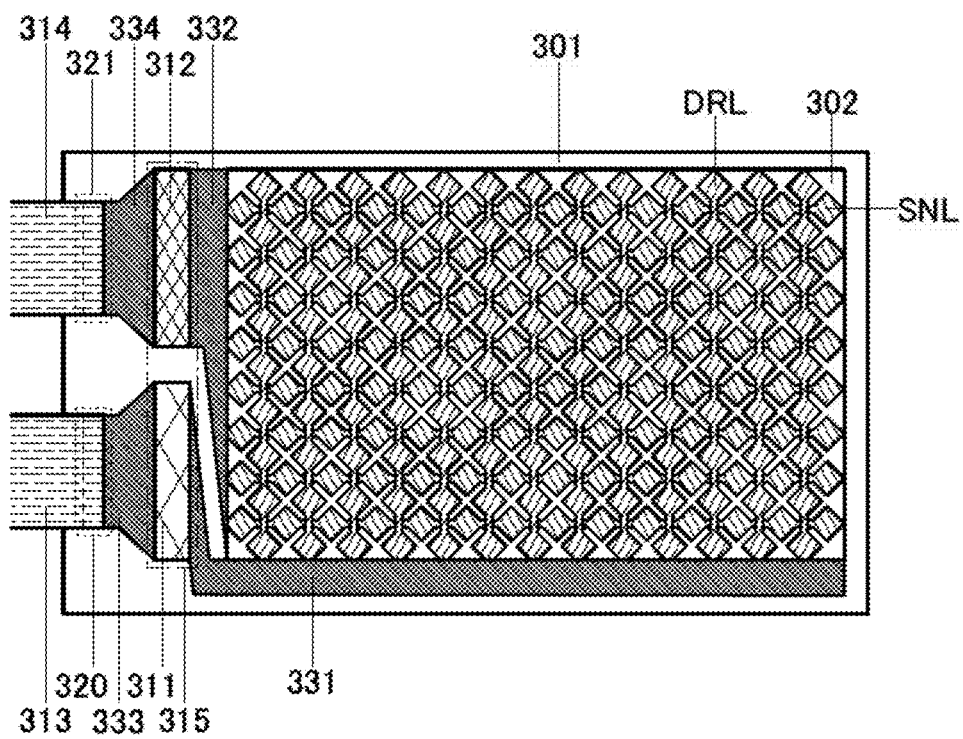

FIG. 37B is a top view illustrating an example of a schematic view of the touch sensor unit 300. The touch sensor unit 300 in FIG. 37B includes the sensor array 302 over a base 301, a TS driver IC 311, and the sensing circuit 312. In FIG. 37B, the TS driver IC 311 and the sensing circuit 312 are collectively illustrated as the peripheral circuit 315 as in FIG. 37A.

The sensor array 302 is formed over the base 301. The TS driver IC 311 and the sensing circuit 312 are mounted as components of an IC chip or the like, over the base 301, using an anisotropic conductive adhesive or an anisotropic conductive film by a COG method or the like. The touch sensor unit 300 is electrically connected to an FPC 313 and an FPC 314 as units for inputting a signal or the like from the outside.

In addition, wirings 331 to 334 are formed over the base 301 so that the circuits are electrically connected to each other. In the touch sensor unit 300, the TS driver IC 311 is electrically connected to the sensor array 302 through the wiring 331, and the TS driver IC 311 is electrically connected to the FPC 313 through the wiring 333. The sensing circuit 312 is electrically connected to the sensor array 302 through the wiring 332, and the TS driver IC 311 is electrically connected to the FPC 314 through the wiring 334.

A connection portion 320 between the wiring 333 and the FPC 313 has an anisotropic conductive adhesive, whereby electrical conduction between the FPC 313 and the wiring 333 can be obtained. Also, a connection portion 321 between the wiring 334 and the FPC 314 has an anisotropic conductive adhesive, whereby electrical conduction between the FPC 314 and the wiring 334 can be obtained.

This embodiment can be combined with any of the other embodiments in this specification as appropriate.

Example 1

In this example, the amount of current generated in the current source circuit described in the above embodiment will be described. In the description, calculation results obtained by calculation software are used.

The calculation software used in this example was a circuit simulator "Gateway" (version 3.4.1.R) produced by Silvaco, Inc. Source-drain current $I_{ds}$ characteristics with respect to a source-drain voltage $V_{ds}$ were calculated by using this simulator.

Figure 38A:
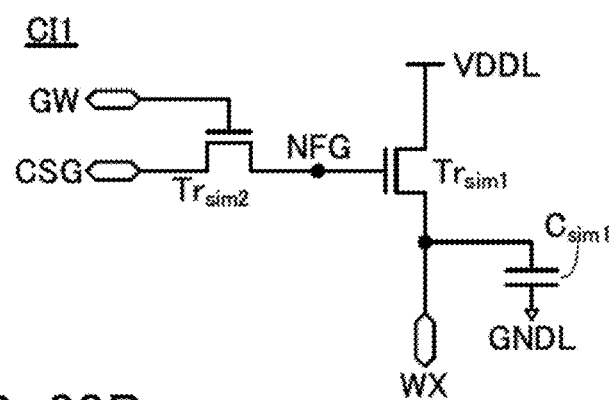
FIGS. 38A and 38B illustrate configuration examples of a current supply circuit.
Figure 38B:
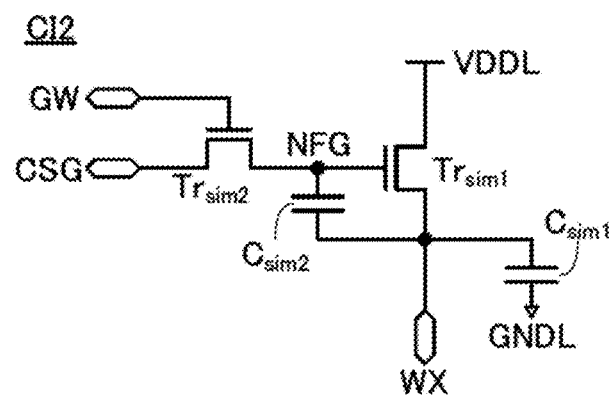

Circuit configurations used for the calculations will be described. FIGS. 38A and 38B each illustrate a configuration of current source circuits used for the calculations. A current source circuit CI1 illustrated in FIG. 38A includes a transistor $Tr_{sim1}$, a transistor $Tr_{sim2}$, and a capacitor $C_{sim1}$. In a current source circuit CI2 illustrated in FIG. 38B, a capacitor $C_{sim2}$ is added to the current source circuit CI1.

The channel length and the channel width of each of the transistor $Tr_{sim1}$ and the transistor $Tr_{sim2}$ are 10 μm. The capacitance of the capacitor $C_{sim1}$ and the capacitance of the capacitor $C_{sim2}$ are 118 fF and 177 pF, respectively.

In the current source circuit CI1, a first terminal of the transistor $Tr_{sim1}$ is electrically connected to a first terminal of the capacitor $C_{sim1}$ and a gate of the transistor $Tr_{sim1}$ is electrically connected to a first terminal of the transistor $Tr_{sim2}$. A connection portion of the gate of the transistor $Tr_{sim1}$ and the first terminal of the transistor $Tr_{sim2}$ is a node NFG.

A second terminal of the transistor $Tr_{sim1}$ is electrically connected to the wiring VDDL. The wiring VDDL is a wiring for supplying a potential VDD, which is a power source potential. A second terminal of the capacitor $C_{sim1}$ is electrically connected to a wiring GNDL. The capacitor $C_{sim1}$ is parasitic capacitance in consideration of an influence of a back gate of the transistor $Tr_{sim1}$, and the wiring GNDL is a wiring for supplying a ground potential GND.

A potential CSG is input to a second terminal of the transistor $Tr_{sim2}$ and a potential GW is input to a gate of the transistor $Tr_{sim2}$. The potential GW is boosted to turn on the transistor $Tr_{sim2}$ and the potential of the node NFG is determined by the potential CSG. After the potential of the node NFG is determined, the potential GW is lowered to turn off the transistor $Tr_{sim2}$. A potential WX is input to the first terminal of the transistor $Tr_{sim1}$.

In the current source circuit CI2, a first terminal of the capacitor $C_{sim2}$ is electrically connected to the gate of the transistor $Tr_{sim1}$ and a second terminal of the capacitor $C_{sim2}$ is electrically connected to the first terminal of the transistor $Tr_{sim1}$. As described above, the description of the connection structure of the current source circuit CI1 can be referred to for the connection structure of other elements of the current source circuit CI2.

In particular, the capacitor $C_{sim2}$ has a function of retaining voltage between the node NFG and the first terminal of the transistor $Tr_{sim1}$. The potential of the node NFG is determined by the potential CSG and the potential GW, whereby the potential of the node NFG can be retained. Specifically, the potential GW is boosted to turn on the transistor $Tr_{sim2}$, the potential of the node NFG is determined by the potential CSG, and the potential GW is lowered to turn off the transistor $Tr_{sim2}$.

In the above-described current source circuits CI1 and CI2, when the potential WX is changed, the source-drain voltage $V_{ds}$ of the transistor $Tr_{sim1}$ can be changed. Here, when the source-drain voltage of the transistor $Tr_{sim1}$ is changed while the potential of the node NFG is kept constant, the source-drain current of the transistor $Tr_{sim1}$ can be calculated. In other words, source-drain current $I_{ds}$ characteristics with respect to source-drain voltage $V_{ds}$ of the transistor $Tr_{sim1}$ can be obtained. In this example, the potential of the node NFG was referred to as VG1 to VG8 and the potential WX and the current $I_{ds}$ characteristics of the transistor $Tr_{sim1}$ in each case were calculated.

Note that VG1, VG2, VG3, VG4, VG5, VG6, VG7, and VG8 are 0 V, 8 V, 10 V, 12 V, 14 V, 16 V, 18 V, and 20 V, respectively.

Figure 39A:
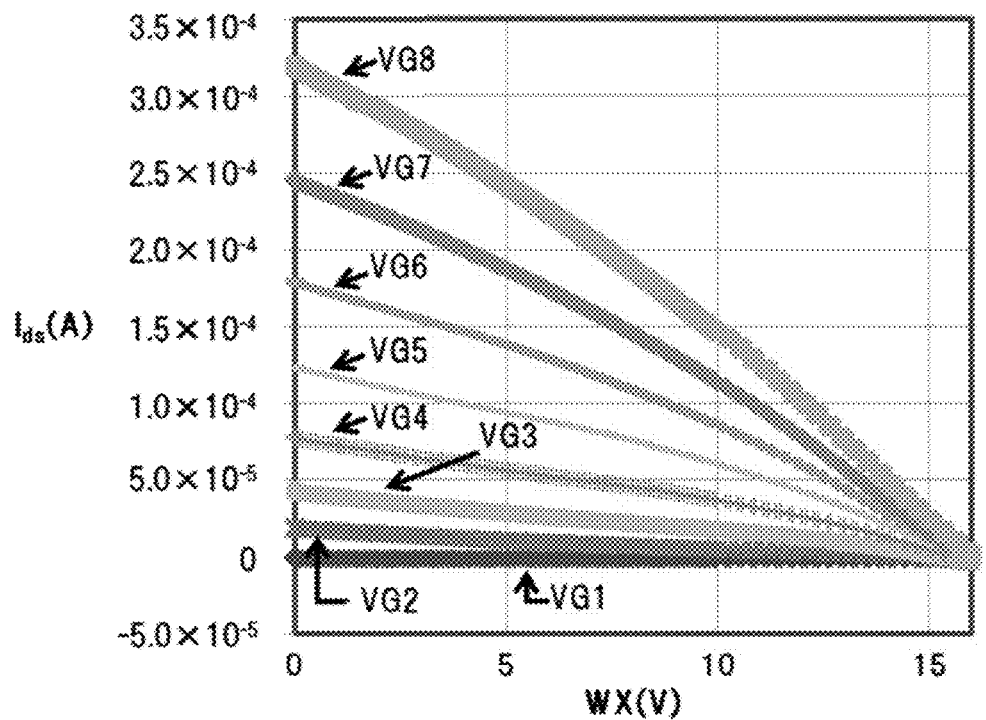
FIGS. 39A and 39B illustrate results of calculations on the circuit configurations of FIGS. 38A and 38B.
Figure 39B:
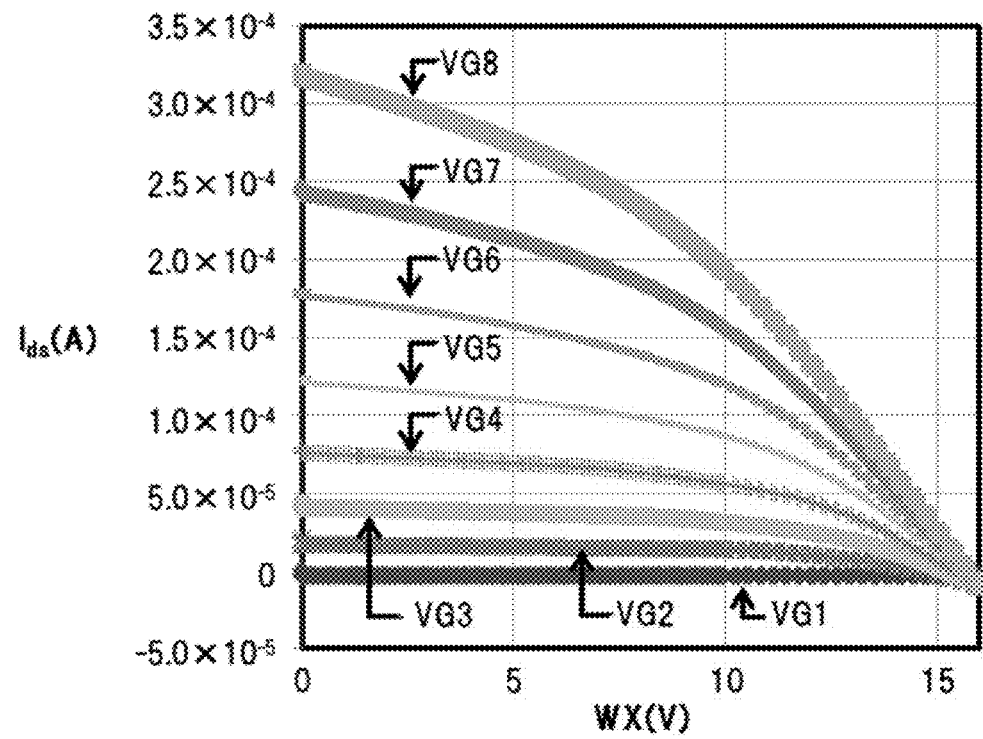

FIGS. 39A and 39B each show the calculated potential WX and the calculated current $I_{ds}$ characteristics of the transistor $Tr_{sim1}$. FIG. 39A shows the source-drain current $I_{ds}$ characteristics with respect to the source-drain voltage $V_{ds}$ of the transistor $Tr_{sim1}$ of the current source circuit CI1, and FIG. 39B shows the source-drain current $I_{ds}$ characteristics with respect to the source-drain voltage $V_{ds}$ of the transistor $Tr_{sim1}$ of the current source circuit CI2.

In FIGS. 39A and 39B, as the potential WX decreases (the source-drain voltage $V_{ds}$ increases), the source-drain current $I_{ds}$ increases. However, in FIG. 39A, even when the potential WX is low (the source-drain potential $V_{ds}$ is high), the absolute value of a slope of a curve of the characteristics is large; thus, it is apparent that saturation characteristics of the transistor $Tr_{sim1}$ of the circuit configuration of the current source circuit CI1 cannot be obtained. In FIG. 39B, when the potential WX is low (the source-drain potential $V_{ds}$ is high), the absolute value of a slope of a curve of characteristics is small; thus, it is apparent that saturation characteristics of the transistor $Tr_{sim1}$ of the current source circuit CI2 can be obtained.

In the above embodiments, the transistor $Tr_{sim1}$ included in the constant current circuit favorably operates in a saturation region. In other words, the constant current circuit favorably has a configuration where a change in the value of current output from the constant current circuit is as small as possible even when the potential WX is changed.

Thus, the constant current circuit included in the semiconductor device of one embodiment of the present invention preferably does not have the configuration of the current source circuit CI' in FIG. 38A but the configuration of the current source circuit CI2 in FIG. 38B. When the current source circuit CI2 is used as the constant current circuit, the constant current circuit can output a constant current regardless of the value of the potential WX.

Note that this example can be combined with any of the other embodiments in this specification as appropriate.

Example 2

In this example, a product-sum operation circuit using an FET including an oxide containing In, Ga, and Zn as an OS in a channel formation region will be described.

Figure 40:
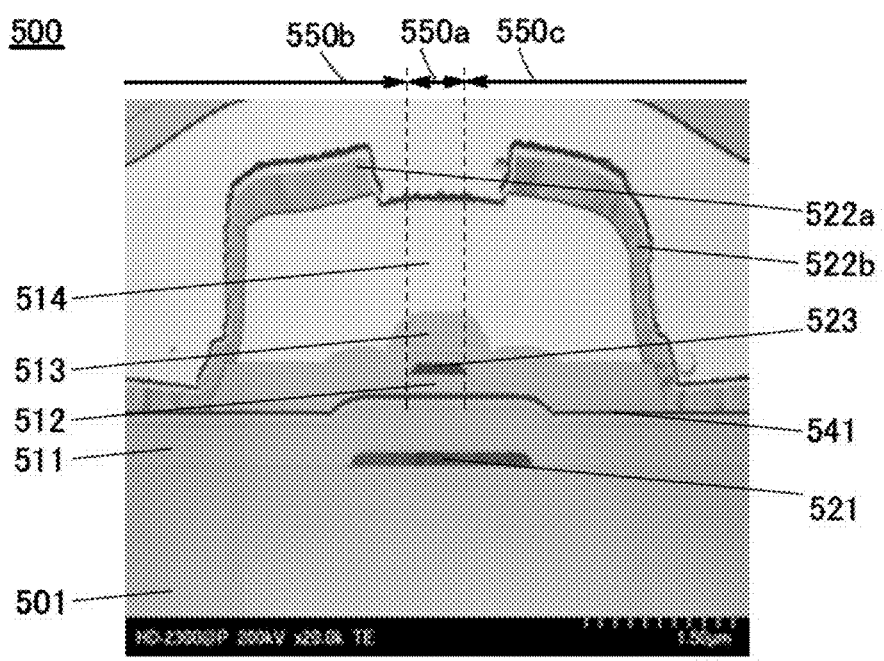
FIG. 40 is a cross-sectional TEM image of a transistor described in Example 2.

FIG. 40 is a cross-sectional TEM image of the transistor. A transistor 500 includes a substrate 501, insulators 511 to 514, a conductor 521, a conductor 522a, a conductor 522b, a conductor 523, and a metal oxide 541. The transistor 500 includes a first gate and a second gate.

The conductor 521 serving as the first gate of the transistor 500 is positioned over the substrate 501. The insulator 511 serving as a gate insulating film of the transistor 500 is positioned over the substrate 501 and the conductor 521. The metal oxide 541 serves as a semiconductor layer of the transistor 500. The metal oxide 541 is positioned over the insulator 511 so as to partly overlap with the conductor 521. In particular, part of the metal oxide 541 that overlaps with the conductor 521 is denoted by a region 550a and parts of the metal oxide 541 that do not overlap with the conductor 521 are denoted by a region 550b and a region 550c.

The insulator 512 serving as the gate insulating film of the transistor 500 is positioned over the metal oxide 541 so as to overlap with the conductor 523. The conductor 523 serves as the second gate of the transistor 500. The conductor 523 is positioned over the insulator 512 so as to have a region overlapping with the conductor 521. The insulator 513 is positioned over the conductor 523 and the region 550b and the region 550c of the metal oxide 541. The insulator 514 is positioned over the insulator 513.

The conductor 522a serving as one of a source and a drain of the transistor 500 and the conductor 522b serving as the other of the source and the drain of the transistor 500 are positioned over the insulators 514, 513, and 512 and the metal oxide 541. Note that the conductor 522a and the conductor 522b are not electrically connected to each other.

The resistance of the regions 550b and 550c is decreased by formation of the insulator 513 and the regions 550b and 550c have higher conductivity than the region 550a. Impurity elements such as hydrogen or nitrogen contained in a film formation atmosphere of the insulator 513 are added to the regions 550b and 550c, whereby oxygen vacancies are generated mainly in a region of the metal oxide 541 that is in contact with the insulator 513. Furthermore, the impurity elements enter the oxygen vacancies and carrier density is increased, whereby the resistance of the regions 550b and 550c is decreased.

As illustrated in FIG. 40, in the transistor 500, the conductor 522a serving as one of the source and the drain of the transistor 500 and the conductor 522b serving as the other of the source and the drain of the transistor 500 are positioned not to overlap with the conductor 523 serving as the second gate, so that the parasitic capacitance of the transistor 500 is small. Thus, the transistor 500 is expected to have more favorable multiplication characteristics and operation speed than a channel etched transistor or the like.

Figure 41A:
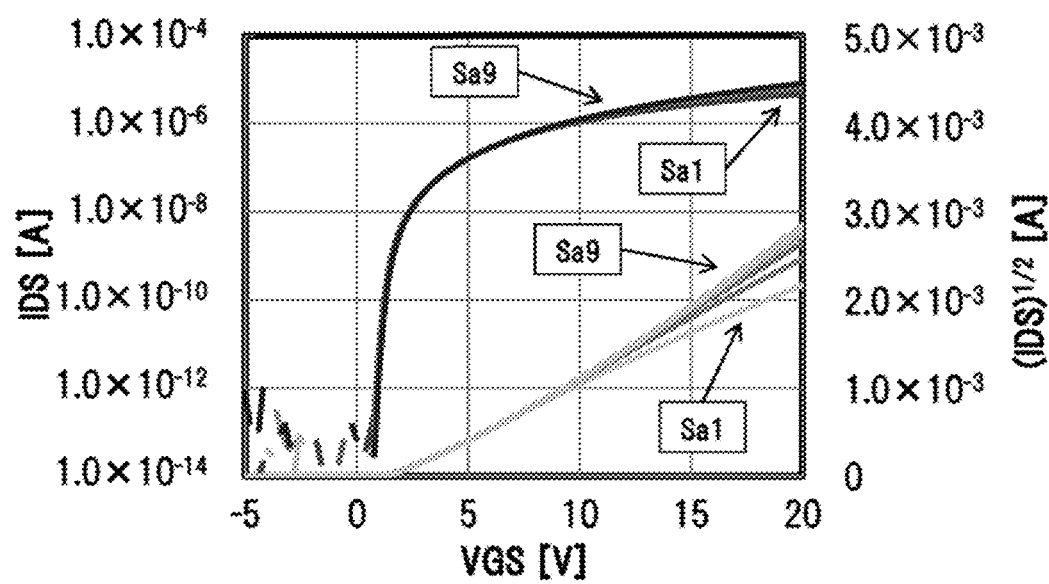
FIGS. 41A and 41B are graphs showing gate voltage-drain current characteristics and source-drain voltage-drain current characteristics of a transistor.

FIG. 41A is a graph showing the characteristics of the drain-source current $I_{ds}$ (and the square root of the drain-source current $I_{ds}$) and the gate-source voltage $V_{gs}$ of the transistor 500. The graph of FIG. 41A shows the cases where the drain-source voltage is 4 V, 6 V, 8 V, 10 V, 12 V, 14 V, 16 V, 18 V, and 20 V. In particular, the drain-source voltage is 4 V in Condition Sa1 and the drain-source voltage is 20 V in Condition Sa9. According to the graph of FIG. 41A, it can be estimated that the ratio of the on-state current to the off-state current is 7 digits or more and S value is 120 mV/decade in the transistor 500.

Figure 41B:
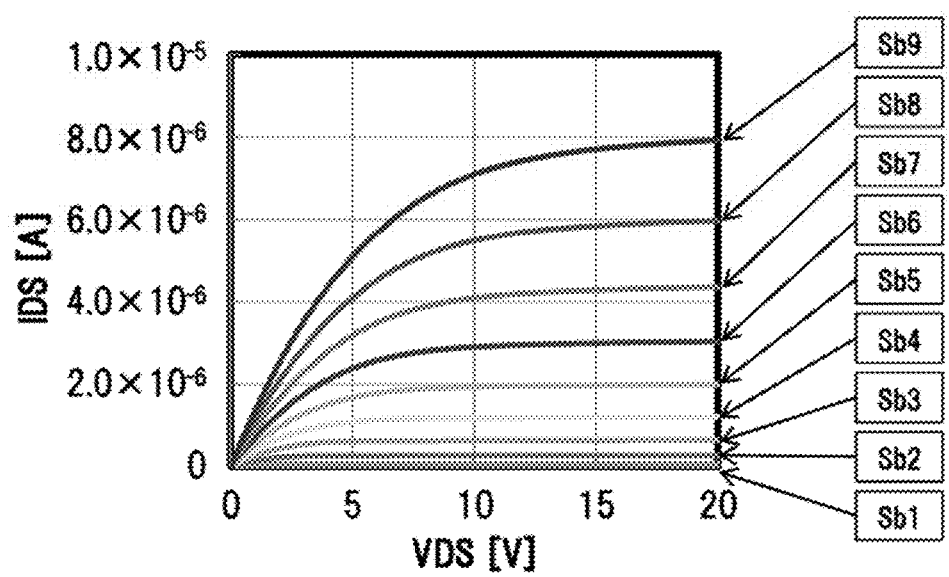

FIG. 41B is a graph showing the characteristics of the drain-source current $I_{ds}$ and the drain-source voltage $V_{ds}$ of the transistor 500. The graph of FIG. 41B shows the cases where the gate-source voltage is 4 V (Condition Sb1), 6 V (Condition Sb2), 8 V (Condition Sb3), 10 V (Condition Sb4), 12 V (Condition Sb5), 14 V (Condition Sb6), 16 V (Condition Sb7), 18 V (Condition Sb8), and 20 V (Condition Sb9).

Figure 42A:
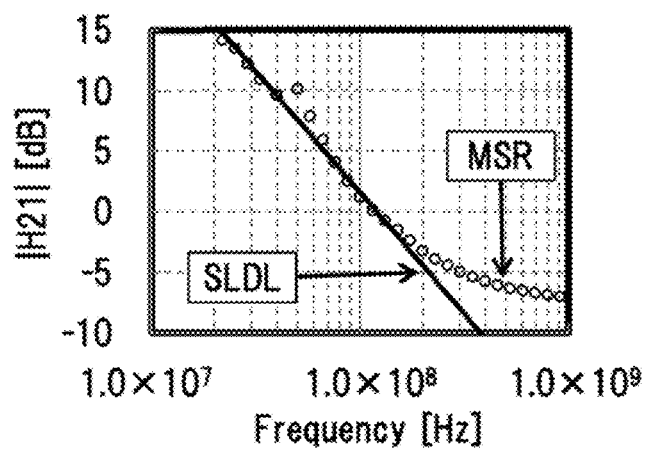
FIGS. 42A to 42C are graphs showing frequency characteristics of a transistor, temperature dependence of an off-state current of a transistor, and 1/f noise characteristics of a transistor.

FIG. 42A is a graph showing the frequency characteristics of the transistor 500. The horizontal axis represents a frequency of a carrier wave, and the vertical axis represents the ratio of a signal input to the gate of the transistor 500 and a signal passing between the source and the drain of the transistor 500 (denoted by |H21| in the graph of FIG. 42A). A solid line SLDL represents a straight line having a slope of 20 dB/decade and round markers MSR represent measured values.

Figure 42B:
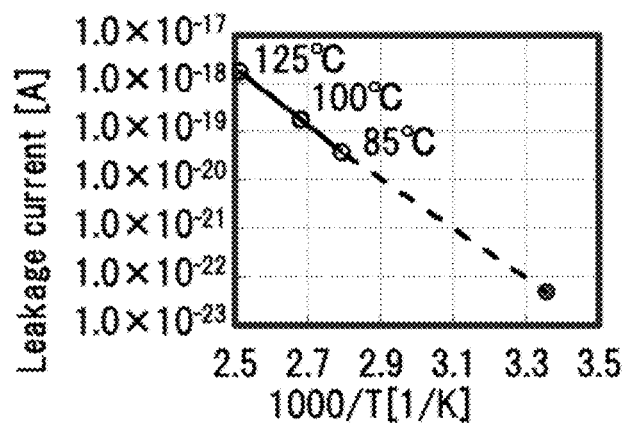

FIG. 42B is a graph showing temperature dependence of the off-state current of the transistor 500. The horizontal axis represents 1000/T[1/K], the vertical axis represents the off-state current of the transistor 500, and the results are plotted. According to FIG. 42B, the off-state current of the transistor 500 at room temperature can be estimated to $1.0 \times 10^{-22}$ A.

Figure 42C:
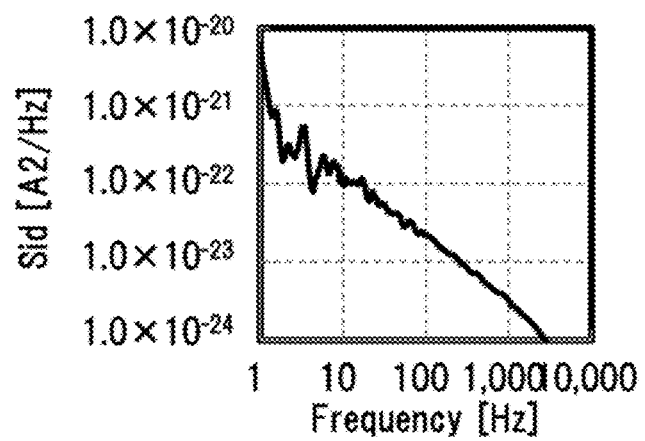

FIG. 42C shows the 1/f noise characteristics of the transistor 500.

Figure 43A:
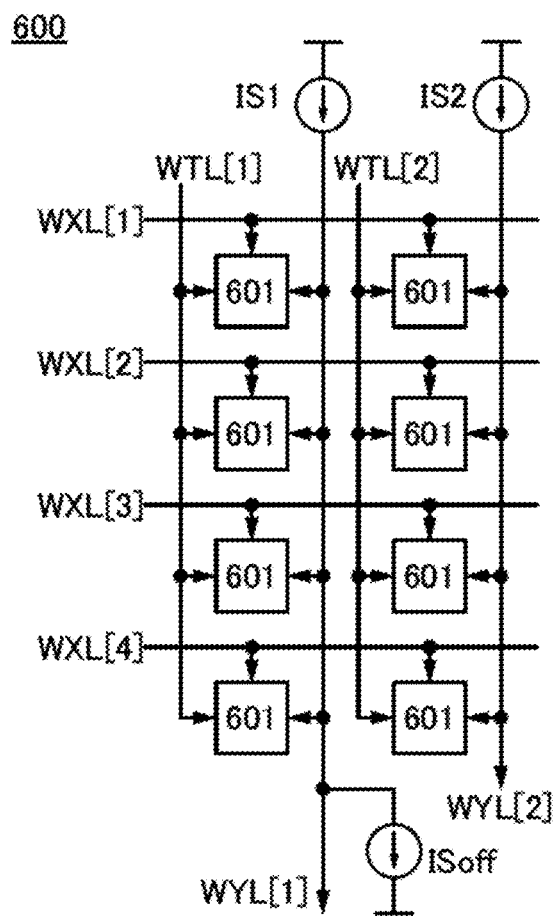
FIGS. 43A and 43B illustrate a product-sum operation circuit and a memory cell described in Example 2.

FIG. 43A illustrates a configuration of a product-sum operation circuit including the transistor 500. A product-sum operation circuit 600 includes memory cells 601 corresponding to analog memories, a current source circuit IS1, a current source circuit IS2, and a circuit ISoff.

A wiring WTL[1] and a wiring WTL[2] are electrically connected to the memory cells 601 in the first column and the memory cells 601 in the second column, respectively. A wiring WXL[1], a wiring WXL[2], a wiring WXL[3], and a wiring WXL[4] are electrically connected to the memory cells 601 in the first row, the memory cells 601 in the second row, the memory cells 601 in the third row, and the memory cells 601 in the fourth row, respectively.

The current source circuit IS1 and the current source circuit IS2 are electrically connected to a wiring WYL[1] and a wiring WYL[2], respectively. The wiring WYL[1] and the wiring WTL[2] are electrically connected to the memory cells 601 in the first column and the memory cells 601 in the second column, respectively. The circuit ISoff is electrically connected to the wiring WYL[1].

Figure 43B:
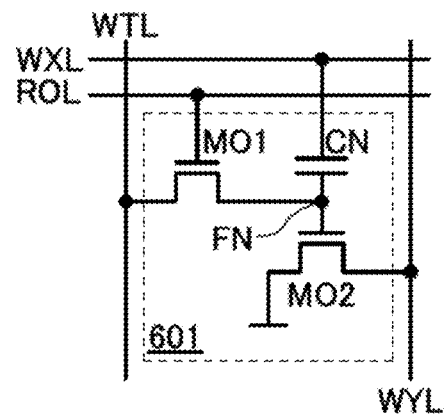

FIG. 43B illustrates the configuration of the memory cell 601. The memory cell 601 includes a transistor MO1, a transistor MO2, and a capacitor CN.

In particular, the above-described transistor 500 is used as the transistor MO1 illustrated in FIG. 43B. The channel length and the channel width of each of the transistor MO1 and the transistor MO2 are 10 μm.

The capacitance of the capacitor CN is 100 fF.

A first terminal of the transistor MO1 is electrically connected to a wiring WTL, a gate of the transistor MO1 is electrically connected to a wiring ROL, and a second terminal of the transistor MO1 is electrically connected to a gate of the transistor MO2. A first terminal of the transistor MO2 is electrically connected to a wiring WYL and a second terminal of the transistor MO2 is electrically connected to a wiring supplying a constant potential. A first terminal of the capacitor CN is electrically connected to the gate of the transistor MO2 and a second terminal of the capacitor CN is electrically connected to a wiring WXL. A connection portion of the second terminal of the transistor MO1, the gate of the transistor MO2, and the first terminal of the capacitor CN is a node FN.

The memory cell 601 can store analog data in the node FN by switching of the transistor MO1. Since the off-state current of the transistor MO1 is extremely low, the analog data retained at the node FN hardly deteriorates.

The wiring WTL is one of the wirings WTL[1] and WTL[2], the wiring WXL is one of the wirings WXL[1] to WXL[4], and the wiring WYL is one of the wirings WYL[1] and WYL[2]. Switching of the transistor MO1 in the memory cell 601 can be performed by a potential supplied by the wiring ROL.

The description of the operation example of the semiconductor device 100 of Embodiment 1 can be referred to for the operation of the product-sum operation circuit illustrated in FIG. 43A. Note that current flowing from an output terminal of the current source circuit IS1 is approximately equal to that flowing from an output terminal of the current source circuit IS2. The circuit ISoff is a circuit through which a differential current flows. The differential current corresponds to the difference between the current flowing through the wiring WYL when a reference potential is applied to the wiring WXL and the current flowing through the wiring WYL when a potential other than a reference potential is applied to the wiring WXL.

Figure 44A:
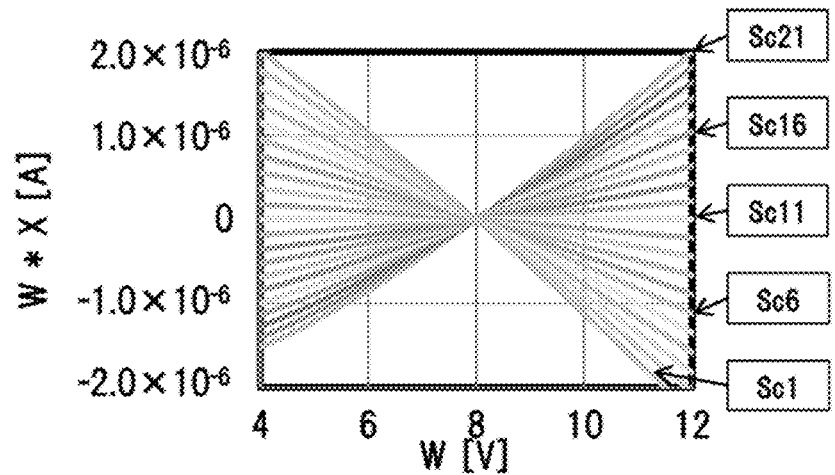
FIGS. 44A to 44C are graphs showing multiplication characteristics of a memory cell and frequency characteristics of a memory cell.

FIG. 44A shows a change in a current W*X. The change corresponds to a potential W stored in the node FN and a potential X applied to the wiring WXL in the memory cell 601 in FIG. 43B. The current W*X corresponds to the current $\Delta I_B[j]$ according to Formula (E9) and includes a constant value 2 k. In addition, according to Formula (E9), the current W*X is calculated as the number of the memory cells 601 is one in one column. FIG. 44A shows the cases where the potential X is −4.0 V, −3.6 V, −3.2 V, −2.8 V, −2.4 V, −2.0 V, −1.6 V, −1.2 V, −0.8 V, −0.4 V, −0 V, 0.4 V, 0.8 V, 1.2 V, 1.6 V, 2.0 V, 2.4 V, 2.8 V, 3.2 V, 3.6 V, and 4.0 V. In particular, the potential X is 4.0 V, 2.0 V, 0 V, −2.0 V, and −4.0 V in Condition Sc1, Condition Sc6, Condition Sc11, Condition Sc16, and Condition Sc21, respectively.

Figure 44B:
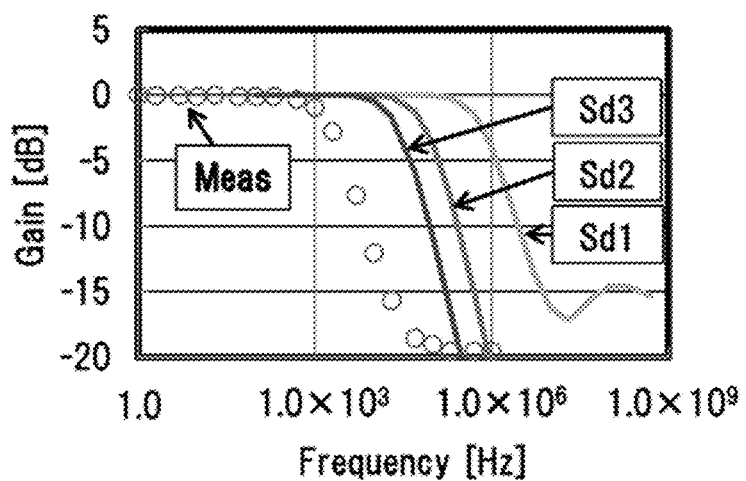

FIG. 44B is a graph showing frequency response characteristics. Condition Meas represents the frequency response characteristics of the fabricated memory cell 601. Note that Condition Meas is affected by parasitic capacitance of an output pad of a test element group (TEG) of the fabricated memory cell 601. Accordingly, FIG. 44B also shows the results in the case where the parasitic capacitance is changed by simulation using SPICE. The parasitic capacitance is 0.1 pF, 1 pF, and 3 pF in Condition Sd1, Condition Sd2, and Condition Sd3, respectively.

Figure 44C:
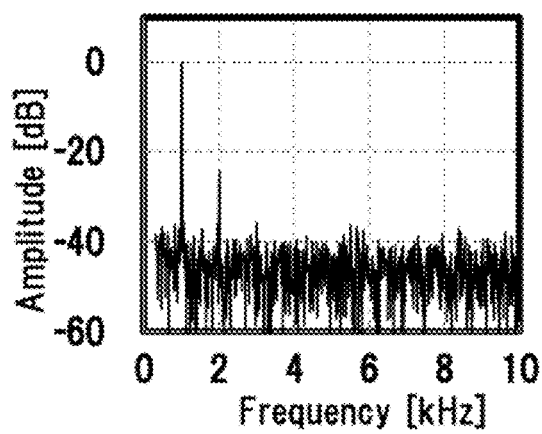

FIG. 44C shows total harmonic distortion when a frequency of 1 kHz is input.

Here, verification described below was performed to verify whether the product-sum operation circuit 600 illustrated in FIG. 43A can perform machine learning when used for a neural network.

Figure 45A:
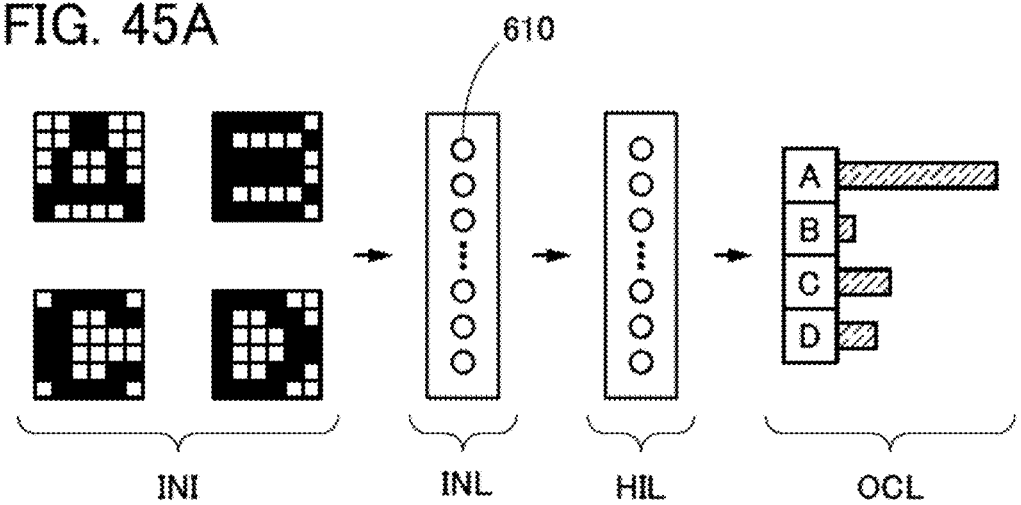
FIGS. 45A and 45B are block diagrams illustrating a structure of a neural network described in Example 2.

A system illustrated in FIG. 45A was composed and category recognition of signs was performed. There are four kinds of signs, "A", "B", "C", and "D", which are represented by 6 dots in the column direction and 6 dots in the row direction. The signs are handled as input images INI, which are input data of a neural network. In addition, in FIG. 45A, the result in which the input images INI are labeled is illustrated as an output result OCL.

The neural network includes an input layer INL and a hidden layer HIL. Note that an output layer is not illustrated in FIG. 45A. Output data output from the neural network are classified by sign and the number of each sign is counted.

The input layer INL and the hidden layer HIL each include a product-sum operation circuit 610. The product-sum operation circuit 610 includes a memory cell array 611, a reference cell 612, an offset circuit 613, and an activation function circuit 614.

The memory cell array 611 corresponds to a plurality of the memory cells 601 electrically connected to the wiring WYL[1] of the product-sum operation circuit 600 illustrated in FIGS. 43A and 43B. Alternatively, the memory cell array 611 corresponds to the memory cells AM[1,1] to AM[m,n] in the memory cell array 120 described in Embodiment 1.

The reference cell 612 corresponds to a plurality of the memory cells 601 electrically connected to the wiring WYL[2] of the product-sum operation circuit 600 illustrated in FIGS. 43A and 43B. Alternatively, the reference cell 612 corresponds to the memory cells $AM_{ref}[1]$ to $AM_{ref}[m]$ in the memory cell array 120 described in Embodiment 1.

The offset circuit 613 includes the current source circuit IS1, the current source circuit IS2, and the circuit ISoff. Alternatively, the offset circuit 613 corresponds to the offset circuit 110 described in Embodiment 1.

The activation function circuit 614 is a circuit that substitutes the value of the sum of products obtained by the offset circuit 613 into an activation function to output the value of the activation function.

The product-sum operation circuit 610 retains weight coefficients (W) in each of the memory cells in the memory cell array 611 and output data from the previous layer is input to each of the memory cell array 611 and the reference cell 612. The output data is image data INI when the product-sum operation circuit 610 is included in the input layer INL, and the output data is X when the product-sum operation circuit 610 is included in the hidden layer HIL.

The product-sum operation circuit 610 performs product-sum operation of the output data and the weight coefficient and obtains the operation result by the offset circuit 613. The operation result is transmitted to the activation function circuit 614 and arithmetic operation of an activation function is performed. The operation result of the activation function is transmitted to the next layer.

Figure 45B:
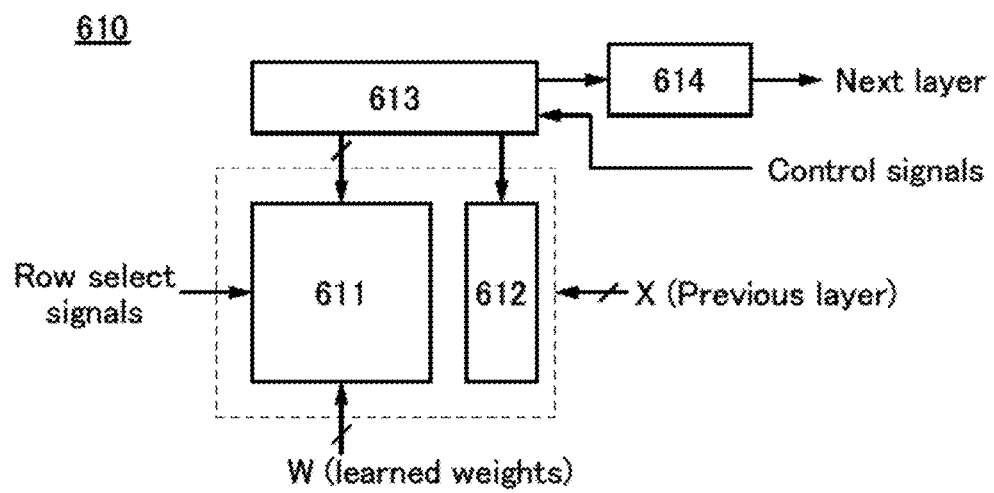

Category recognition of the signs was performed by a neural network having a configuration illustrated in FIGS. 45A and 45B.

In this verification, it is attempted to obtain the values of the success rate of learning that correspond to various initial values of the weight coefficient in the case where the accuracy of product-sum operation is changed. Note that the initial value is a random number and the success rate of learning is defined as the rate of convergence of a weight coefficient on a value that can give a correct answer after the leaning.

Figure 46:
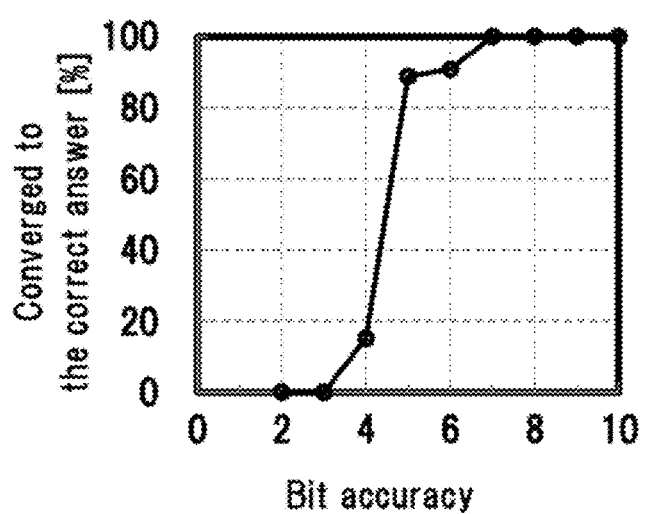
FIG. 46 is a graph showing bit accuracy and success rate of leaning.

FIG. 46 is a graph showing the verification results. The horizontal axis represents bit accuracy, and the vertical axis represents the success rate of learning. According to FIG. 46, the sign can be recognized when bit precision is at least 5 bits. Product-sum operation efficiency is 0.3 GOp/S/W, which is high power efficiency.

Note that this example can be combined with any of the other embodiments in this specification as appropriate.

REFERENCE NUMERALS

OUT[1]: column output circuit, OUT[j]: column output circuit, OUT[j+1]: column output circuit, OUT[n]: column output circuit, C_ref: reference column output circuit, OT[1]: output terminal, OT[j]: output terminal, OT[j+1]: output terminal, OT[n]: output terminal, OT_ref: output terminal, AM[1,1]: memory cell, AM[i,1]: memory cell, AM[m,1]: memory cell, AM[1,j]: memory cell, AM[i,j]: memory cell, AM[i+1,j]: memory cell, AM[i,j+1]: memory cell, AM[i+1,j+1]: memory cell, AM[m,j]: memory cell, AM[1,n]: memory cell, AM[i,n]: memory cell, AM[m,n]: memory cell, AM_ref[1]: memory cell, AM_ref[i]: memory cell, AM_ref[m]: memory cell, WD_ref: wiring, VR: wiring, B[1]: wiring, B[j]: wiring, B[j+1]: wiring, B[n]: wiring, B_ref: wiring, ORP: wiring, OSP: wiring, CI: constant current circuit, CI_ref: constant current circuit, CM: current mirror circuit, IL[1]: wiring, IL[j]: wiring, IL[j+1]: wiring, IL[n]: wiring, IL_ref: wiring, OL[1]: wiring, OL[j]: wiring, OL[n]: wiring, OL_ref: wiring, FGA[1]: wiring, FGA[j]: wiring, FGA[j+1]: wiring, FGA[n]: wiring, FGA_ref: wiring, FGB[1]: wiring, FGB[j]: wiring, FGB[j+1]: wiring, FGB[n]: wiring, FGB_ref: wiring, BGA[1]: wiring, BGA[j]: wiring, BGA[n]: wiring, BGA_ref: wiring, BGB[1]: wiring, BGB[j]: wiring, BGB[n]: wiring, BGB_ref: wiring, BG[1]: wiring, BG[j]: wiring, BG[n]: wiring, BG_ref: wiring, FG[1]: wiring, FG[j]: wiring, FG[n]: wiring, FG_ref: wiring, VDDL: wiring, VSSL: wiring, WD[1]: wiring, WD[j]: wiring, WD[j+1]: wiring, WD [n]: wiring, RW[1]: wiring, RW[i]: wiring, RW[i+1]: wiring, RW[m]: wiring, WW[1]: wiring, WW[i]: wiring, WW[i+1]: wiring, WW[m]: wiring, CT1: terminal, CT2: terminal, CT3: terminal, CT4: terminal, CT5[1]: terminal, CT5[j]: terminal, CT5[j+1]: terminal, CT5[n]: terminal, CT6[1]: terminal, CT6[j]: terminal, CT6[j+1]: terminal, CT6[n]: terminal, CT7: terminal, CT8: terminal, Tr1: transistor, Tr2: transistor, Tr3: transistor, Tr4: transistor, Try: transistor, Tr6: transistor, Tr7: transistor, Tr8: transistor, Tr9: transistor, Tr11: transistor, Tr12: transistor, Tr81: transistor, Tr82: transistor, Tr91: transistor, Tr92: transistor, C1: capacitor, C2: capacitor, C3: capacitor, C4: capacitor, C31: capacitor, C32: capacitor, C41: capacitor, C42: capacitor, NCM_ref: node, N[1,1]: node, N[i,1]: node, N[m,1]: node, N[1,j]: node, N[1,j]: node, N[i+1,j]: node, N[i,j+1]: node, N[i+1,j+1]: node, N[m,j]: node, N[1,n]: node, N[i,n]: node, N[m,n]: node, SPT[1]: output terminal, SPT[j]: output terminal, SPT[j+1]: output terminal, SPT[n]: output terminal, SL: signal line, GL: gate line, DL: signal line, GL2: gate line, AL: current supply line, M: transistor, M1: transistor, M2: transistor, M3: transistor, $C_{SLC}$: capacitor, $C_{SEL}$: capacitor, $CT_{\alpha\beta}$: capacitor, DRL: wiring, SNL: wiring, CI1: current source circuit, CI2: current source circuit, GW: potential, CSG: potential, WX: potential, $Tr_{sim1}$: transistor, $Tr_{sim2}$: transistor, $C_{sim1}$: capacitor, $C_{sim2}$: capacitor, GNDL: wiring, NFG: node, CND1: state, CND2: state, CND3: state, WTL [1]: wiring, WTL[2]: wiring, WXL[1]: wiring, WXL[2]: wiring, WXL[3]: wiring, WXL[4]: wiring, WYL[1]: wiring, WYL[2]: wiring, ROL: wiring, IS1: current source circuit, IS2: current source circuit, ISoff: circuit, MO1: transistor, MO2: transistor, CN: capacitor, FN: node, 100: semiconductor device, 110: offset circuit, 111: offset circuit, 112: offset circuit, 112A: offset circuit, 113: offset circuit, 115: offset circuit, 115A: offset circuit, 116: offset circuit, 116A: offset circuit, 120: memory cell array, 121: memory cell array, 150: offset circuit, 150A: offset circuit, 160: memory cell array, 201: first display element, 202: second display element, 203: opening, 204: reflected light, 205: transmitted light, 206: pixel circuit, 207: pixel circuit, 210: display device, 214: display portion, 216: circuit, 218: wiring, 220: IC, 222: FPC, 300: touch sensor unit, 301: base, 302: sensor array, 311: TS driver IC, 312: sensing circuit, 313: FPC, 314: FPC, 315: peripheral circuit, 320: connection portion, 321: connection portion, 331: wiring, 332: wiring, 333: wiring, 334: wiring, 411: circuit, 413: circuit, 414: circuit, 415: circuit, 500: transistor, 501: substrate, 511: insulator, 512: insulator, 513: insulator, 514: insulator, 521: conductor, 522a: conductor, 522b: conductor, 523: conductor, 541: metal oxide, 550a: region, 550b: region, 550c: region, 600: product-sum operation circuit, 601: memory cell, 610: product-sum operation circuit, 611: memory cell array, 612: reference cell, 613: offset circuit, 614: activation function circuit, 1200A: transistor, 1200B: transistor, 1200C: transistor, 1205: conductor, 1205a: conductor, 1205b: conductor, 1214: insulator, 1216: insulator, 1220: insulator, 1222: insulator, 1224: insulator, 1230: oxide, 1230a: oxide, 1230b: oxide, 1230c: oxide, 1230d: oxide, 1240a: conductor, 1240b: conductor, 1250: insulator, 1260: conductor, 1280: insulator, 1282: insulator, 1285: insulator, 1286: insulator, 2010: first unit, 2020: second unit, 2030: input unit, 2501C: insulating film, 2505: bonding layer, 2512B: conductive film, 2520: functional layer, 2521: insulating film, 2521A: insulating film, 2521B: insulating film, 2522: connection portion, 2528: insulating film, 2550: second display element, 2550(i,j): second display element, 2551: electrode, 2552: electrode, 2553: layer containing light-emitting material, 2560: optical element, 2565: covering film, 2570: substrate, 2580: lens, 2591A: opening, 2700TP3: input/output panel, 2702(i,j): pixel, 2720: functional layer, 2750: first display element, 2751: electrode, 2751H: region, 2752: electrode, 2753: layer containing liquid crystal material, 2770: substrate, 2770D: functional film, 2770P: functional film, 2770PA: retardation film, 2770PB: polarizing layer, 2771: insulating film, 5200: information terminal, 5221: housing, 5222: display portion, 5223: operation button, 5224: speaker, 5300: information terminal, 5321a: housing, 5321b: housing, 5321c: hinge portion, 5322: display portion, 5323: operation button, 5324: speaker, 5431: housing, 5432: display portion, 5433: palm print reading portion, 5434: wiring, 5435: hand, 5501: housing, 5502: display portion, 5503: microphone, 5504: speaker, 5505: operation button, 5801: first housing, 5802: second housing, 5803: display portion, 5804: operation key, 5805: lens, 5806: joint, 6560: TV, 6561: broadcast station, 6562: artificial satellite, 6563: radio wave tower, 6564: antenna, 6565: antenna, 6566A: radio wave, 6566B: radio wave, 6567A: radio wave, 6567B: radio wave, 6600: ambulance, 6601: medical institution, 6602: medical institution, 6605: high-speed network, 6610: camera, 6611: encoder, 6612: communication device, 6615: video data, 6616: video data, 6620: communication device, 6621: decoder, 6622: server, and 6623: display device.

This application is based on Japanese Patent Application Serial No. 2016-200757 filed with Japan Patent Office on Oct. 12, 2016, Japanese Patent Application Serial No. 2016-200760 filed with Japan Patent Office on Oct. 12, 2016, and Japanese Patent Application Serial No. 2017-017446 filed with Japan Patent Office on Feb. 2, 2017, the entire contents of which are hereby incorporated by reference.

The invention claimed is:
1. A semiconductor device comprising:
an offset circuit;
a first memory cell; and
a second memory cell,
wherein the offset circuit comprises a first constant current circuit, a second constant current circuit, first to third transistors, a first capacitor, a first wiring, a second wiring, a first output terminal, a second output terminal, and a current mirror circuit, wherein the first constant current circuit comprises a fourth transistor, a fifth transistor, and a second capacitor, wherein the fourth transistor comprises a first gate and a second gate, wherein the second constant current circuit comprises a sixth transistor, a seventh transistor, and a third capacitor, wherein the sixth transistor comprises a first gate and a second gate, wherein a first terminal of the first transistor is electrically connected to a first terminal of the second transistor, wherein a gate of the first transistor is electrically connected to a second terminal of the second transistor, wherein the first terminal of the second transistor is electrically connected to the first wiring, wherein a first terminal of the third transistor is electrically connected to the second terminal of the second transistor, wherein a first terminal of the first capacitor is electrically connected to the gate of the first transistor, wherein a first terminal of the fourth transistor is electrically connected to the first wiring, wherein the first gate of the fourth transistor is electrically connected to a first terminal of the second capacitor, wherein the second gate of the fourth transistor is electrically connected to the first terminal of the fourth transistor, wherein a second terminal of the second capacitor is electrically connected to the first terminal of the fourth transistor, wherein a first terminal of the fifth transistor is electrically connected to the first gate of the fourth transistor, wherein a first terminal of the sixth transistor is electrically connected to the second wiring, wherein the first gate of the sixth transistor is electrically connected to a first terminal of the third capacitor, wherein the second gate of the sixth transistor is electrically connected to the first terminal of the sixth transistor, wherein a second terminal of the third capacitor is electrically connected to the first terminal of the sixth transistor, wherein a first terminal of the seventh transistor is electrically connected to the first gate of the sixth transistor, wherein the first wiring is electrically connected to the first output terminal, wherein the second wiring is electrically connected to the second output terminal, wherein the current mirror circuit is configured to output a first current corresponding to a potential of the second wiring to each of the first wiring and the second wiring, wherein the first memory cell is electrically connected to the first output terminal, and wherein the second memory cell is electrically connected to the second output terminal.

2. The semiconductor device according to claim 1, wherein the first to seventh transistors each include a metal oxide in a channel formation region.

3. The semiconductor device according to claim 1, wherein the current mirror circuit comprises a tenth transistor and an eleventh transistor, wherein a first terminal of the tenth transistor is electrically connected to the first wiring, wherein a gate of the tenth transistor is electrically connected to the second wiring, wherein a first terminal of the eleventh transistor is electrically connected to the second wiring, and wherein a gate of the eleventh transistor is electrically connected to the second wiring.

4. The semiconductor device according to claim 1, wherein the first memory cell comprises a twelfth transistor, a thirteenth transistor, and a sixth capacitor, wherein the second memory cell comprises a fourteenth transistor, a fifteenth transistor, and a seventh capacitor, wherein a first terminal of the twelfth transistor is electrically connected to a gate of the thirteenth transistor, wherein a first terminal of the sixth capacitor is electrically connected to the first terminal of the twelfth transistor, wherein a first terminal of the thirteenth transistor is electrically connected to the first output terminal, wherein a first terminal of the fourteenth transistor is electrically connected to a gate of the fifteenth transistor, wherein a first terminal of the seventh capacitor is electrically connected to the first terminal of the fourteenth transistor, and wherein a first terminal of the fifteenth transistor is electrically connected to the second output terminal.

5. The semiconductor device according to claim 1, wherein processing such as pattern recognition and associative storage are performed by the semiconductor device.

6. A semiconductor device comprising:

an offset circuit;

a first memory cell; and a second memory cell, wherein the offset circuit comprises a first constant current circuit, a second constant current circuit, first to third transistors, a first capacitor, a first wiring, a second wiring, a first output terminal, a second output terminal, and a current mirror circuit, wherein the first constant current circuit comprises fourth to sixth transistors, a second capacitor, and a third capacitor, wherein the fourth transistor comprises a first gate and a second gate, wherein the second constant current circuit comprises seventh to ninth transistors, a fourth capacitor, and a fifth capacitor, wherein the seventh transistor comprises a first gate and a second gate, wherein a first terminal of the first transistor is electrically connected to a first terminal of the second transistor, wherein a gate of the first transistor is electrically connected to a second terminal of the second transistor, wherein the first terminal of the second transistor is electrically connected to the first wiring, wherein a first terminal of the third transistor is electrically connected to the second terminal of the second transistor, wherein a first terminal of the first capacitor is electrically connected to the gate of the first transistor, wherein a first terminal of the fourth transistor is electrically connected to the first wiring, wherein the first gate of the fourth transistor is electrically connected to a first terminal of the second capacitor, wherein the second gate of the fourth transistor is electrically connected to a first terminal of the third capacitor, wherein a first terminal of the fifth transistor is electrically connected to the first gate of the fourth transistor, wherein a first terminal of the sixth transistor is electrically connected to the second gate of the fourth transistor,
wherein a second terminal of the second capacitor is electrically connected to the first terminal of the fourth transistor,
wherein a second terminal of the third capacitor is electrically connected to the first terminal of the fourth transistor,
wherein a first terminal of the seventh transistor is electrically connected to the second wiring,
wherein the first gate of the seventh transistor is electrically connected to a first terminal of the fourth capacitor,
wherein the second gate of the seventh transistor is electrically connected to a first terminal of the fifth capacitor,
wherein a first terminal of the eighth transistor is electrically connected to the first gate of the seventh transistor,
wherein a first terminal of the ninth transistor is electrically connected to the second gate of the seventh transistor,
wherein a second terminal of the fourth capacitor is electrically connected to the first terminal of the seventh transistor,
wherein a second terminal of the fifth capacitor is electrically connected to the first terminal of the seventh transistor,
wherein the first wiring is electrically connected to the first output terminal,
wherein the second wiring is electrically connected to the second output terminal,
wherein the current mirror circuit is configured to output a first current corresponding to a potential of the second wiring to each of the first wiring and the second wiring,
wherein the first memory cell is electrically connected to the first output terminal, and
wherein the second memory cell is electrically connected to the second output terminal.

7. The semiconductor device according to claim 6, wherein the first to ninth transistors each include a metal oxide in a channel formation region.

8. The semiconductor device according to claim 6,
wherein the current mirror circuit comprises a tenth transistor and an eleventh transistor,
wherein a first terminal of the tenth transistor is electrically connected to the first wiring,
wherein a gate of the tenth transistor is electrically connected to the second wiring,
wherein a first terminal of the eleventh transistor is electrically connected to the second wiring, and
wherein a gate of the eleventh transistor is electrically connected to the second wiring.

9. The semiconductor device according to claim 6,
wherein the first memory cell comprises a twelfth transistor, a thirteenth transistor, and a sixth capacitor,
wherein the second memory cell comprises a fourteenth transistor, a fifteenth transistor, and a seventh capacitor,
wherein a first terminal of the twelfth transistor is electrically connected to a gate of the thirteenth transistor,
wherein a first terminal of the sixth capacitor is electrically connected to the first terminal of the twelfth transistor,
wherein a first terminal of the thirteenth transistor is electrically connected to the first output terminal,
wherein a first terminal of the fourteenth transistor is electrically connected to a gate of the fifteenth transistor,
wherein a first terminal of the seventh capacitor is electrically connected to the first terminal of the fourteenth transistor, and
wherein a first terminal of the fifteenth transistor is electrically connected to the second output terminal.

10. The semiconductor device according to claim 6, wherein processing such as pattern recognition and associative storage are performed by the semiconductor device.

\* \* \* \* \*